United States Patent
Kamimura et al.

(10) Patent No.: US 7,718,344 B2
(45) Date of Patent: May 18, 2010

(54) RESIST COMPOSITION AND PATTERN FORMING METHOD USING THE SAME

(75) Inventors: Sou Kamimura, Haibara-gun (JP); Kenji Wada, Haibara-gun (JP); Yasutomo Kawanishi, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/864,049

(22) Filed: Sep. 28, 2007

(65) Prior Publication Data
US 2008/0085468 A1 Apr. 10, 2008

(30) Foreign Application Priority Data
Sep. 29, 2006 (JP) .............................. 2006-268605

(51) Int. Cl.
G03F 7/039 (2006.01)
G03F 7/20 (2006.01)
G03F 7/30 (2006.01)

(52) U.S. Cl. .................... 430/270.1; 430/326; 430/922; 430/919; 430/920; 430/921; 430/925

(58) Field of Classification Search .................. None
See application file for complete search history.

(56) References Cited

U.S. PATENT DOCUMENTS

| 2006/0194147 A1 | 8/2006 | Kawanishi |
| 2006/0264528 A1 | 11/2006 | Wada |
| 2007/0184384 A1 | 8/2007 | Kawanishi |

FOREIGN PATENT DOCUMENTS

| EP | 0 869 393 A1 * | 10/1998 |
| EP | 1 635 218 A2 * | 3/2006 |
| EP | 1 693 705 A2 * | 8/2006 |
| EP | 1 703 326 A3 | 11/2007 |
| JP | 10-120610 A | 5/1998 |
| JP | 10-310545 A | 11/1998 |
| JP | 11-322656 A | 11/1999 |
| JP | 2002-49154 A | 2/2002 |
| JP | 2003-149800 A | 5/2003 |
| JP | 2003-183227 A | 7/2003 |
| JP | 2003-321423 A | 11/2003 |
| JP | 2006-330098 A | 12/2006 |
| JP | 2007-094356 A | 4/2007 |
| JP | 2007-210904 A | 8/2007 |

OTHER PUBLICATIONS

English abstract for JP 2006-330098 (Wada), provided by JPO.*
European Office Action 0701918.4-1226 dated Feb. 14, 2008.

* cited by examiner

*Primary Examiner*—Sin J. Lee
(74) *Attorney, Agent, or Firm*—Sughrue Mion, PLLC

(57) ABSTRACT

A resist composition, includes: (B) a polymer having a group capable of decomposing under an action of an acid and having a weight average molecular weight of 1,000 to 5,000, of which solubility in an alkali developer increases under an action of an acid; and (Z) a compound containing a sulfonium cation having a structure represented by formula (Z-1):

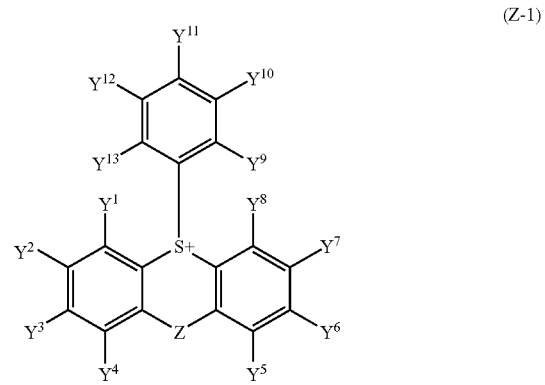

wherein $Y^1$ to $Y^{13}$ each independently represents a hydrogen atom or a substituent, and adjacent members of $Y^1$ to $Y^{13}$ may combine with each other to form a ring; and Z represents a single bond or a divalent linking group.

13 Claims, No Drawings

RESIST COMPOSITION AND PATTERN FORMING METHOD USING THE SAME

BACKGROUND OF THE INVENTION

1. Field of the Invention

The present invention relates to a resist composition suitable for use in the ultramicrolithography process such as production of VLSI or high-capacity microchip or in other photofabrication processes. More specifically, the present invention relates to a photoresist capable of forming a high-resolution pattern by using electron beam, X-ray, EUV light or the like, that is, a resist composition suitably usable for ultrafine processing of a semiconductor device using electron beam, X-ray or EUV light, and a pattern forming method using the resist composition.

2. Description of the Related Art

In the process of producing a semiconductor device such as IC and LSI, fine processing by lithography using a photoresist composition has been conventionally performed. With recent increase in the integration degree of an integrated circuit, formation of an ultrafine pattern in the sub-micron or quarter-micron region is being required. To cope with this requirement, the exposure wavelength also tends to become shorter, for example, from g line to i line or further to KrF excimer laser light.

At present, other than the excimer laser light, development of lithography using electron beam, X ray or EUV light is proceeding. Above all, the lithography using EUV light as a light source is positioned as a next-generation or next-next-generation promising pattern formation technique, and studies thereon are being aggressively made. The performances required of the resist used are high sensitivity, high resolution and good line edge roughness. However, these performances are in a trade-off relationship and it is important how to satisfy these performances at the same time. The line edge roughness as used herein means that the edge at the interface between the resist pattern and the substrate irregularly fluctuates in the direction perpendicular to the line direction due to the resist property and when the pattern is viewed from right above, the edge gives an uneven appearance. This unevenness is transferred by the etching step using the resist as a mask and causes deterioration of electric property and in turn decrease in the yield. Particularly, in an ultrafine region of 0.25 μm or less, the line edge roughness is an extremely important problem to be solved. Such a problem is also important in the lithography using X-ray or electron beam.

In addition to the requirement above, when a light source such as electron beam, X-ray and EUV is used, since the exposure is performed in vacuum, a low boiling point compound such as solvent or a resist material decomposed due to high energy is vaporized to contaminate the exposure apparatus, and this outgas is also an important problem. In recent years, various studies on the reduction of outgas are proceeding and various attempts are being made, for example, a topcoat layer is provided to suppress the volatilization of a low molecular compound (see, for example, JP-A-2003-183227 (the term "JP-A" as used herein means an "unexamined published Japanese patent application")) or a radical trap agent capable of suppressing the decomposition of a polymer is added (see, for example, JP-A-10-120610). The reduction of outgas is required also of an acid generator.

As for the resist suitable for the lithography process using electron beam, X-ray or EUV light, a chemical amplification-type resist utilizing an acid catalytic reaction is mainly used from the standpoint of elevating the sensitivity and in conventional resists, there has been studied a chemical amplification-type resist composition mainly comprising an acid generator and a phenolic polymer which is insoluble or sparingly soluble in an aqueous alkali solution but becomes soluble in an aqueous alkali solution under the action of an acid. However, the conventional photoresist using a polymer compound for the substrate has a problem that the molecular shape of the polymer compound is reflected on the pattern profile or line edge roughness.

On the other hand, in the light of fine pattern formation and low line edge roughness, a low molecular material is recently attracting attention. In particular, a molecular resist using a simple molecule as the binder has been proposed, and there have been disclosed resist compositions using, for example, a phenol-based compound derivative having a specific structure (see, for example, Patent JP-A-2003-183227 and JP-A-10-120610), a calixarene having a specific structure (see, for example, JP-A-10-120610 and JP-A-11-322656), a calixresorcinarene (see, for example, JP-A-11-322656 and JP-A-2003-321423), or a phenol-based dendrimer with the mother nucleus being a calixresorcinarene (see, for example, JP-A-10-310545).

In JP-A-2003-149800, regarding a resist containing a polystyrene-based resin having a general molecular weight, a specific sulfonium salt is studied with an attempt to improve the pattern profile and edge roughness as well as the sensitivity and resolution.

However, it is pointed out that when such a molecular material is merely used, significant pattern collapse occurs in the ultrafine region. An effective measure for solving this problem has not yet been found out.

Also, the suppression of outgas, which is regarded as a particularly important performance required in the lithography using electron beam or EUV, is not yet sufficiently studied at present.

SUMMARY OF THE INVENTION

An object of the present invention is to solve the problem of implementing performance-enhancing techniques in the fine process of a semiconductor device, where actinic rays or radiation such as high energy ray, X-ray, electron beam and EUV light are used. In particular, the object of the present invention is to provide a resist composition in which a polymer with the weight average molecular weight being reduced by a certain amount is used as the low molecular compound expected to bring about high resolution in the ultrafine region and which thereby ensures that the problem of pattern collapse found in the molecular resist in general is solved, high sensitivity and reduction in the line edge roughness (LER) are realized while maintaining the high resolution and reduced pattern collapse, and good sensitivity and good dissolution contrast are achieved even in the EUV exposure. The object of the present invention includes providing a pattern forming method using the resist composition.

The present invention is as follows.

The present inventors have made intensive studies, as a result, the above-described object has been attained by a resist composition comprising a low molecular weight polymer which contains a group capable of producing an alkali-soluble group under the action of an acid, a compound which has cationic moiety having a specific structure and generates an acid under the action of actinic rays or radiation, and a compound which generates a compound having a specific structure under the action of actinic rays or radiation.

That is, the present invention has been accomplished by the following constructions (1) A resist composition, comprising:

(B) a polymer having a group capable of decomposing under an action of an acid and having a weight average molecular weight of 1,000 to 5,000, of which solubility in an alkali developer increases under an action of an acid; and (Z) a compound containing a sulfonium cation having a structure represented by formula (Z-1):

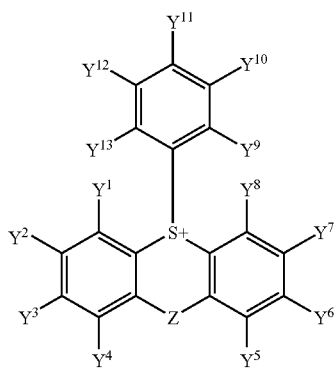

(Z-1)

wherein $Y^1$ to $Y^{13}$ each independently represents a hydrogen atom or a substituent, and adjacent members of $Y^1$ to $Y^{13}$ may combine with each other to form a ring; and Z represents a single bond or a divalent linking group.

(2) The resist composition as described in (1) above, which further comprises:

(A) a compound capable of generating a compound having a structure represented by the following formula (A-I) upon irradiation with actinic rays or radiation:

$$Q_1\text{-}X_1\text{—NH—}X_2\text{-}Q_2 \quad (A\text{-}I)$$

wherein $Q_1$ and $Q_2$ each independently represents a monovalent organic group, provided that at least one of $Q_1$ and $Q_2$ has a proton acceptor functional group, $Q_1$ and $Q_2$ may combine to form a ring and the ring formed may have a proton acceptor functional group; and $X_1$ and $X_2$ each independently represents —CO— or —$SO_2$—.

(3) The resist composition as described in (2) above, wherein at least one of $X_1$ and $X_2$ is —$SO_2$—.

(4) The resist composition as described in (2) or (3) above, wherein the compound having a structure represented by formula (A-I) is a compound having a structure represented by the following formula (A-II):

$$Q_1\text{-}X_1\text{—NH—}X_2\text{-}A\text{-}(X_3)_n\text{—B-}Q_3 \quad (A\text{-}II)$$

wherein $Q_1$ and $Q_3$ each independently represents a monovalent organic group, provided that at least one of $Q_1$ and $Q_3$ has a proton acceptor functional group, $Q_1$ and $Q_3$ may combine to form a ring and the ring formed may have a proton acceptor functional group;

$X_1$, $X_2$ and $X_3$ each independently represents —CO— or —$SO_2$—;

A represents a divalent linking group;

B represents a single bond, an oxygen atom or —N($Q_x$)-;

$Q_x$ represents a hydrogen atom or a monovalent organic group;

when B is —N($Q_x$)-, $Q_3$ and $Q_x$ may combine to form a ring; and n represents 0 or 1.

(5) The resist composition as described in (4) above, wherein $X_1$, $X_2$ and $X_3$ each is —$SO_2$—.

(6) The resist composition as described in any of (1) to (5) above, which further comprises a nitrogen-containing basic compound.

(7) The resist composition as described in any of (1) to (6) above, which further comprises a surfactant.

(8) A pattern forming method, comprising:

forming a resist film from the resist composition as described in any of (1) to (7) above; and exposing and developing the resist film.

DETAILED DESCRIPTION OF THE INVENTION

The present invention is described in detail below.

Incidentally, in the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

The photosensitive composition, preferably the resist composition, of the present invention comprises (B) a polymer having an alkali-soluble group and an acid-decomposable group and having a weight average molecular weight of 1,000 to 5,000, of which solubility in an alkali developer increases under the action of an acid, (Z) a compound containing a sulfonium cation having a structure represented by formula (Z-I), and (A) a compound capable of generating a compound having a structure represented by the following formula (A-I) upon irradiation with actinic rays or radiation.

[1] (B) Polymer having a group capable of decomposing under the action of an acid and having a weight average molecular weight of 1,000 to 5,000, of which solubility in an alkali developer increases under the action of an acid (hereinafter sometimes referred to as the "component (B)")

The resin capable of decomposing under the action of an acid to increase the solubility in an alkali developer (acid-decomposable resin), which is used in the photo-sensitive composition of the present invention, is a resin having a group capable of decomposing under the action of an acid (hereinafter sometimes referred to as an "acid-decomposable group") in either one or both of the main chain and the side chain of the resin. Of these, a resin having an acid-decomposable group in the side chain is preferred.

The group capable of decomposing under the action of an acid is preferably a group resulting from replacement of the hydrogen atom of a —COOH or —OH group by a group which desorbs by the effect of an acid.

In the present invention, the acid-decomposable group is an acetal group or a tertiary ester group.

In the resin for use in the present invention, the molar ratio between the alkali-soluble group and the acid-decomposable group contained in the resin is usually from 80/20 to 20/80, preferably from 70/30 to 30/70, more preferably from 60/40 to 40/60.

In the case where such a group capable of decomposing under the action of an acid is bonded as a side chain, the matrix resin is an alkali-soluble resin having an —OH or —COOH group in the side chain. Examples thereof include alkali-soluble resins described later.

The alkali dissolution rate of such an alkali-soluble resin is preferably 170 A/sec or more, more preferably 330 A/sec or more (A is angstrom), as measured (at 23° C.) in 0.261N tetramethylammonium hydroxide (TMAH).

From this standpoint, the alkali-soluble resin is preferably an alkali-soluble resin having a hydroxystyrene structural unit, such as o-, m- or p-poly(hydroxystyrene) or a copolymer thereof, hydrogenated poly(hydroxystyrene), halogen- or alkyl-substituted poly(hydroxystyrene), partially O-alkylated or O-acylated poly(hydroxystyrene), styrene-hydroxystyrene copolymer, α-methylstyrene-hydroxystyrene copolymer and hydrogenated novolak resin.

Preferred examples of the repeating unit having an acid-decomposable group for use in the present invention include a tert-butoxycarbonyloxystyrene, a 1-alkoxyethoxystyrene and a tertiary alkyl(meth)acrylate. Among these, a 2-alkyl-2-adamantyl(meth)acrylate and a dialkyl(1-adamantyl)methyl (meth)acrylate are more preferred.

The component (B) for use in the present invention can be obtained by reacting an acid-decomposable group precursor with an alkali-soluble resin or copolymerizing an acid-decomposable group-bonded alkali-soluble resin monomer with various monomers, and this is disclosed in European Patent 254853, JP-A-2-25850, JP-A-3-223860 and JP-A-4-251259.

In the case of irradiating the resist composition of the present invention with KrF excimer laser light, electron beam, X-ray and high-energy beam at a wavelength of 50 nm or less (e.g., EUV), the resin as the component (B) preferably contains a repeating unit having an aromatic group, and the resin is more preferably (B1) a resin having a hydroxystyrene repeating unit, still more preferably a copolymer of hydroxystyrene/hydroxystyrene protected with an acid-decomposable group, or hydroxystyrene/tertiary alkyl(meth)acrylate.

In particular, the (B1) resin having a hydroxystyrene repeating unit is preferably a resin containing a repeating unit represented by the following formula (II) and a repeating unit represented by the following formula (III):

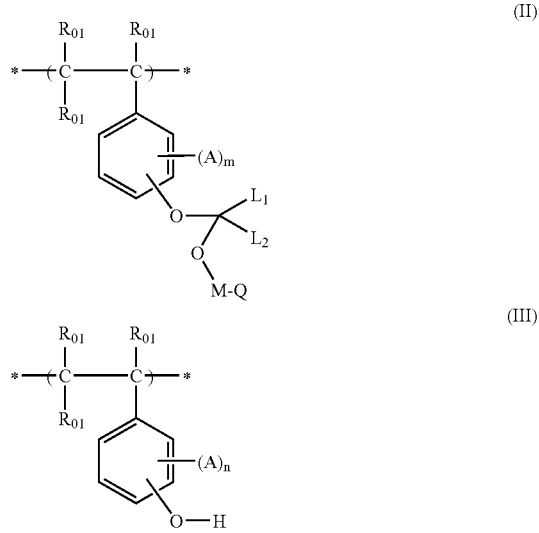

$R_{01}$ each independently represents a hydrogen atom, an alkyl group, a cycloalkyl group, a halogen atom, a cyano group or an alkoxycarbonyl group.

$L_1$ and $L_2$, which may be the same or different, each represents a hydrogen atom, an alkyl group, a cycloalkyl group or an aralkyl group.

M represents a single bond or a divalent linking group.

Q represents an alkyl group, a cycloalkyl group or an alicyclic or aromatic ring group which may contain a heteroatom.

At least two members out of Q, M and $L_1$ may combine to form a 5- or 6-membered ring.

A represents a halogen atom, a cyano group, an acyl group, an alkyl group, an alkoxy group, an acyloxy group or an alkoxycarbonyl group and is preferably an acyl group, an acyloxy group or an alkoxycarbonyl group, which are a group having a carbonyl group.

m and n each independently represents an integer of 0 to 4, provided that m and n are preferably not 0 at the same time.

The (B1) resin containing a hydroxystyrene repeating unit may be a resin containing a repeating unit represented by formula (II), a repeating unit represented by formula (III) and a repeating unit represented by formula (IV).

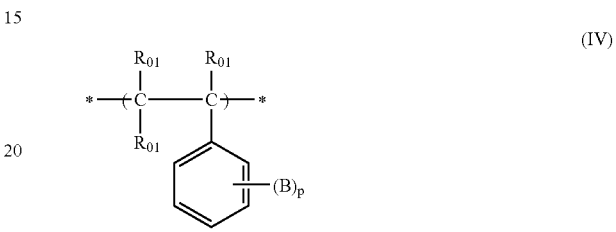

$R_{01}$ each independently represents a hydrogen atom, an alkyl group, a cycloalkyl group, a halogen atom, a cyano group or an alkoxycarbonyl group.

B represents a halogen atom, a cyano group, an acyl group, an alkyl group, an alkoxy group, an acyloxy group or an alkoxycarbonyl group.

p represents an integer of 0 to 5.

The substituent on the benzene ring in the repeating unit represented by formula (II) is a group (acid-decomposable group) capable of decomposing under the action of an acid to generate a hydroxyl group (alkali-soluble group) and decomposes by the effect of an acid to produce a hydroxystyrene unit and convert the resin into a resin of which solubility in an alkali developer is increased.

$R_{01}$ each independently represents a hydrogen atom, an alkyl group, a cycloalkyl group, a halogen atom, a cyano group or an alkoxycarbonyl group and preferably has a carbon number of 20 or less.

The alkyl group or cycloalkyl group in $R_{01}$ preferably has a carbon number of 20 or less, and examples thereof include a methyl group, an ethyl group, a propyl group, an isopropyl group, an n-butyl group, an isobutyl group, a tert-butyl group, a pentyl group, a cyclopentyl group, a hexyl group, a cyclohexyl group, an octyl group and a dodecyl group. These groups each may have a substituent, and examples of the substituent include an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group and a heterocyclic residue such as pyrrolidone residue. The substituent preferably has a carbon number of 8 or less. A $CF_3$ group, an alkoxycarbonylmethyl group, an alkylcarbonyloxymethyl group, a hydroxymethyl group, an alkoxymethyl group and the like are more preferred.

The halogen atom in $R_{01}$ includes a fluorine atom, a chlorine atom, a bromine atom and an iodine atom and is preferably a fluorine atom.

As for the alkyl group contained in the alkoxycarbonyl group of $R_{01}$, the same as those described above for the alkyl group of $R_{01}$ are preferred.

The alkyl group of $L_1$ and $L_2$ is, for example, an alkyl group having a carbon number of 1 to 8, and specific preferred examples thereof include a methyl group, an ethyl group, a propyl group, an n-butyl group, a sec-butyl group, a hexyl group and an octyl group.

The cycloalkyl group of $L_1$ and $L_2$ is, for example, a cycloalkyl group having a carbon number of 3 to 15, and specific preferred examples thereof include a cyclopentyl group, a cyclohexyl group, a norbornyl group and an adamantyl group.

The aryl group of $L_1$ and $L_2$ is, for example, an aryl group having a carbon number of 6 to 15, and specific preferred example thereof include a phenyl group, a tolyl group, a naphthyl group and an anthryl group.

The aralkyl group of $L_1$ and $L_2$ is, for example, an aralkyl group having a carbon number of 6 to 20, and examples thereof include a benzyl group and a phenethyl group.

The divalent linking group of M is, for example, an alkylene group, a cycloalkylene group, an alkenylene group, an arylene group, —OCO—, —COO—, —CON($R_0$)— or a linking group comprising a plurality of these members. $R_0$ is a hydrogen atom or an alkyl group.

The alkyl group and cycloalkyl group of Q are respectively the same as the alkyl group and cycloalkyl group of $L_1$ and $L_2$.

The alicyclic or aromatic ring group of Q, which may contain a heteroatom, includes, for example, the cycloalkyl group and aryl group of $L_1$ and $L_2$ and preferably has a carbon number of 3 to 15.

Examples of the alicyclic or aromatic ring group which may contain a heteroatom include thiirane, cyclothiolane, thiophene, furan, pyrrole, benzothiophene, benzofuran, benzopyrrole, triazine, imidazole, benzimidazole, triazole, thiadiazole, thiazole and pyrrolidone, but the alicyclic or aromatic ring group is not limited thereto and any ring may be used as long as it has a structure generally called a hetero ring (a ring formed by carbon and heteroatom or a ring formed by heteroatom).

As for the 5- or 6-membered ring which may be formed by combining at least two members out of Q, M and $L_1$, there is included a case where at least two members out of Q, M and $L_1$ combine to form, for example, a propylene group or a butylene group, thereby forming a 5- or 6-membered ring containing an oxygen atom.

The group represented by -M-Q preferably has a carbon number of 1 to 30, more preferably from 5 to 20, and, for example, the group represented by —OC($L_1$)($L_2$)O-M-Q includes the followings.

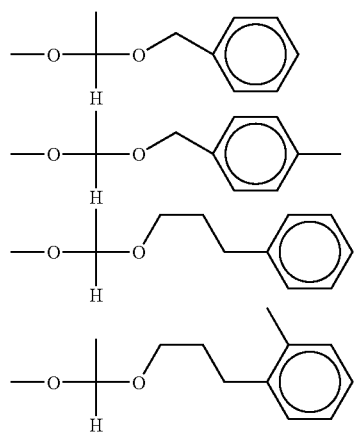

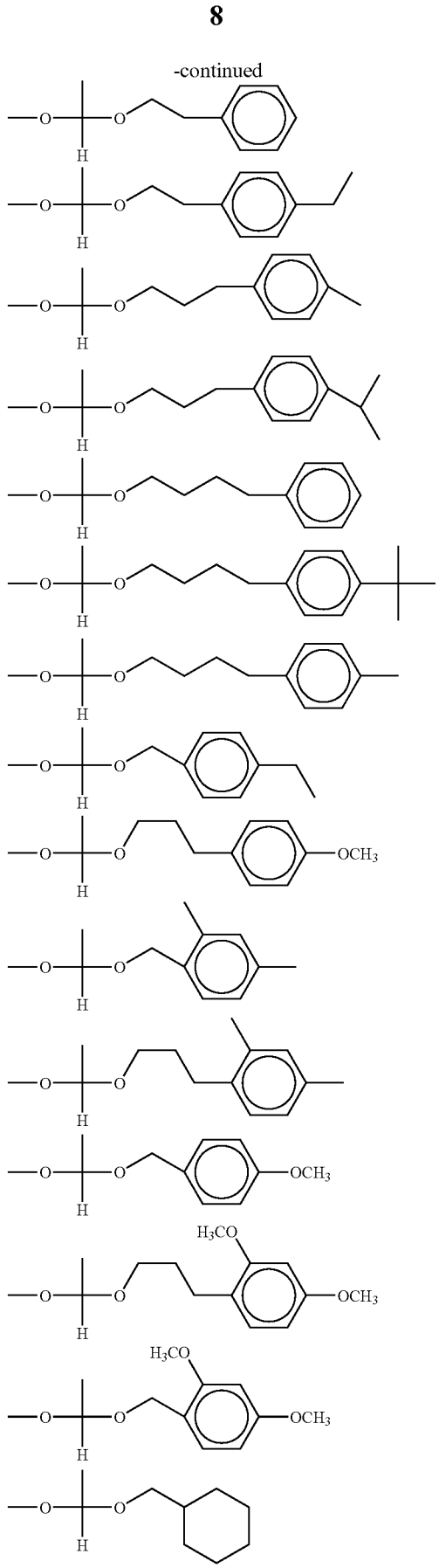

-continued

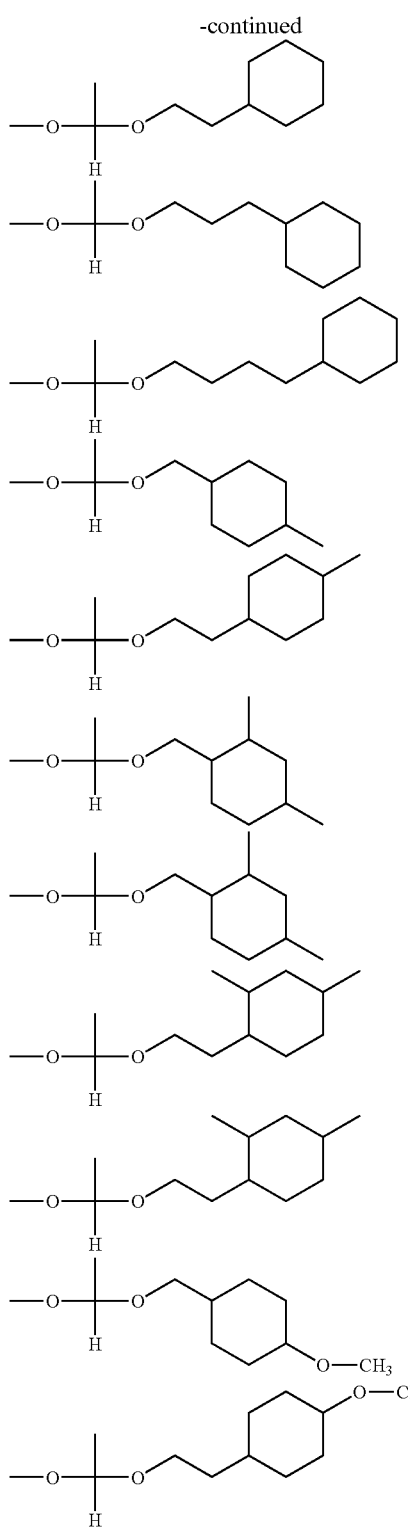

The acyl group of A is, for example, an acyl group having a carbon number of 2 to 8, and specific preferred examples thereof include a formyl group, an acetyl group, a propanoyl group, a butanoyl group, a pivaloyl group and a benzoyl group.

The alkyl group of A is, for example, an alkyl group having a carbon number of 1 to 8, and specific preferred examples thereof include a methyl group, an ethyl group, a propyl group, an n-butyl group, a sec-butyl group, a hexyl group and an octyl group.

The alkoxy group of A is, for example, the above-described alkoxy group having a carbon number of 1 to 8, and examples thereof include a methoxy group, an ethoxy group, a propoxy group, a butoxy group, a pentyloxy group, a hexyloxy group and a cyclohexyloxy group.

The acyloxy group or alkoxycarbonyl group of A includes groups corresponding to the above-described acyl group or alkoxy group.

These groups each may have a substituent, and preferred examples of the substituent include a hydroxyl group, a carboxyl group, a halogen atom (fluorine, chlorine, bromine, iodine) and an alkoxy group (e.g., methoxy, ethoxy, propoxy, butoxy). As for the cyclic structure, examples of the substituent further include an alkyl group (preferably having a carbon number of 1 to 8).

m and n each independently represents an integer of 0 to 4. m and n each is preferably an integer of 0 to 2, more preferably 1.

Specific examples of the repeating unit represented by formula (II) are set forth below, but the present invention is not limited thereto.

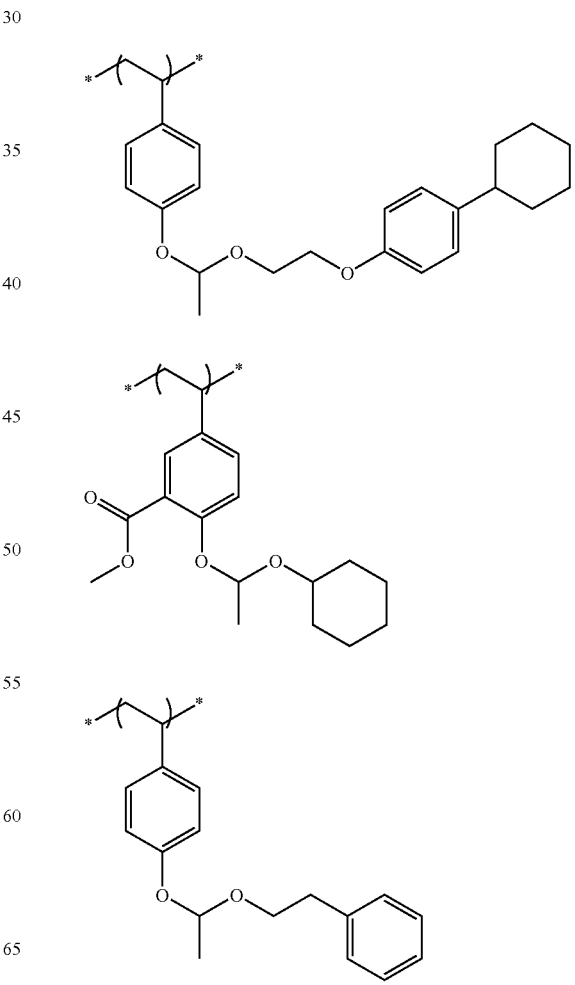

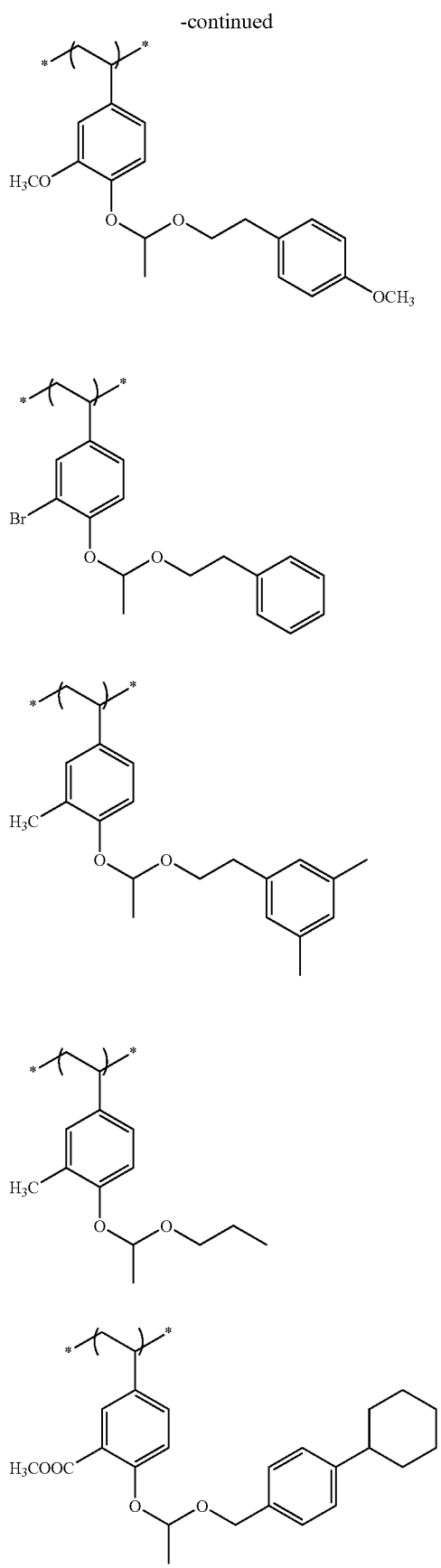
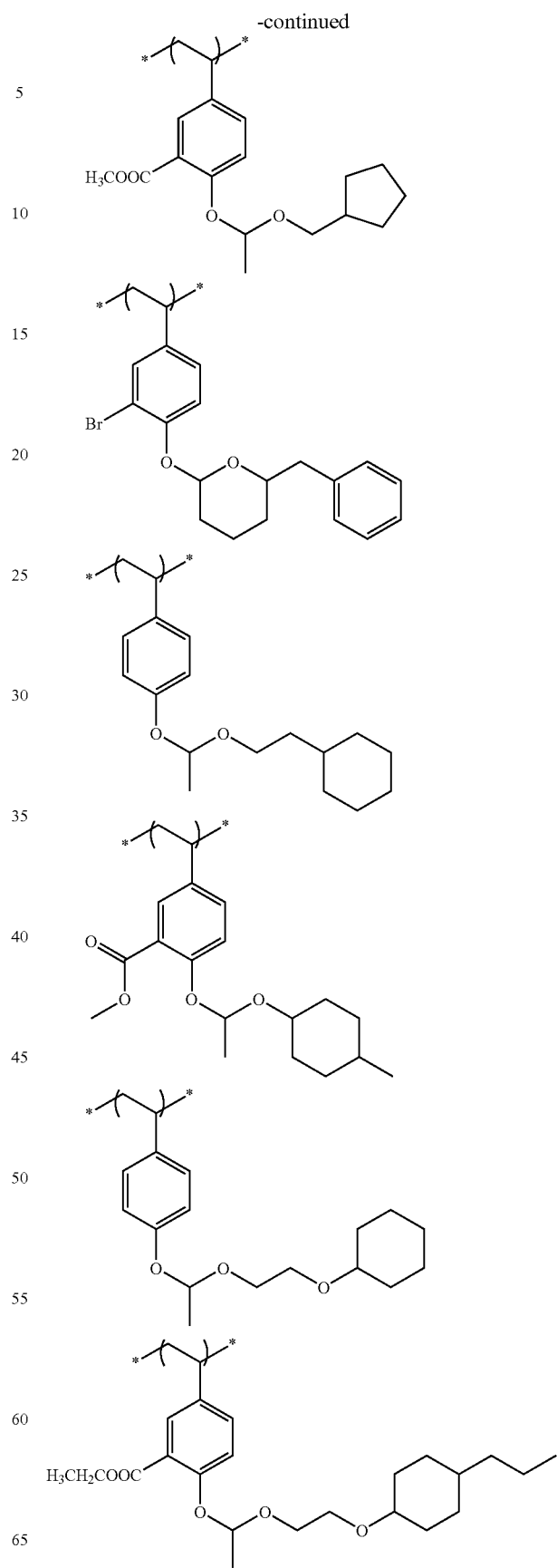

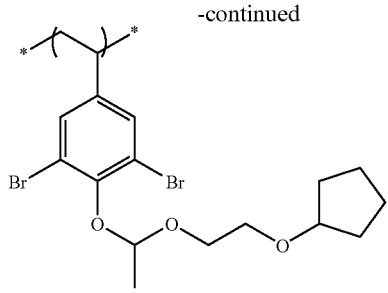
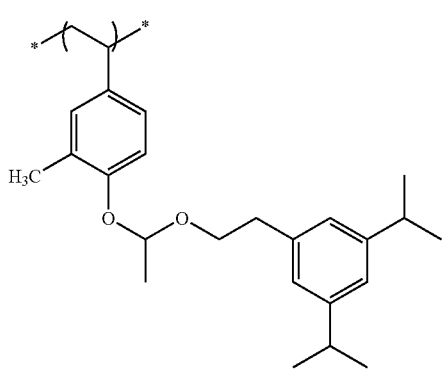
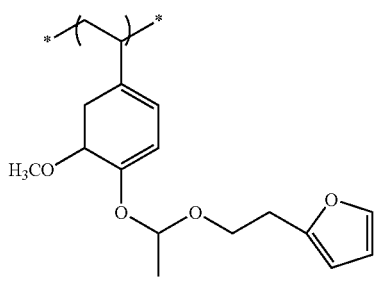
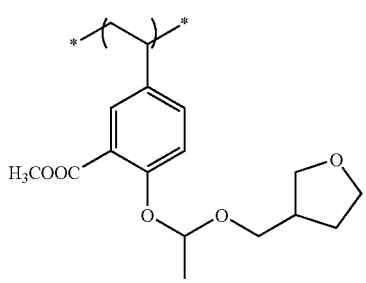
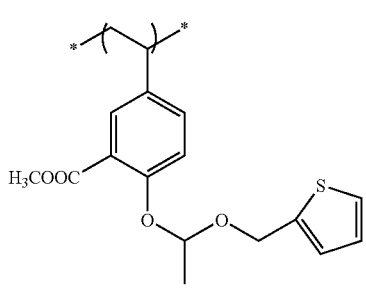
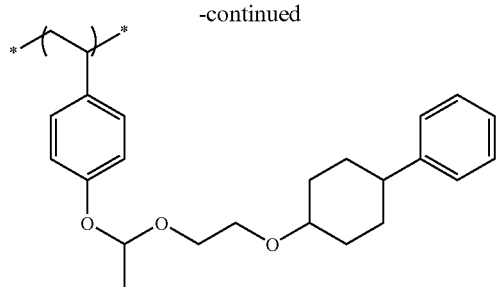
Specific examples of the repeating unit represented by formula (III) are set forth below, but the present invention is not limited thereto.
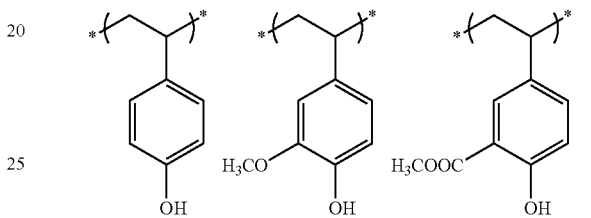
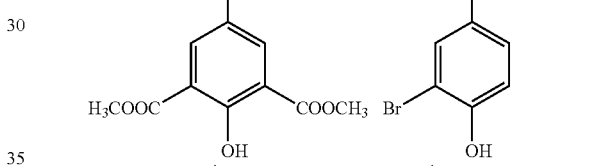
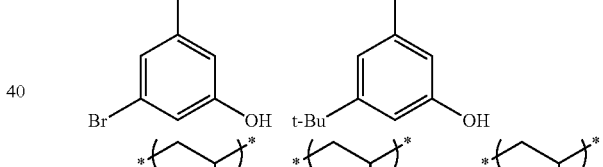
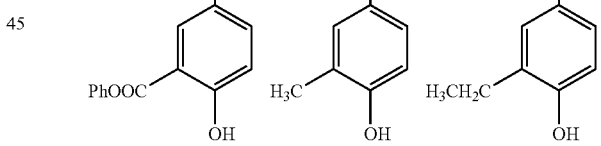
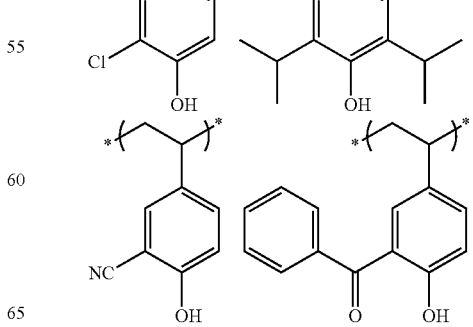

$R_{01}$ in formula (IV) each independently represents a hydrogen atom, an alkyl group, a cycloalkyl group, a halogen atom, a cyano group or an alkoxycarbonyl group and preferably has a carbon number of 20 or less, and examples thereof are the same as those of $R_{01}$ in formula (II) or (III).

The acyl group, alkyl group, alkoxy group, acyloxy group and alkoxycarbonyl group of B in formula (IV) are the same as respective groups of A in formula (II).

p represents an integer of 1 to 5 and is preferably an integer of 0 to 2, more preferably 1.

Specific examples of the repeating unit represented by formula (IV) are set forth below, but the present invention is not limited thereto.

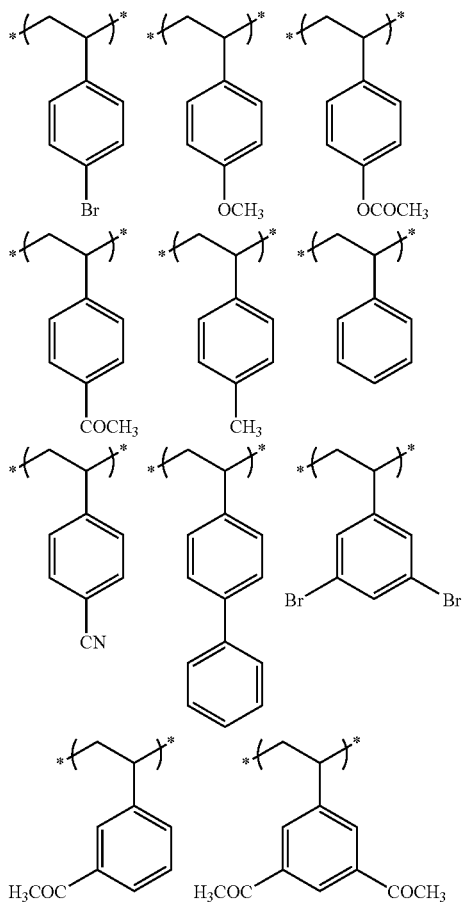

The resin (B) may contain a repeating unit represented by formula (V):

Ra to Rc each independently represents a hydrogen atom, a fluorine atom, a chlorine atom, a cyano group or an alkyl group.

$X_1$ represents a hydrogen atom or an organic group.

The alkyl group of Ra to Rc is preferably an alkyl group having a carbon number of 1 to 5, and examples thereof include a methyl group, an ethyl group and a propyl group.

The organic group of $X_1$ preferably has a carbon number of 1 to 40 and may be an acid-decomposable group or a non-acid-decomposable group.

In the case of a non-acid-decomposable group, examples thereof are the same as those of the organic group in the non-acid-decomposable group of $R_2$ (since $X_1$ is an organic group, a halogen atom is not included). Other examples include an alkyl group, a cycloalkyl group, an alkenyl group, an aryl group, an alkyloxy group (excluding an —O— tertiary alkyl), an acyl group, a cycloalkyloxy group, an alkenyloxy group, an aryloxy group, an alkylcarbonyloxy group, an alkylamidomethyloxy group, an alkylamide group, an arylamidomethyl group and an arylamide group.

The non-acid-decomposable group is preferably an acyl group, an alkylcarbonyloxy group, an alkyloxy group, a cycloalkyloxy group, an aryloxy group, an alkylamideoxy group or an alkylamide group, more preferably an acyl group, an alkylcarbonyloxy group, an alkyloxy group, a cycloalkyloxy group or an aryloxy group.

In the non-acid-decomposable group, the alkyl group is preferably an alkyl group having a carbon number of 1 to 4, such as methyl group, ethyl group, propyl group, n-butyl group, sec-butyl group and tert-butyl group; the cycloalkyl group is preferably a cycloalkyl group having a carbon number of 3 to 10, such as cyclopropyl group, cyclobutyl group, cyclohexyl group and adamantyl group; the alkenyl group is preferably an alkenyl group having a carbon number of 2 to 4, such as vinyl group, propenyl group, allyl group and butenyl group; the aryl group is preferably an aryl group having a carbon number of 6 to 14, such as phenyl group, xylyl group, toluoyl group, cumenyl group, naphthyl group and anthracenyl group; and the alkoxy group is preferably an alkoxy group having a carbon number of 1 to 4, such as methoxy group, ethoxy group, hydroxyethoxy group, propoxy group, hydroxypropoxy group, n-butoxy group, isobutoxy group and sec-butoxy group.

Examples of the organic group of $X_1$, which is an acid-decomposable group, include —$C(R_{11a})(R_{12a})(R_{13a})$, —$C(R_{14a})(R_{15a})(OR_{16a})$ and —CO—OC$(R_{11a})(R_{12a})(R_{13a})$.

$R_{11a}$ to $R_{13a}$ each independently represents an alkyl group, a cycloalkyl group, an alkenyl group, an aralkyl group or an aryl group. $R_{14a}$ and $R_{15a}$ each independently represents a hydrogen atom or an alkyl group. $R_{16a}$ represents an alkyl group, a cycloalkyl group, an alkenyl group, an aralkyl group or an aryl group. Two members out of $R_{11a}$, $R_{12a}$ and $R_{13a}$, or two members out of $R_{14a}$, $R_{15a}$ and $R_{16a}$ may combine to form a ring.

Also, a group having an acid-decomposable group may be introduced into $X_1$ by modification. $X_1$ having introduced thereinto an acid-decomposable group is, for example, represented by the following formula:

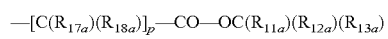

wherein $R_{17a}$ and $R_{18a}$ each independently represents a hydrogen atom or an alkyl group, and p represents an integer of 1 to 4.

The organic group of $X_1$ is preferably an acid-decomposable group having at least one cyclic structure selected from an alicyclic structure, an aromatic cyclic structure and a crosslinked alicyclic structure, and preferably has a structure containing an aromatic group (particularly phenyl group) or a structure containing an alicyclic or crosslinked alicyclic structure represented by any one of the following formulae (pI) to (pVI):

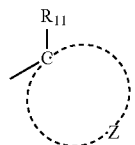
(pI)

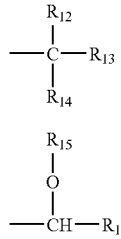
(pII)
(pIII)
(pIV)

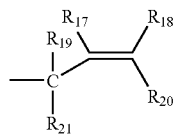
(pV)

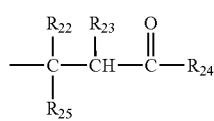
(pVI)

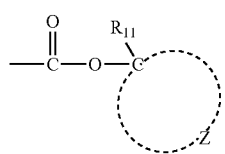

In formulae, $R_{11}$ represents a methyl group, an ethyl group, an n-propyl group, an isopropyl group, an n-butyl group, an isobutyl group or a sec-butyl group, and Z represents an atomic group necessary for forming an alicyclic hydrocarbon group together with the carbon atom.

$R_{12}$ to $R_{16}$ each independently represents a linear or branched alkyl group having a carbon number of 1 to 4 or an alicyclic hydrocarbon group, provided that at least one of $R_{12}$ to $R_{14}$ or either one of $R_{15}$ and $R_{16}$ represents an alicyclic hydrocarbon group.

$R_{17}$ to $R_{21}$ each independently represents a hydrogen atom, a linear or branched alkyl group having a carbon number of 1 to 4 or an alicyclic hydrocarbon group, provided that at least one of $R_{17}$ to $R_{21}$ represents an alicyclic hydrocarbon group and that either one of $R_{19}$ and $R_{21}$ represents a linear or branched alkyl group having a carbon number of 1 to 4 or an alicyclic hydrocarbon group.

$R_{22}$ to $R_{25}$ each independently represents a hydrogen atom, a linear or branched alkyl group having a carbon number of 1 to 4 or an alicyclic hydrocarbon group, provided that at least one of $R_{22}$ to $R_{25}$ represents an alicyclic hydrocarbon group, and $R_{23}$ and $R_{24}$ may combine with each other to form a ring.

In formulae (pI) to (pVI), the alkyl group of $R_{12}$ to $R_{25}$ is a linear or branched alkyl group having a carbon number of 1 to 4, which may be substituted or unsubstituted, and examples of the alkyl group include a methyl group, an ethyl group, an n-propyl group, an isopropyl group, an n-butyl group, an isobutyl group, a sec-butyl group and a tert-butyl group.

Examples of the substituent which the alkyl group may further have include an alkoxy group having a carbon number of 1 to 4, a halogen atom (fluorine, chlorine, bromine, iodine), an acyl group, an acyloxy group, a cyano group, a hydroxyl group, a carboxy group, an alkoxycarbonyl group and a nitro group.

The alicyclic hydrocarbon group of $R_{11}$, to $R_{25}$ and the alicyclic hydrocarbon group formed by Z together with the carbon atom may be monocyclic or polycyclic. Specific examples thereof include a group having a carbon number of 5 or more and having a monocyclo, bicyclo, tricyclo or tetracyclo structure. The carbon number thereof is preferably from 6 to 30, more preferably from 7 to 25. These alicyclic hydrocarbon groups each may have a substituent.

Examples of the structure of the alicyclic moiety in the alicyclic hydrocarbon group are set forth below.

(1)

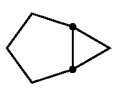
(2)

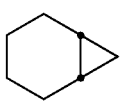
(3)

(4)

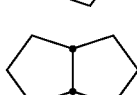
(5)

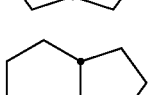
(6)

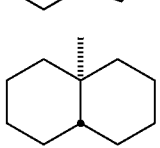
(7)

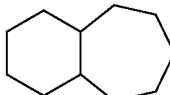
(8)

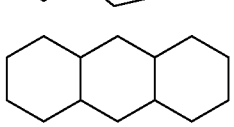
(9)

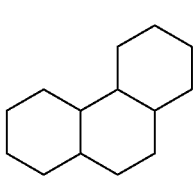
(10)

-continued
(11) 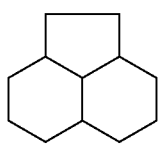
(12) 
(13) 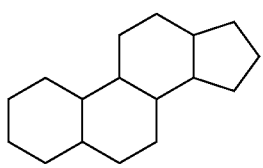
(14) 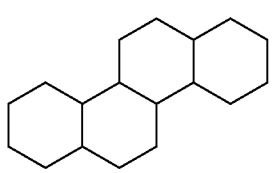
(15) 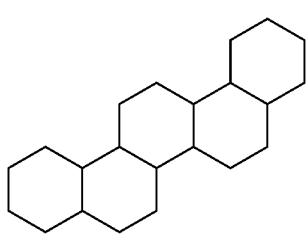
(16) 
(17) 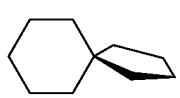
(18) 
(19) 
(20) 
(21) 
(22) 
-continued
(23) 
(24) 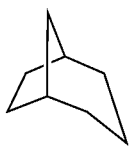
(25) 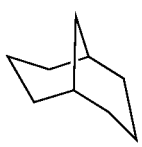
(26) 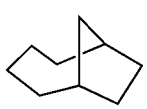
(27) 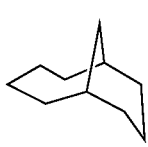
(28) 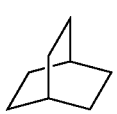
(29) 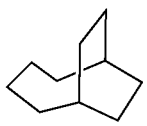
(30) 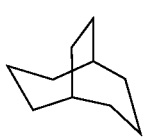
(31) 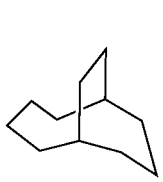
(32) 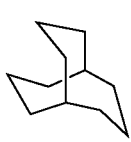
(33) 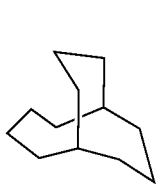

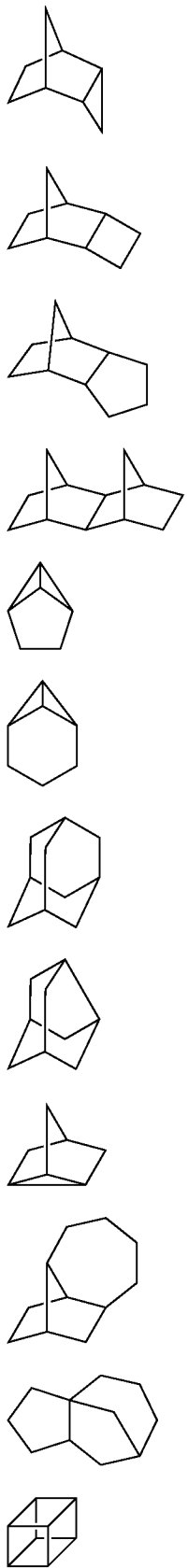
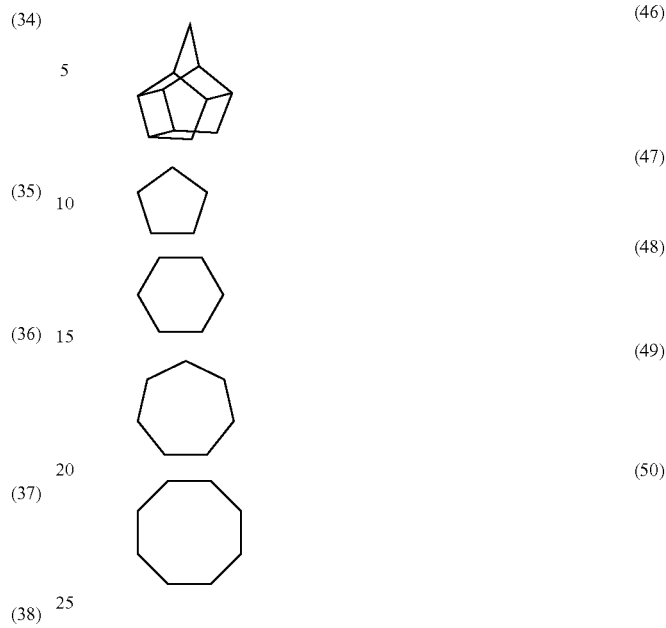

Among these alicyclic moieties, preferred in the present invention are an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group, more preferred are an adamantyl group, a decalin residue, a norbornyl group, a cedrol group, a cyclohexyl group, a cycloheptyl group, a cyclooctyl group, a cyclodecanyl group and a cyclododecanyl group.

Examples of the substituent which the alicyclic hydrocarbon group may have include an alkyl group, a halogen atom, a hydroxyl group, an alkoxy group, a carboxyl group and an alkoxycarbonyl group. The alkyl group is preferably a lower alkyl group such as methyl group, ethyl group, propyl group, isopropyl group and butyl group, more preferably a substituent selected from the group consisting of a methyl group, an ethyl group, a propyl group and an isopropyl group. Examples of the alkoxy group include an alkoxy group having from a carbon number of 1 to 4, such as methoxy group, ethoxy group, propoxy group and butoxy group.

The alkyl group, alkoxy group and alkoxycarbonyl group each may further have a substituent, and examples of the substituent include an alkoxy group having a carbon number of 1 to 4 (e.g., methoxy, ethoxy, butoxy), a hydroxy group, an oxo group, an alkylcarbonyl group (preferably having a carbon number of 2 to 5), an alkylcarbonyloxy group (preferably having a carbon number of 2 to 5), an alkyloxycarbonyl group (preferably having a carbon number of 2 to 5) and a halogen atom (e.g., chlorine, bromine, fluorine).

In the resin (B), for maintaining good developability with an alkali developer, another appropriate polymerizable monomer may be copolymerized so that an alkali-soluble group such as phenolic hydroxyl group, carboxyl group, sulfonic acid group and hexafluoroisopropanol group ($-C(CF_3)_2OH$) can be introduced, or for enhancing the film property, another hydrophobic polymerizable monomer such as alkyl acrylate and alkyl methacrylate may be copolymerized.

The content of the repeating unit represented by formula (II) is preferably from 5 to 60 mol %, more preferably from 10 to 50 mol %, still more preferably from 10 to 40 mol %, based on all repeating units constituting the resin.

The content of the repeating unit represented by formula (III) is preferably from 40 to 90 mol %, more preferably from 45 to 80 mol %, still more preferably from 50 to 75 mol %, based on all repeating units constituting the resin.

The content of the repeating unit represented by formula (IV) is preferably from 5 to 50 mol %, more preferably from 10 to 40 mol %, still more preferably from 15 to 30 mol %, based on all repeating units constituting the resin.

The content of the repeating unit represented by formula (V) is preferably from 0 to 30 mol %, more preferably from 0 to 20 mol %, still more preferably from 0 to 10 mol %, based on all repeating units constituting the resin.

The content of the repeating unit having an alkali-soluble group such as hydroxyl group, carboxy group and sulfonic acid group is preferably from 1 to 99 mol %, more preferably from 3 to 95 mol %, still more preferably from 5 to 90 mol %, based on all repeating units constituting the resin.

The content of the repeating unit having an acid-decomposable group is preferably from 3 to 95 mol %, more preferably from 5 to 90 mol %, still more preferably from 10 to 85 mol %, based on all repeating units constituting the resin.

The weight average molecular weight of the resin (B1) is, as a polystyrene-reduced value by the GPC method, from 1,000 to 5,000, preferably from 1,500 to 4,000, more preferably from 2,000 to 3,000. When the weight average molecular weight is 1,000 or more, the performance in terms of collapse is enhanced, and when it is 5,000 or less, the performance in terms of sensitivity, resolution and LER is enhanced.

The dispersity (Mw/Mn) of the resin (B1) is preferably from 1.0 to 3.0, more preferably from 1.05 to 2.0, still more preferably from 1.1 to 1.7.

As for the resin (B1), two or more kinds of resins may be used in combination.

Specific examples of the resin (B1) are set forth below, but the present invention is not limited thereto.

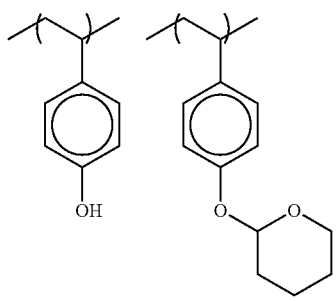
(R-1)

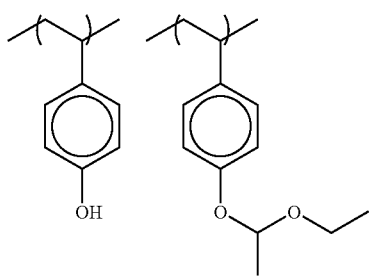
(R-2)

-continued

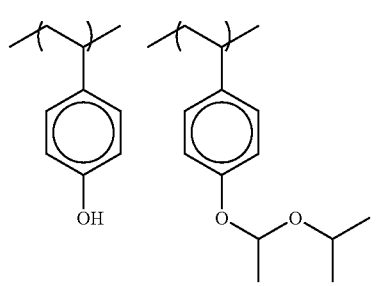
(R-3)

(R-4)

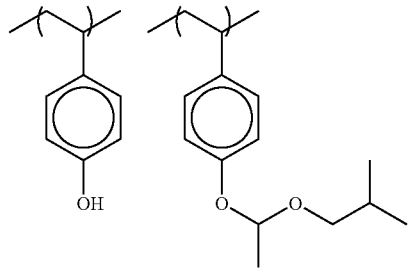
(R-5)

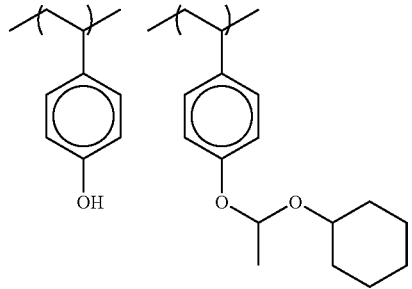
(R-6)

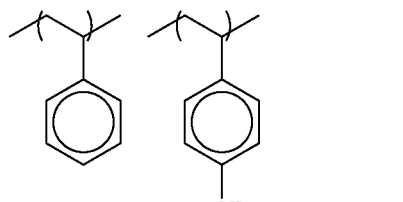
(R-7)

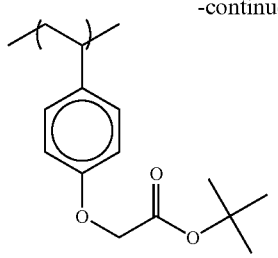
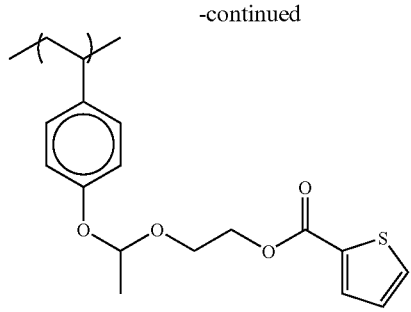
(R-8)
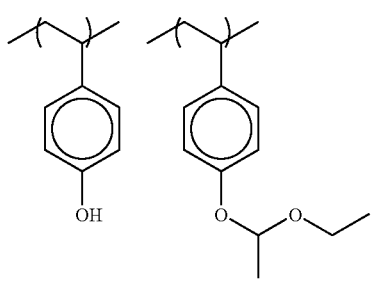
(R-11)
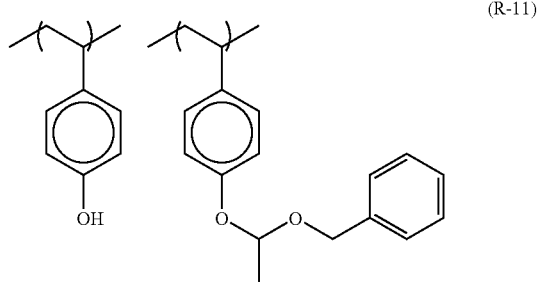
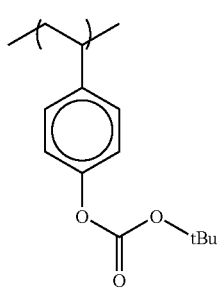
(R-12)
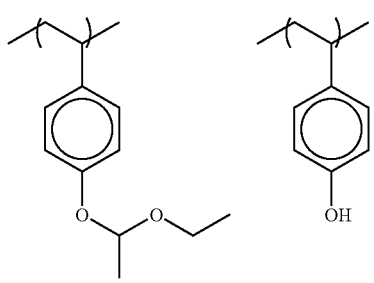
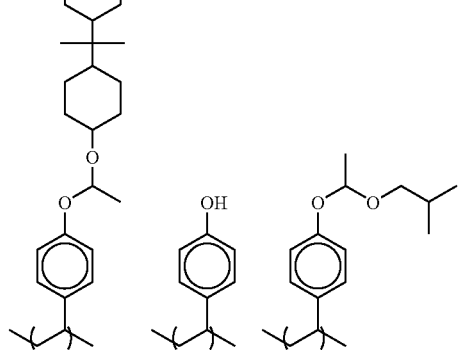
(R-9)
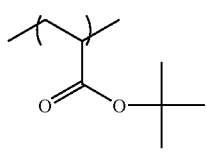
(R-13)
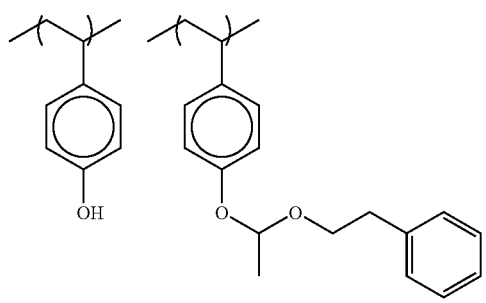
(R-10)

(R-14)
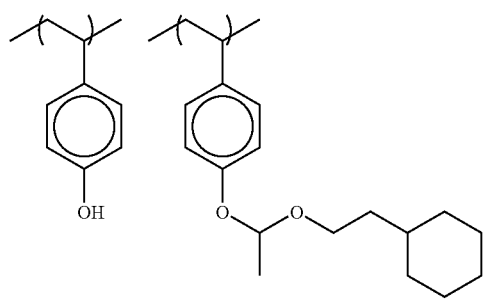
(R-15)
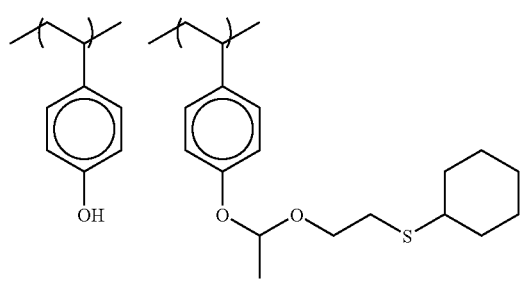
(R-16)
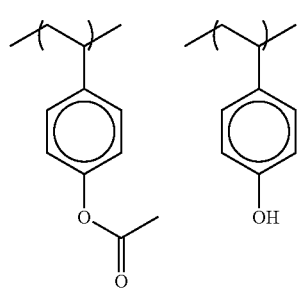
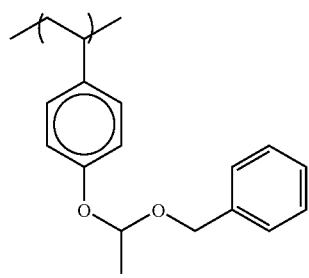
(R-17)
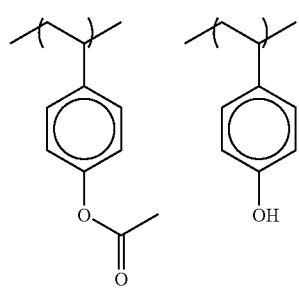
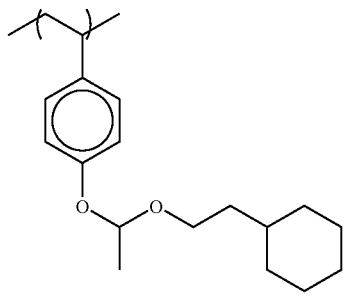
(R-18)
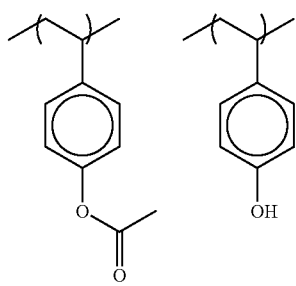
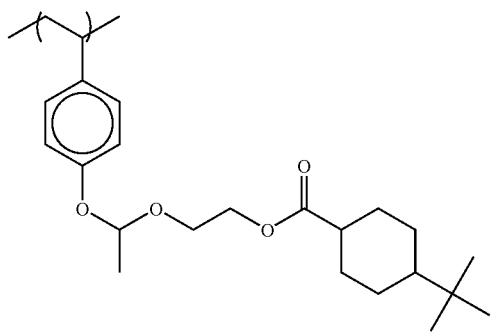
(R-19)
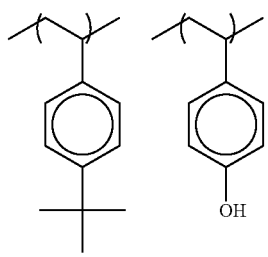
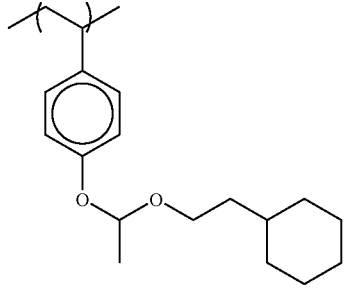

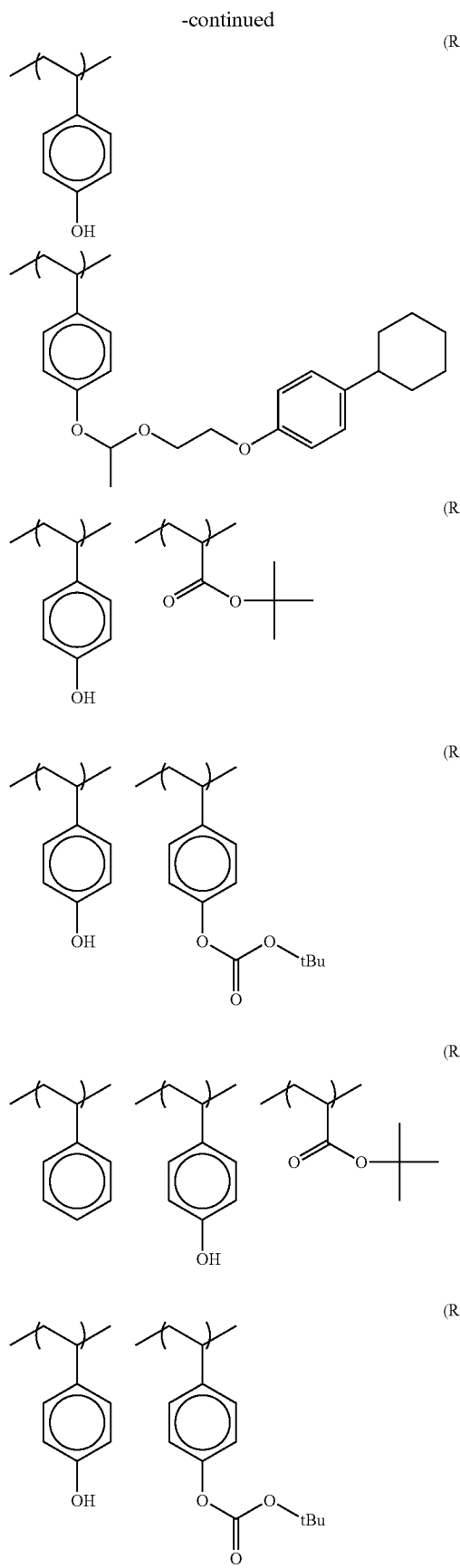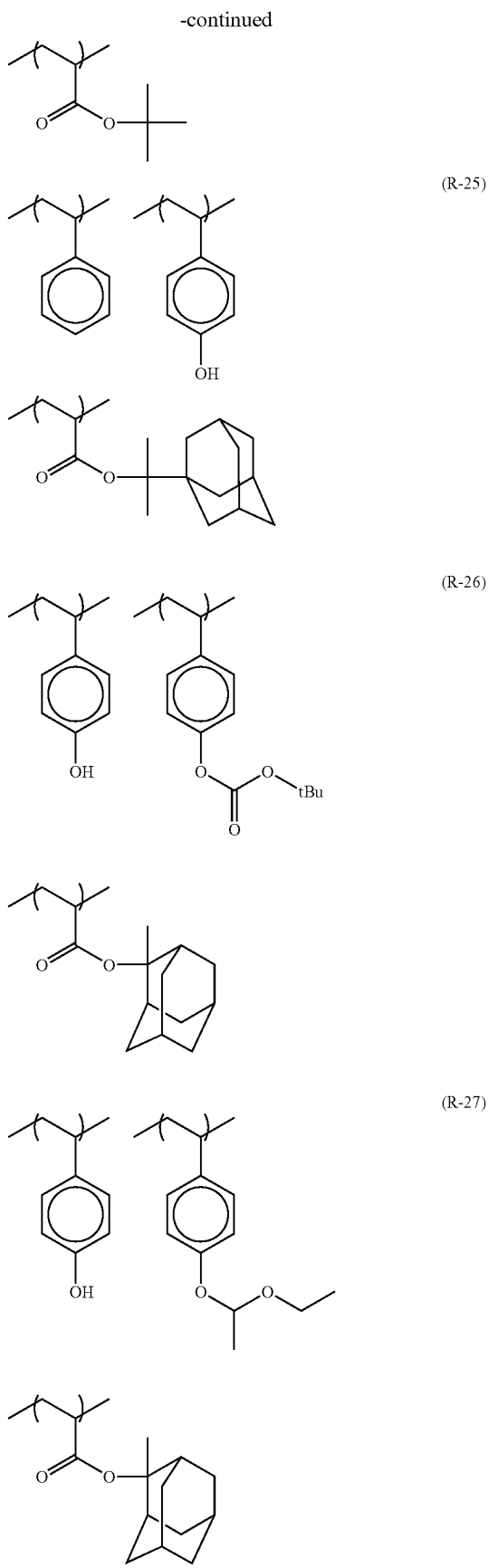

-continued
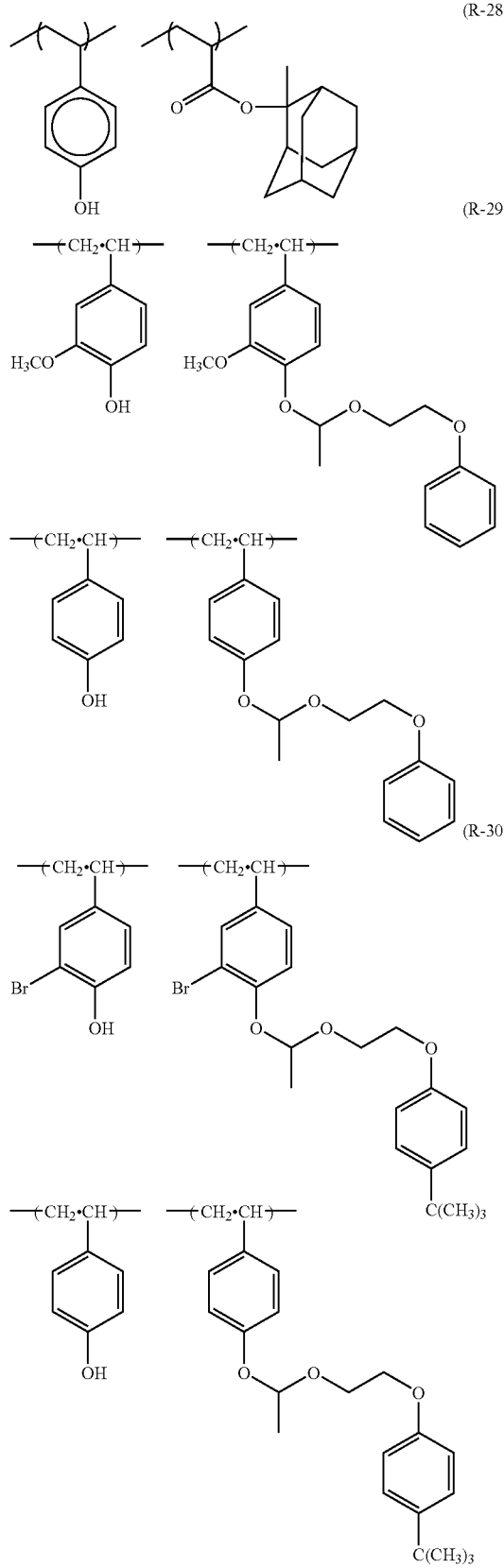
(R-28)
(R-29)
(R-30)
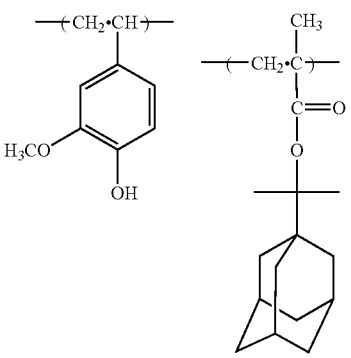
(R-31)
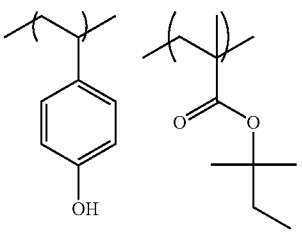
(R-32)
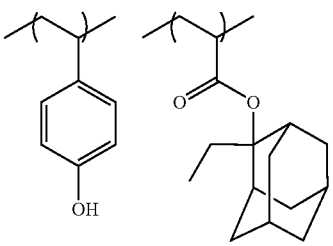
(R-33)
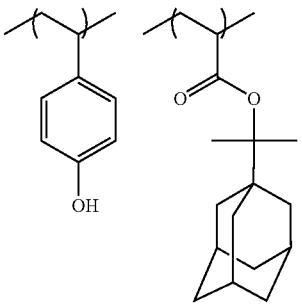
(R-34)
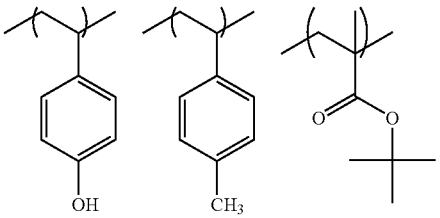
(R-35)
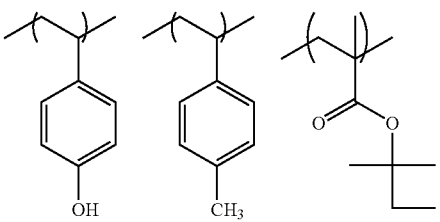
(R-36)

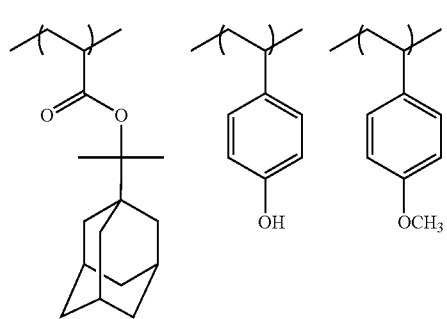
(R-37)
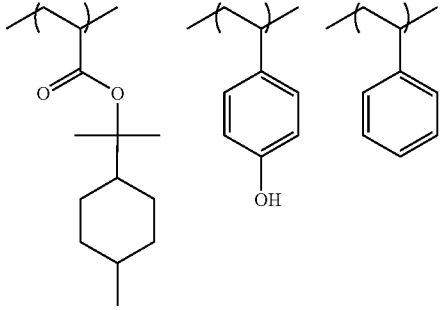
(R-42)
(R-38)
(R-43)
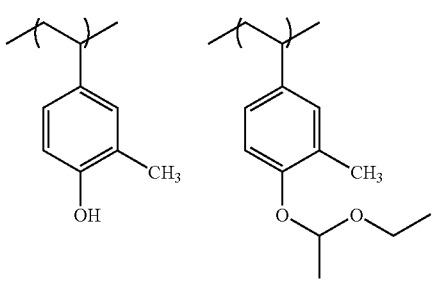
(R-39)
(R-44)
(R-40)
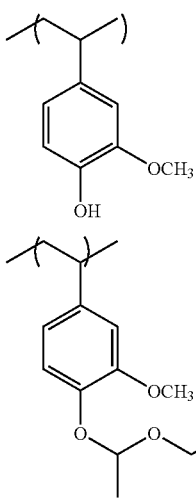
(R-45)
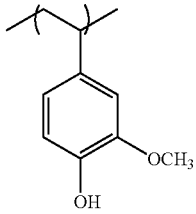
(R-41)
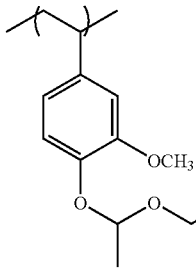

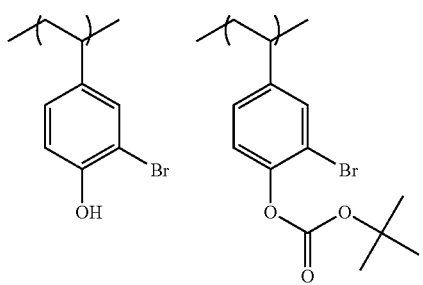
(R-46)
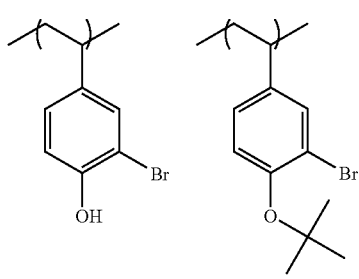
(R-47)
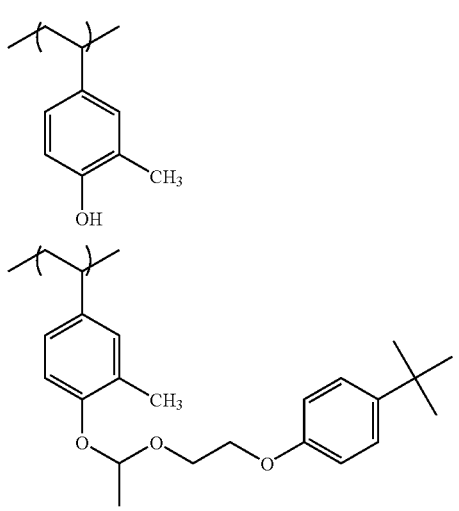
(R-48)
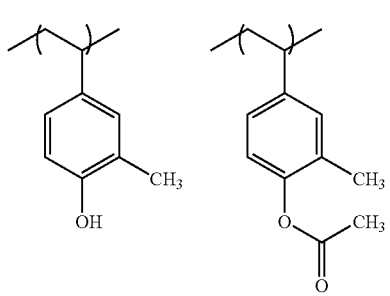
(R-49)
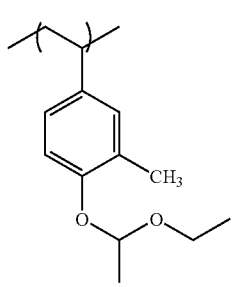
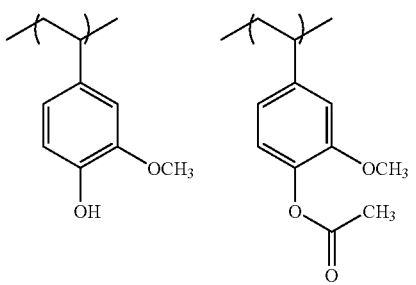
(R-50)
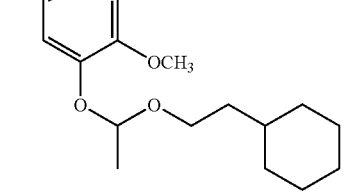
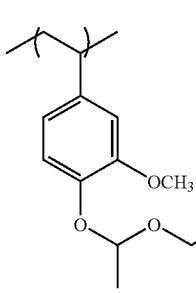 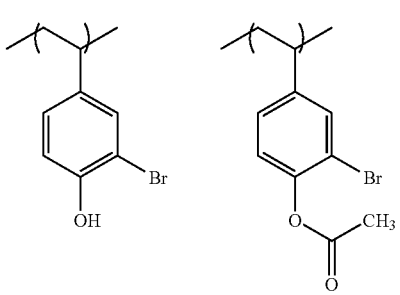
(R-51)
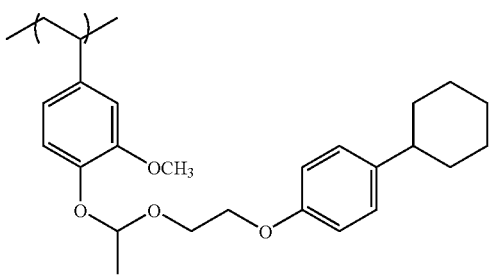
(R-52)
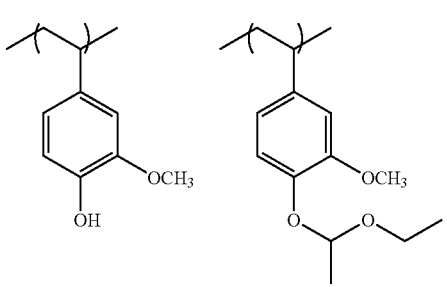

-continued
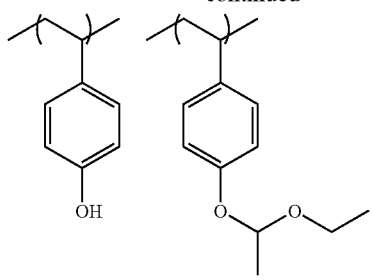
(R-53)
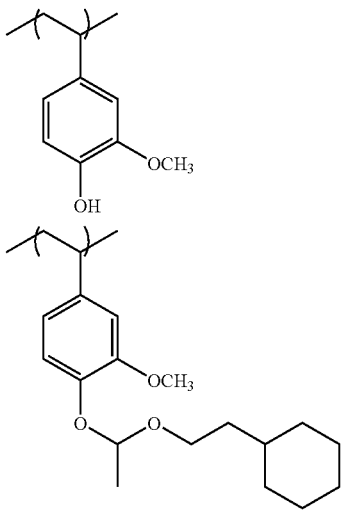
(R-54)
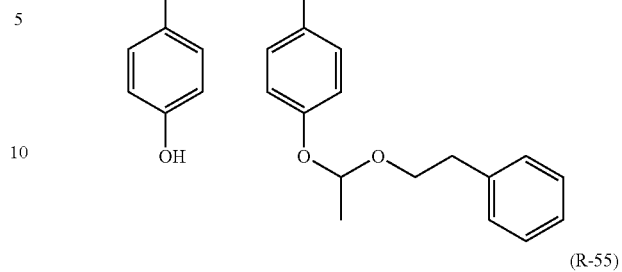
(R-55)
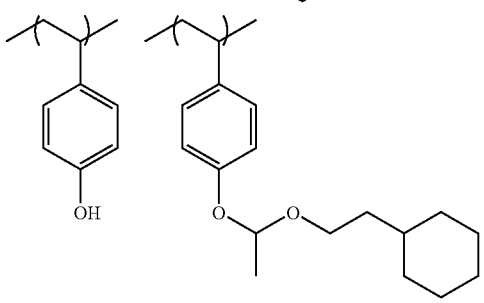
(R-56)
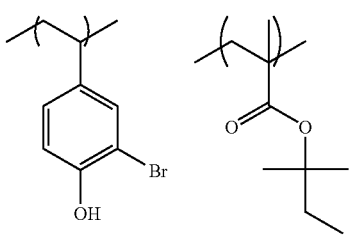
(R-57)
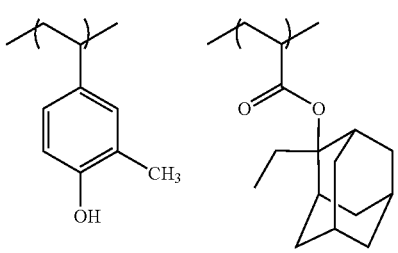

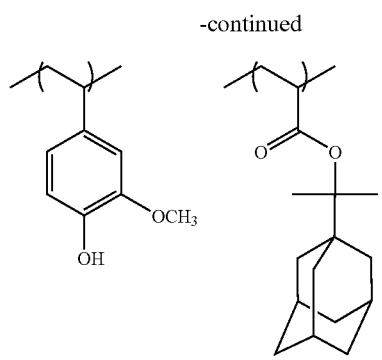
(R-58)
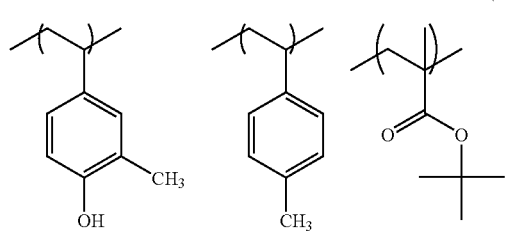
(R-59)
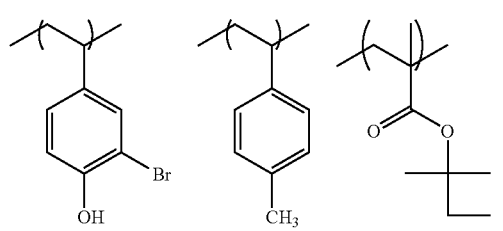
(R-60)
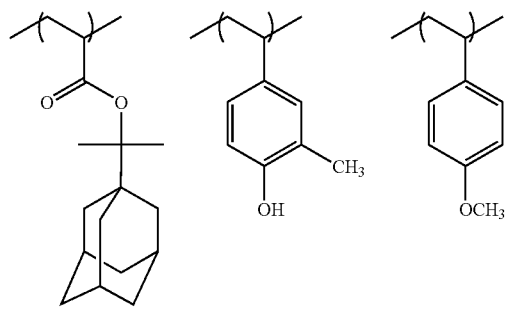
(R-61)
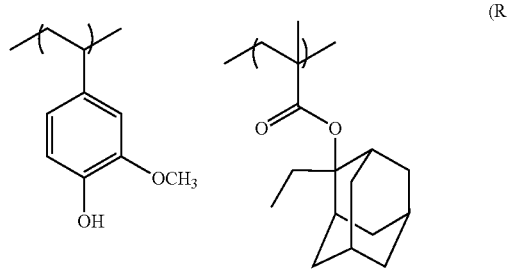
(R-62)
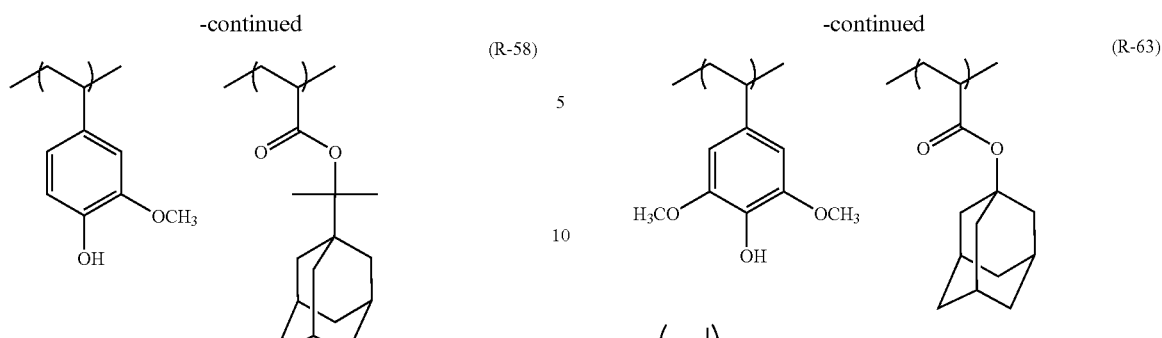
(R-63)
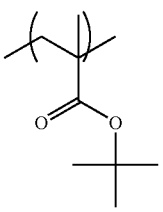
(R-64)
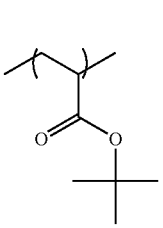
(R-65)
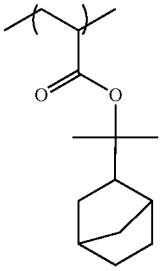
(R-66)
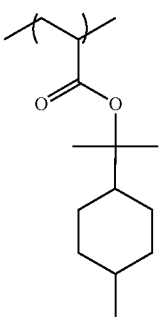

-continued
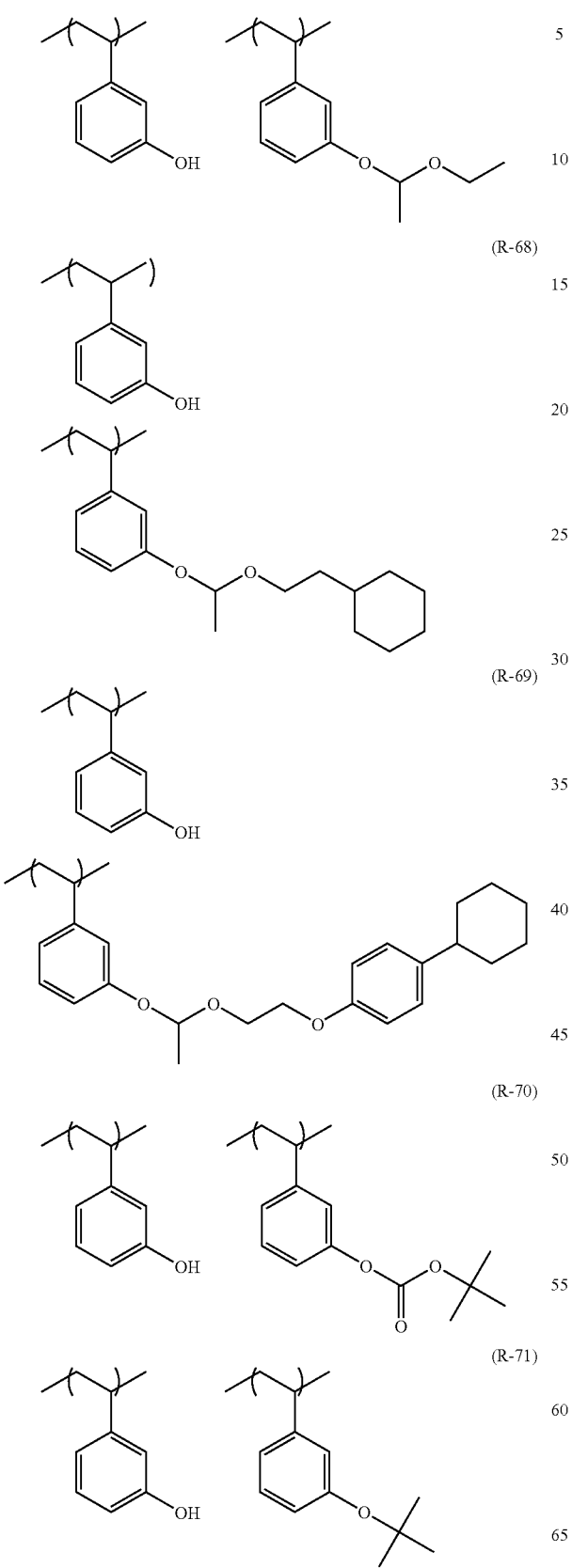
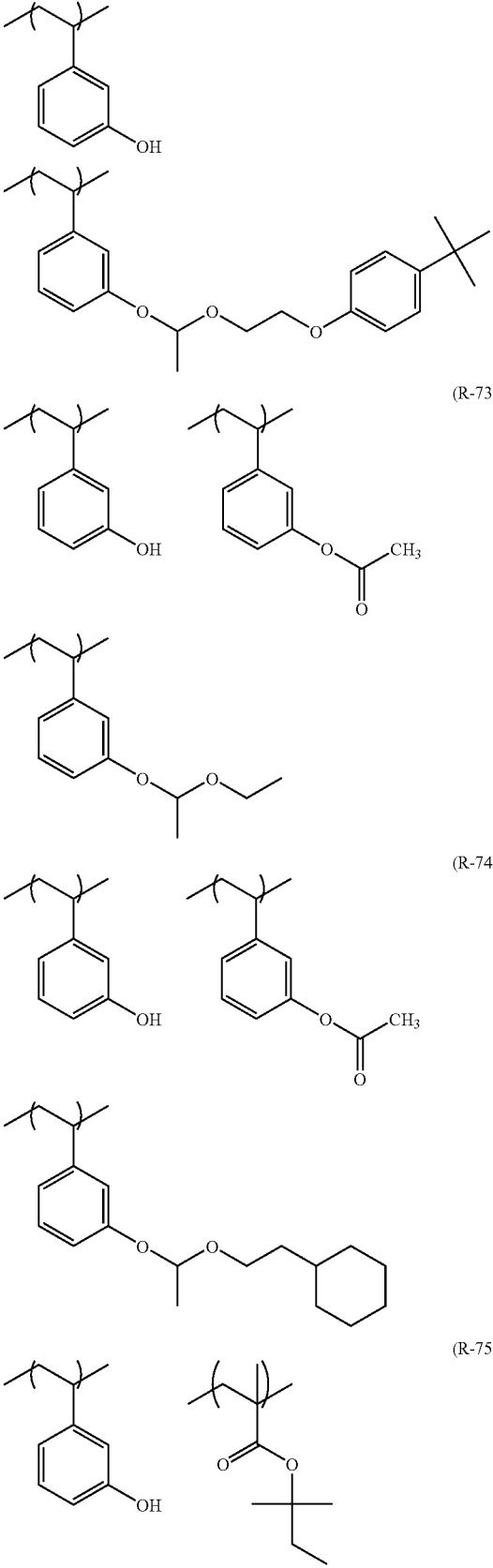

-continued
(R-76) 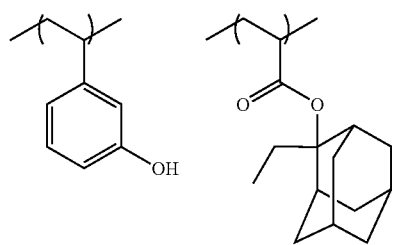
(R-77) 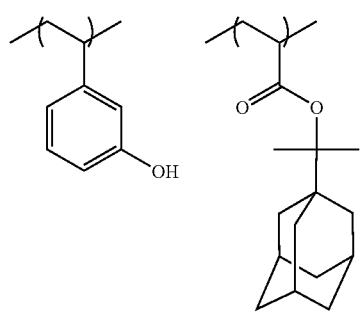
(R-78) 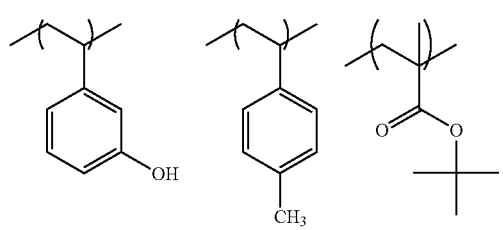
(R-79) 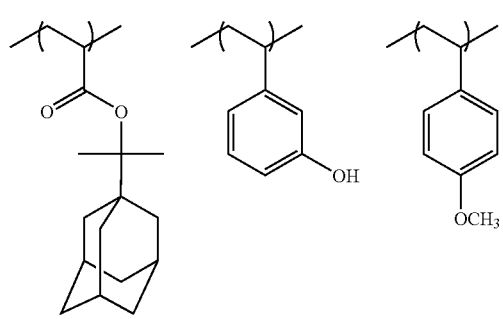
(R-80) 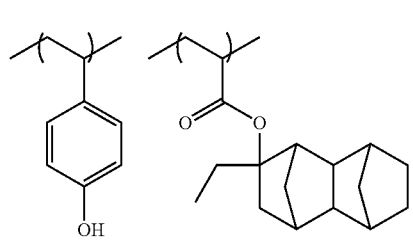
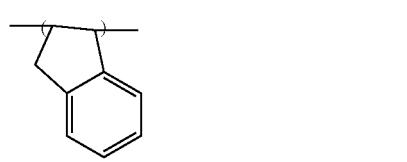
-continued
(R-81) 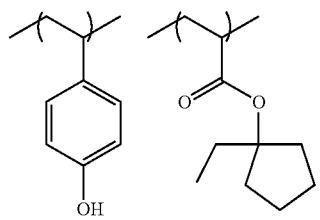
(R-82) 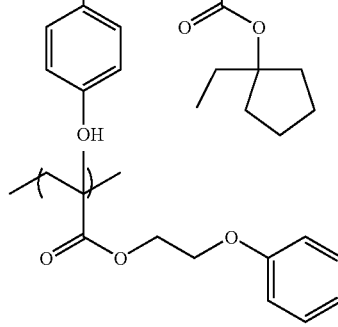
(R-83) 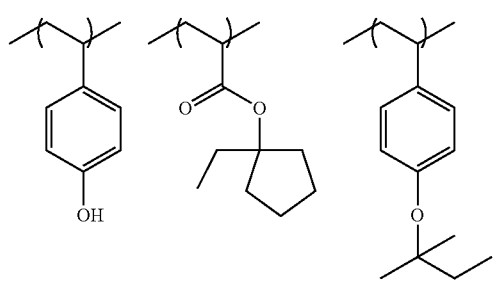
(R-84) 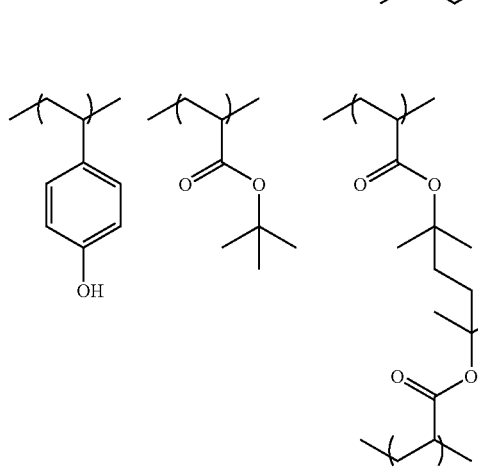
(R-85) 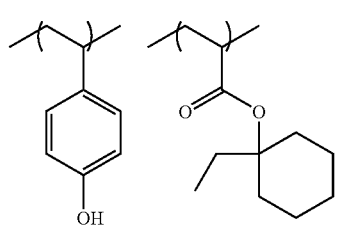

-continued
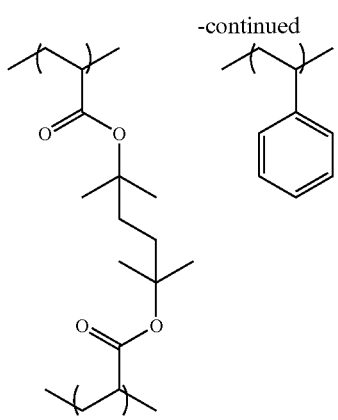
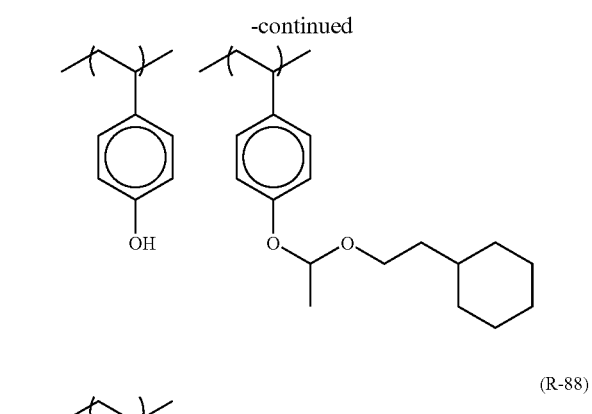
(R-88)
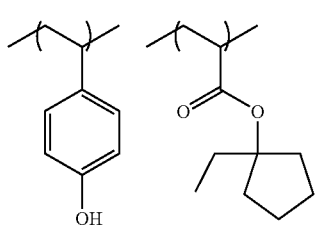
(R-86)
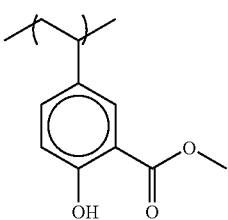
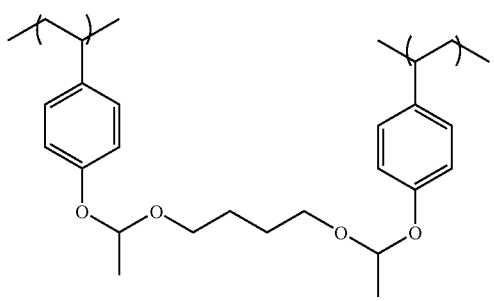
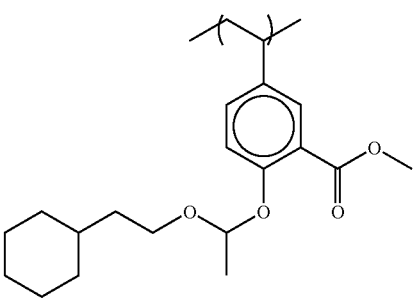
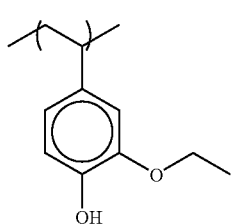
(R-87)
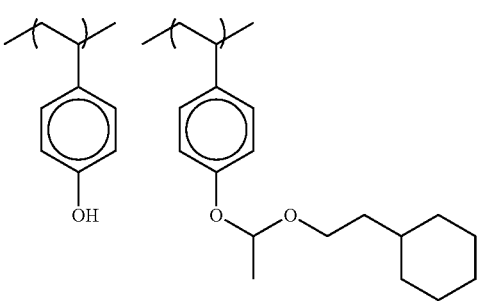
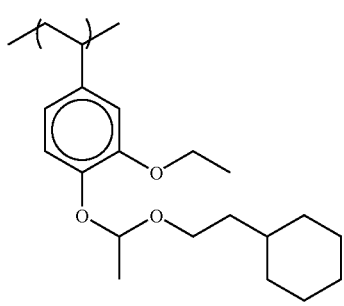
(R-89)
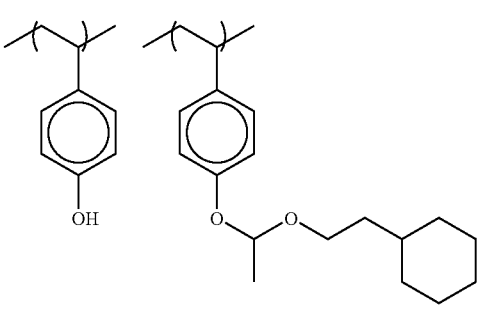

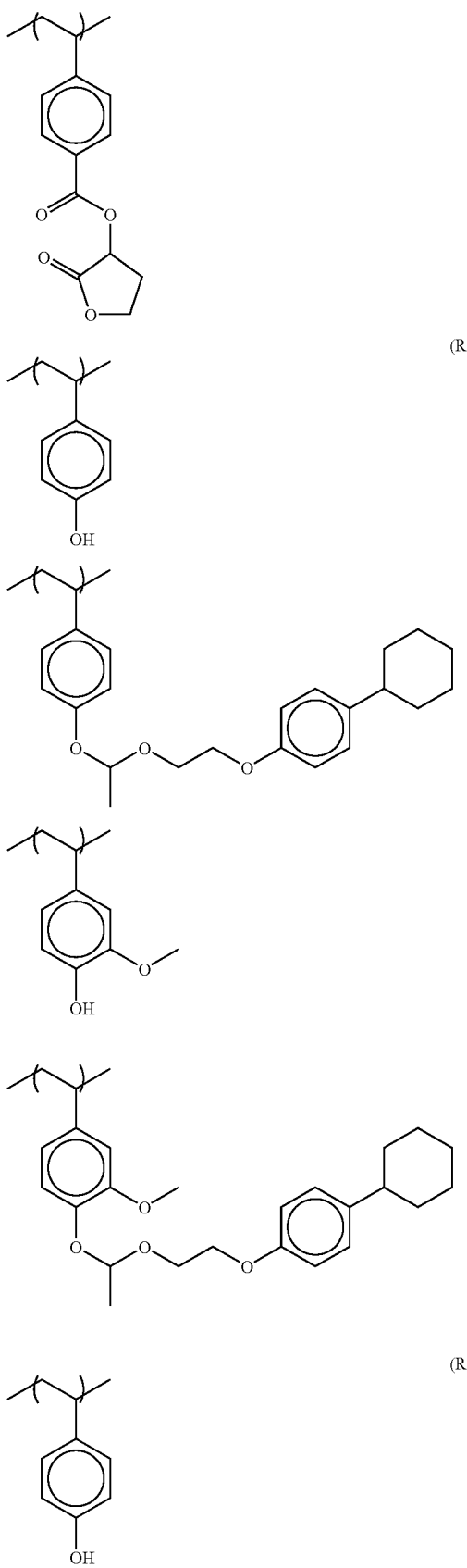

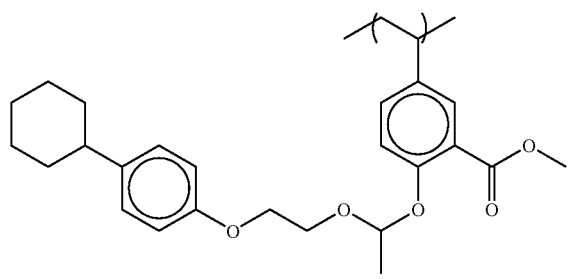
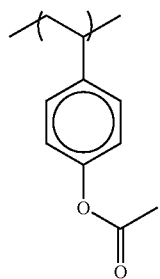
(R-93)
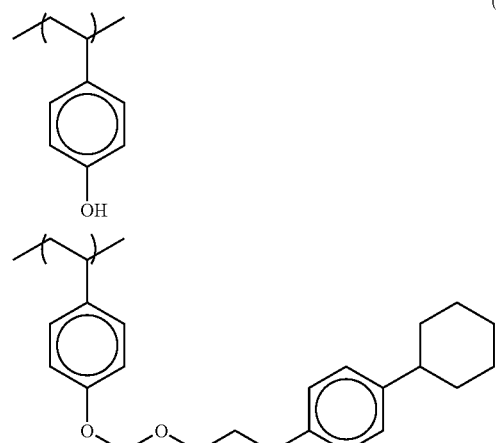
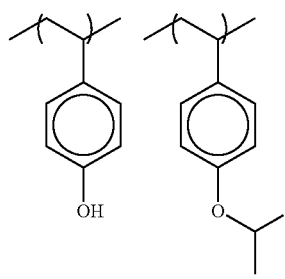
(R-95)
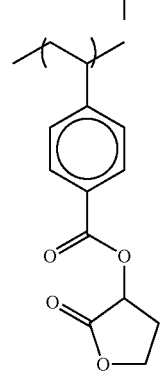
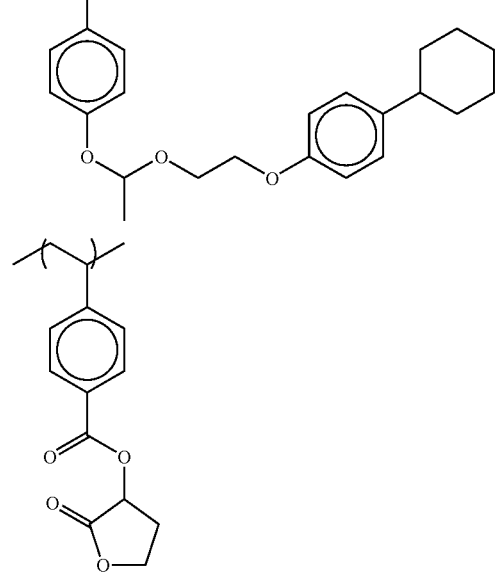
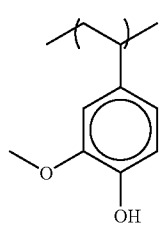
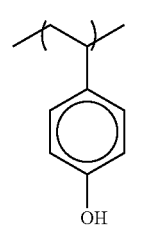
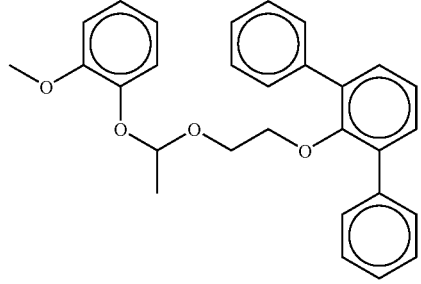
(R-94)
(R-96)
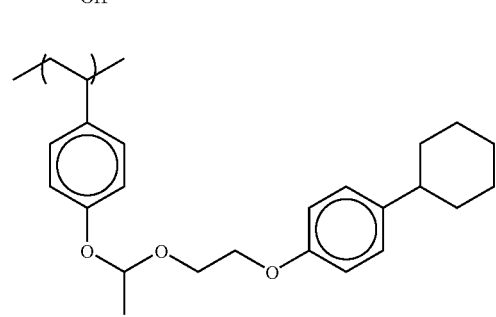
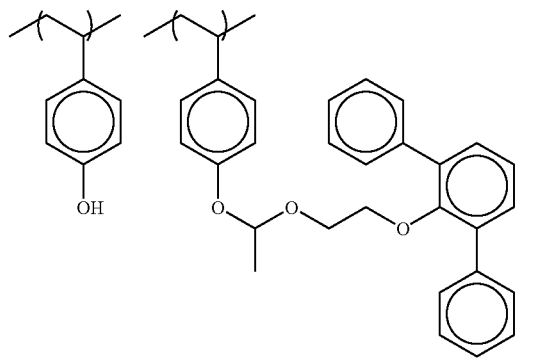

-continued
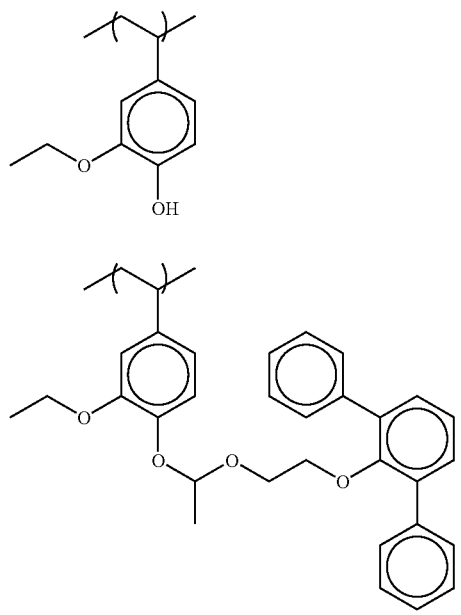
(R-97)
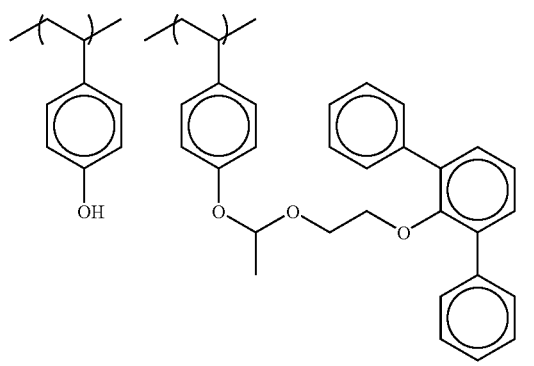
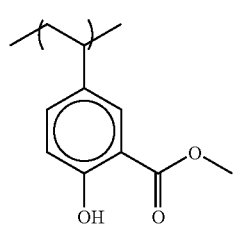
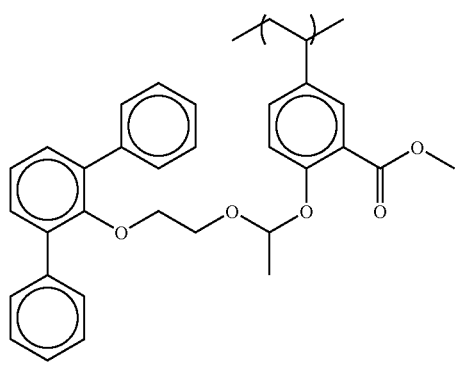
-continued
(R-98)
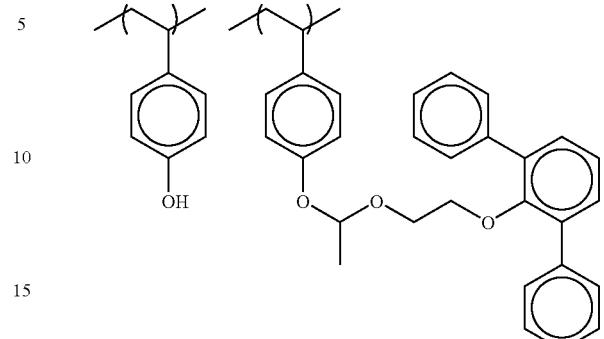
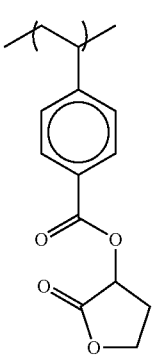
(R-99)
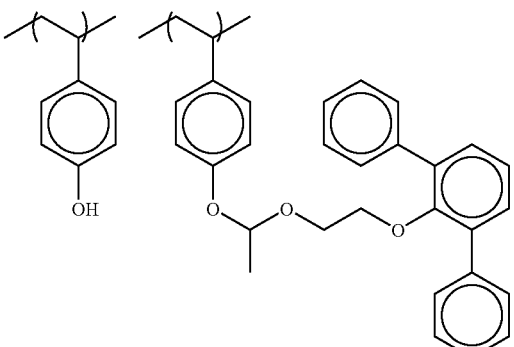
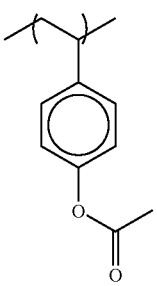
(R-100)

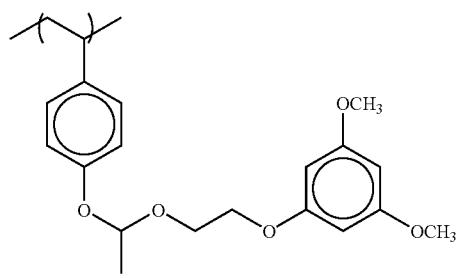
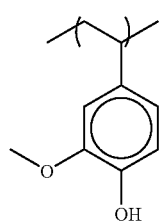
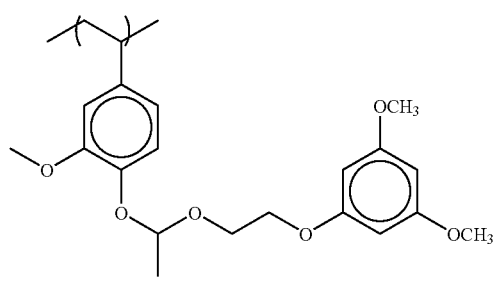
(R-101)
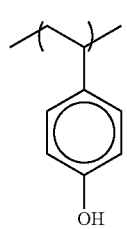
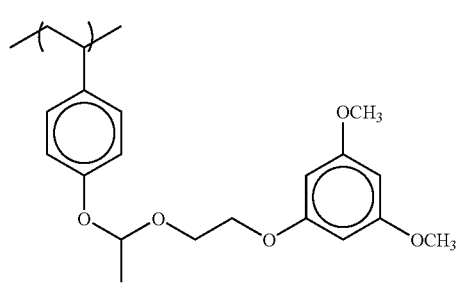
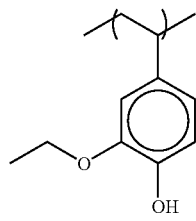
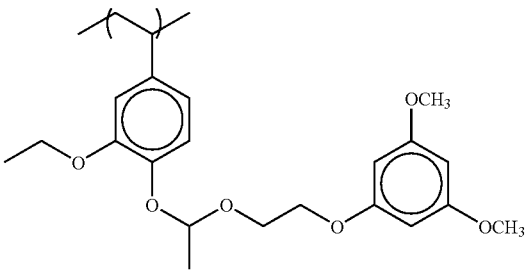
(R-102)
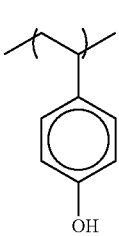
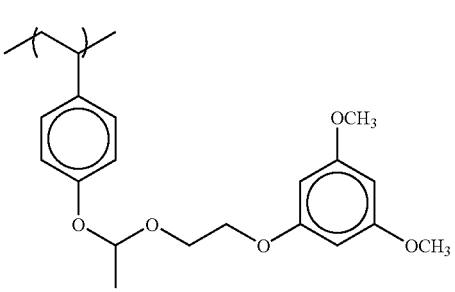
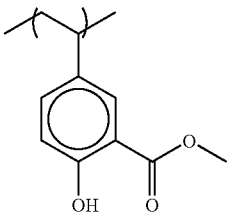
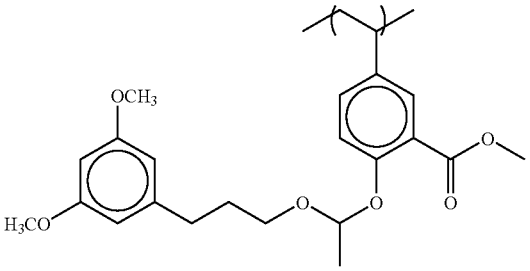
(R-103)
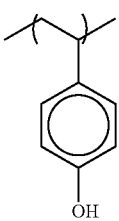

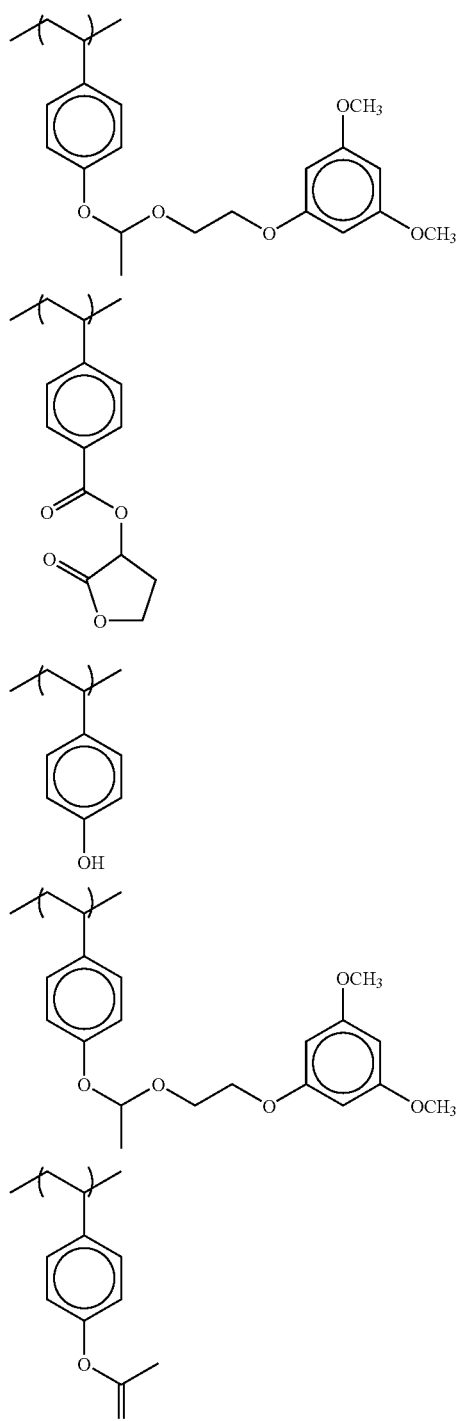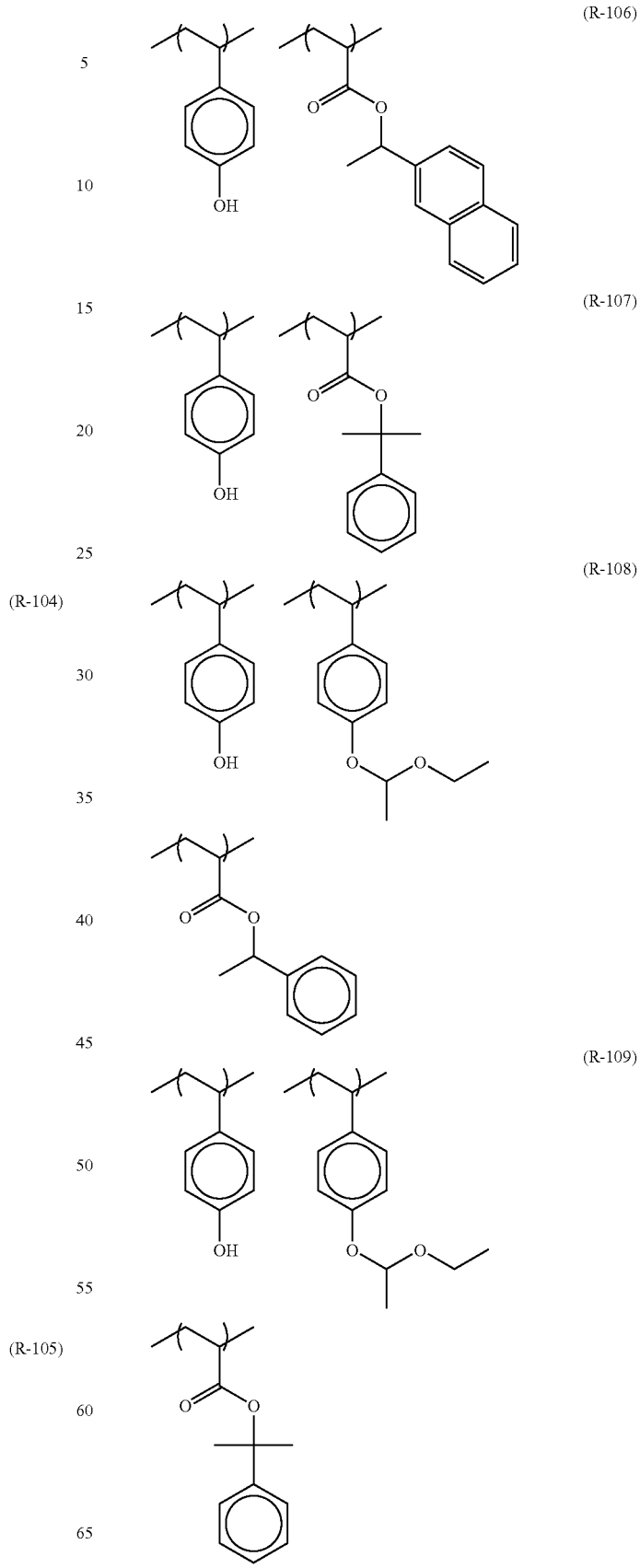

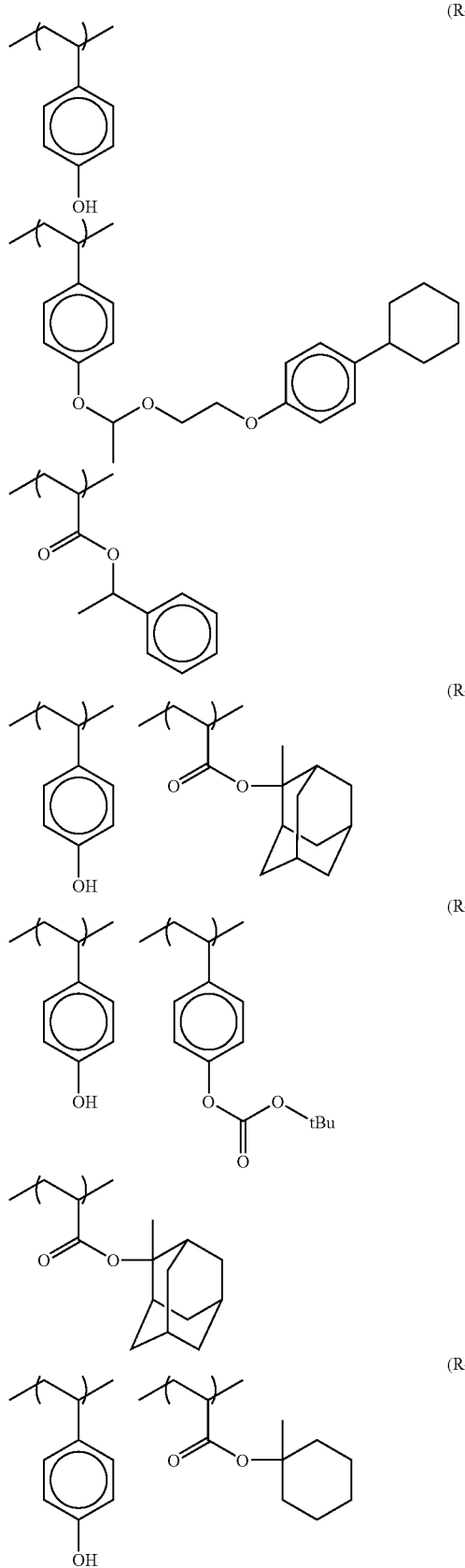

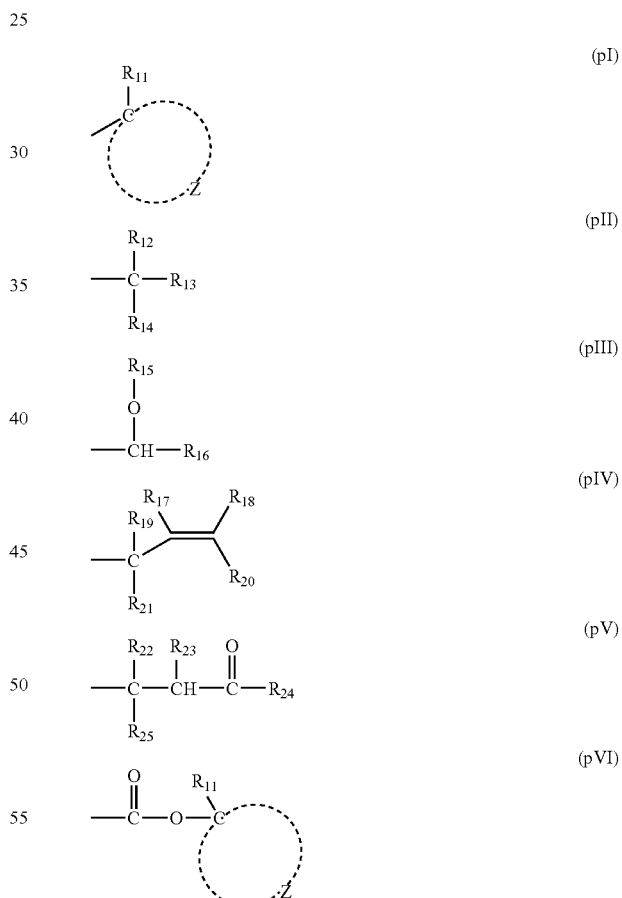

In these specific examples, "tBu" indicates a tert-butyl group.

The content of the group capable of decomposing under the action of an acid is expressed by B/(B+S) using the number (B) of acid-decomposable groups in the resin and the number (S) of alkali-soluble groups not protected by a group which desorbs by the effect of an acid. The content is preferably from 0.01 to 0.7, more preferably from 0.05 to 0.50, still more preferably from 0.05 to 0.40.

The resin as the component (B) may be a resin having a monocyclic or polycyclic alicyclic hydrocarbon structure and being decomposed under the action of an acid to increase the solubility in an alkali developer.

The resin having a monocyclic or polycyclic alicyclic hydrocarbon structure and being decomposed under the action of an acid to increase the solubility in an alkali developer (hereinafter sometimes referred to as an "alicyclic hydrocarbon-based acid-decomposable resin") is preferably a resin containing at least one repeating unit selected from the group consisting of a repeating unit having an alicyclic hydrocarbon-containing partial structure represented by any one of the following formulae (pI) to (pVI), and a repeating unit represented by the following formula (II-AB):

In formulae (pI) to (pVI), $R_{11}$ represents a methyl group, an ethyl group, an n-propyl group, an isopropyl group, an n-butyl group, an isobutyl group or a sec-butyl group, and Z represents an atomic group necessary for forming a cycloalkyl group together with the carbon atom.

$R_{12}$ to $R_{16}$ each independently represents a linear or branched alkyl group having a carbon number of 1 to 4 or a cycloalkyl group, provided that at least one of $R_{12}$ to $R_{14}$ or either one of $R_{15}$ and $R_{16}$ represents a cycloalkyl group.

$R_{17}$ to $R_{21}$ each independently represents a hydrogen atom, a linear or branched alkyl group having a carbon number of 1 to 4 or a cycloalkyl group, provided that at least one of $R_{17}$ to $R_{21}$ represents a cycloalkyl group and that either one of $R_{19}$ and $R_{21}$ represents a linear or branched alkyl group having a carbon number of 1 to 4 or a cycloalkyl group.

$R_{22}$ to $R_{25}$ each independently represents a hydrogen atom, a linear or branched alkyl group having a carbon number of 1 to 4 or a cycloalkyl group, provided that at least one of $R_{22}$ to $R_{25}$ represents a cycloalkyl group, and $R_{23}$ and $R_{24}$ may combine with each other to form a ring.

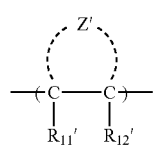

(II-AB)

In formula (II-AB), $R_{11}'$ and $R_{12}'$ each independently represents a hydrogen atom, a cyano group, a halogen atom or an alkyl group.

Z' represents an atomic group for forming an alicyclic structure including the two bonded carbon atoms (C—C).

Formula (II-AB) is preferably the following formula (II-A) or (II-B):

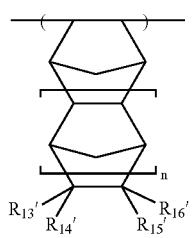

(II-A)

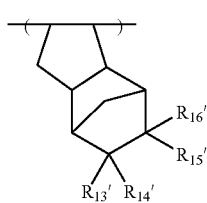

(II-B)

In formulae (II-A) and (II-B), $R_{13}'$ to $R_{16}'$ each independently represents a hydrogen atom, a halogen atom, a cyano group, —COOH, —COOR$_5$, a group capable of decomposing under the action of an acid, —C(=O)—X-A'-R$_{17}$', an alkyl group or a cycloalkyl group.

$R_5$ represents an alkyl group, a cycloalkyl group or a —Y group shown below.

X represents an oxygen atom, a sulfur atom, —NH—, —NHSO$_2$— or —NHSO$_2$NH—.

A' represents a sing bond or a divalent linking group.

At least two members out of $R_{13}'$ to $R_{16}'$ may combine to form a ring. n represents 0 or 1.

$R_{17}'$ represents —COOH, —COOR$_5$, —CN, a hydroxyl group, an alkoxy group, —CO—NH—R$_6$, —CO—NH—SO$_2$—R$_6$ or a —Y group shown below.

$R_6$ represents an alkyl group or a cycloalkyl group.

—Y Group:

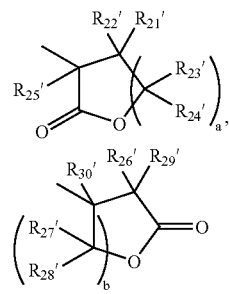

In the —Y group, $R_{21}'$ to $R_{30}'$ each independently represents a hydrogen atom or an alkyl group, and a and b each represents 1 or 2.

In formulae (pI) to (pVI), the alkyl group of $R_{12}$ to $R_{25}$ is a linear or branched alkyl group having a carbon number of 1 to 4, and examples of the alkyl group include a methyl group, an ethyl group, an n-propyl group, an isopropyl group, an n-butyl group, an isobutyl group, a sec-butyl group and a tert-butyl group.

Examples of the substituent which the alkyl group and alkoxy group above may further have include an alkoxy group having a carbon number of 1 to 4, a halogen atom (e.g., fluorine, chlorine, bromine, iodine), an acyl group, an acyloxy group, a cyano group, a hydroxyl group, a carboxy group, an alkoxycarbonyl group and a nitro group.

The cycloalkyl group of $R_{11}$ to $R_{25}$ and the cycloalkyl group formed by Z together with the carbon atom may be monocyclic or polycyclic. Specific examples thereof include a group having a monocyclo, bicyclo, tricyclo or tetracyclo structure with a carbon number of 5 or more. The carbon number thereof is preferably from 6 to 30, more preferably from 7 to 25. These cycloalkyl groups each may have a substituent.

Preferred examples of the cycloalkyl group include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. Among these, an adamantyl group, a decalin residue, a norbornyl group, a cedrol group, a cyclohexyl group, a cycloheptyl group, a cyclooctyl group, a cyclodecanyl group and a cyclododecanyl group are preferred.

Examples of the substituent of the cycloalkyl group include an alkyl group, a halogen atom, a hydroxyl group, an alkoxy group, a carboxyl group and an alkoxycarbonyl group. The alkyl group is preferably a lower alkyl group such as methyl group, ethyl group, propyl group, isopropyl group and butyl group, more preferably an alkyl group selected from the group consisting of a methyl group, an ethyl group, a propyl group or an isopropyl group. The alkoxy group includes an alkoxy group having a carbon number of 1 to 4, such as methoxy group, ethoxy group, propoxy group and butoxy group. Examples of the substituent which the alkyl group, alkoxy group and alkoxycarbonyl group above may further have include a hydroxyl group, a halogen atom and an alkoxy group.

The structures represented by formulae (pI) to (pVI) each can be used for the protection of an alkali-soluble group in the resin. Examples of the alkali-soluble group include various groups known in this technical field.

Specific examples thereof include a carboxylic acid group, a sulfonic acid group, a phenol group and a thiol group. Among these, a carboxylic acid group and a sulfonic acid group are preferred.

Preferred examples of the alkali-soluble group protected by the structure represented by any one of formulae (pI) to (pVI) in the resin include structures where a hydrogen atom of a carboxyl group is substituted by the structure represented by any one of formulae (pI) to (pVI).

The repeating unit having an alkali-soluble group protected by the structure represented by any one of formulae (pI) to (pVI) is preferably a repeating unit represented by the following formula (pA):

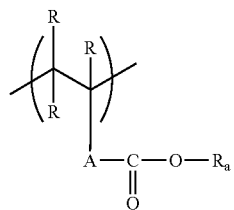

(pA)

In the formula, R represents a hydrogen atom, a halogen atom or a linear or branched alkyl group having a carbon number of 1 to 4, and a plurality of R's may be the same or different.

A represents a single bond, or a sole group or a combination of two or more groups, selected from the group consisting of an alkylene group, an ether group, a thioether group, a carbonyl group, an ester group, an amido group, a sulfonamido group, a urethane group and a urea group.

$R_a$ represents any one group of formulae (pI) to (pVI).

The repeating unit represented by formula (pA) is most preferably a repeating unit comprising a 2-alkyl-2-adamantyl (meth)acrylate or a dialkyl(1-adamantyl)methyl (meth)acrylate.

Specific examples of the repeating unit represented by formula (pA) are set forth below.

1
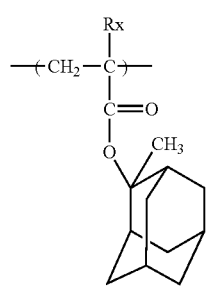

2
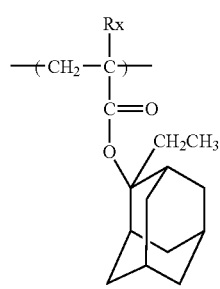

3
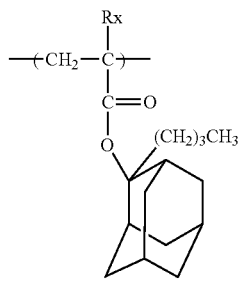

4
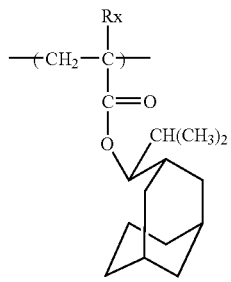

5
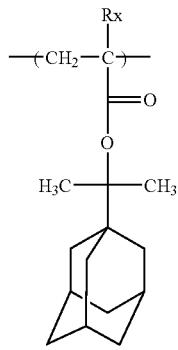

6
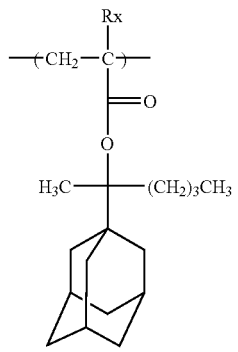

7
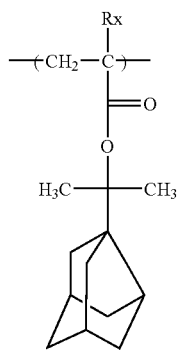

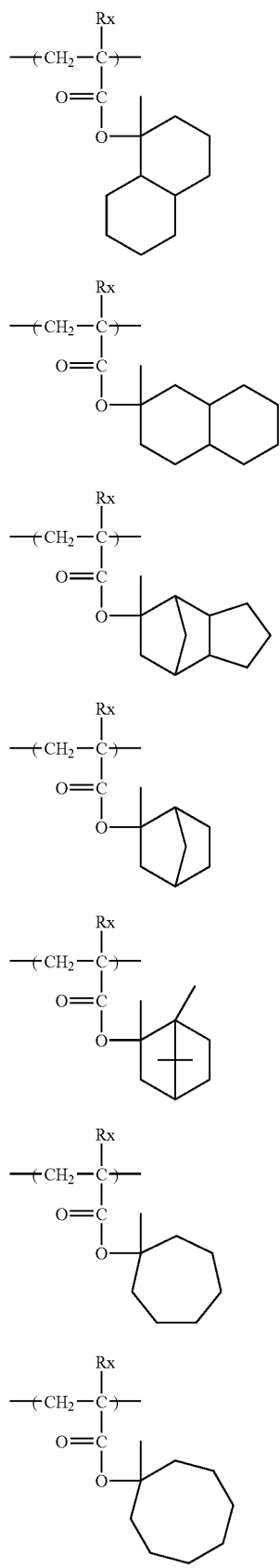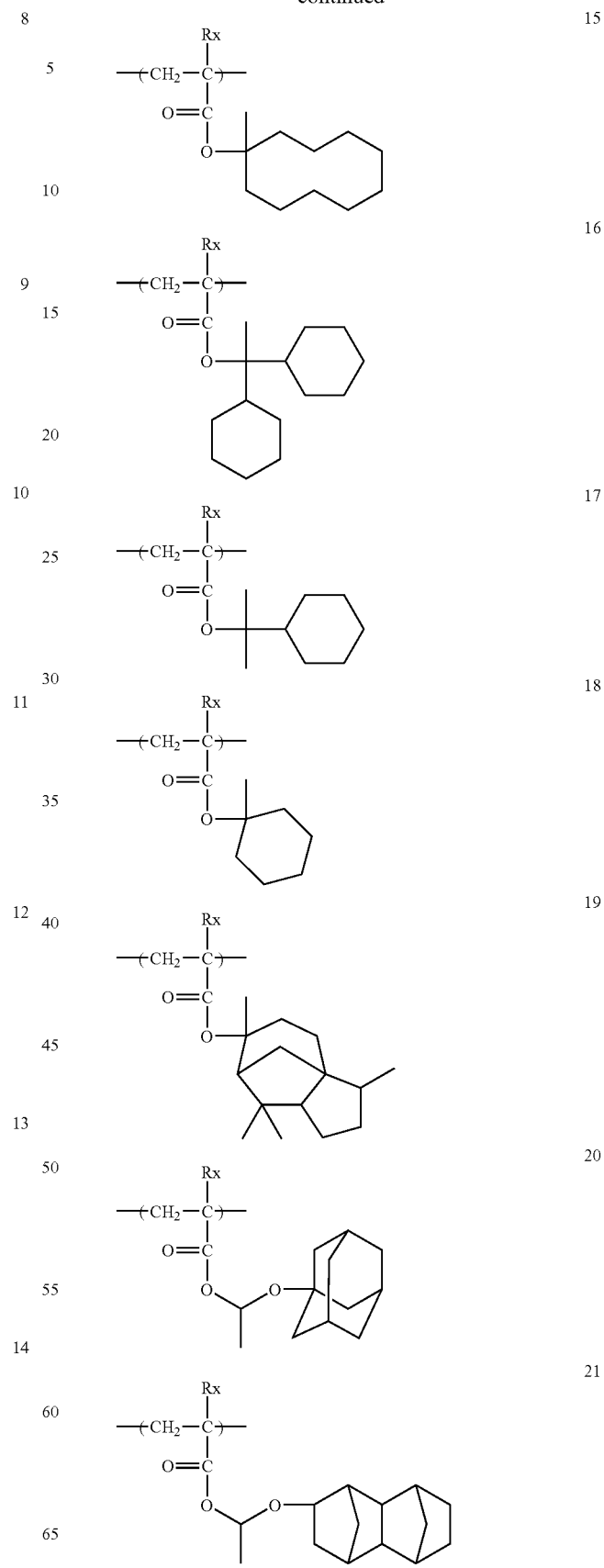

-continued

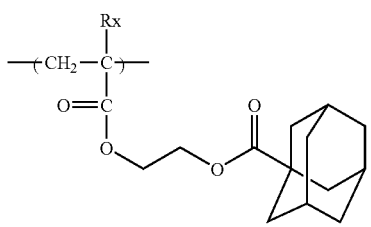
22

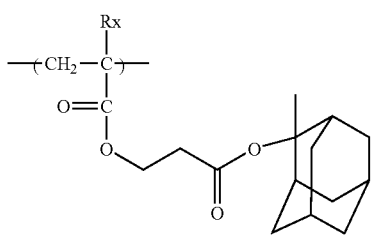
23

(In formulae, Rx is H, CH3 or CF3.)

In formula (II-AB), $R_{11}'$ and $R_{12}'$ each independently represents a hydrogen atom, a cyano group, a halogen atom or an alkyl group.

Z' represents an atomic group for forming an alicyclic structure including the two bonded carbon atoms (C—C).

Examples of the halogen atom of $R_{11}'$ and $R_{12}'$ include a chlorine atom, a bromine atom, a fluorine atom and an iodine atom.

The alkyl group of $R_{11}'$, $R_{12}'$ and $R_{21}'$ to $R_{30}'$ is preferably a linear or branched alkyl group having a carbon number of 1 to 10, more preferably a linear or branched alkyl group having a carbon number of 1 to 6, still more preferably a methyl group, an ethyl group, a propyl group, an isopropyl group, a n-butyl group, an isobutyl group, a sec-butyl group or a tert-butyl group.

Examples of the substituent which the alkyl group may further have include a hydroxyl group, a halogen atom, a carboxyl group, an alkoxy group, an acyl group, a cyano group and an acyloxy group. Examples of the halogen atom include a chlorine atom, a bromine atom, a fluorine atom and an iodine atom; examples of the alkoxy group include an alkoxy group having a carbon number of 1 to 4, such as methoxy group, ethoxy group, propoxy group and butoxy group; examples of the acyl group include a formyl group and an acetyl group; and examples of the acyloxy group include an acetoxy group.

The atomic group for forming an alicyclic structure, represented by Z', is an atomic group for forming a repeating unit of alicyclic hydrocarbon which may have a substituent, in the resin and among these atomic groups, an atomic group for forming a crosslinked alicyclic structure to form a crosslinked alicyclic hydrocarbon repeating unit is preferred.

Examples of the skeleton of the alicyclic hydrocarbon formed are the same as those of the alicyclic hydrocarbon group of $R_{11}$ to $R_{25}$ in formulae (pI) to (pVI).

The alicyclic hydrocarbon skeleton may have a substituent, and examples of the substituent include $R_{13}'$ to $R_{16}'$ in formulae (II-A) and (II-B).

Among the repeating units having a crosslinked alicyclic hydrocarbon, the repeating units represented by formulae (II-A) and (II-B) are more preferred.

In the alicyclic hydrocarbon-based acid-decomposable resin for use in the present invention, the acid-decomposable group may be contained in the —C(=O)—X-A'-$R_{17}$' or may be contained as a substituent of Z' in formula (II-AB).

The structure of the acid-decomposable group is represented by —C(=O)—$X_1$—$R_o$.

In this formula, $R_o$ represents a tertiary alkyl group such as tert-butyl group and tert-amyl group, an isoboronyl group, a 1-alkoxyethyl group such as 1-ethoxyethyl group, 1-butoxyethyl group, 1-isobutoxyethyl group and 1-cyclohexyloxyethyl group, an alkoxymethyl group such as 1-methoxymethyl group and 1-ethoxymethyl group, a 3-oxoalkyl group, a tetrahydropyranyl group, a tetrahydrofuranyl group, a trialkylsilylester group, a 3-oxocyclohexylester group, a 2-methyl-2-adamantyl group, a mevalonic lactone residue or the like, and $X_1$ has the same meaning as X above.

Examples of the halogen atom of $R_{13}'$ to $R_{16}'$ include a chlorine atom, a bromine atom, a fluorine atom and an iodine atom.

The alkyl group of $R_5$, $R_6$ and $R_{13}'$ to $R_{16}'$ is preferably a linear or branched alkyl group having a carbon number of 1 to 10, more preferably a linear or branched alkyl group having a carbon number of 1 to 6, still more preferably a methyl group, an ethyl group, a propyl group, an isopropyl group, a n-butyl group, an isobutyl group, a sec-butyl group or a tert-butyl group.

The cycloalkyl group of $R_5$, $R_6$ and $R_{13}'$ to $R_{16}'$ is, for example, a monocyclic alkyl group or a crosslinked hydrocarbon, and examples thereof include a cyclopropyl group, a cyclopentyl group, a cyclohexyl group, an adamantyl group, a 2-methyl-2-adamantyl group, a norbornyl group, a boronyl group, an isoboronyl group, a tricyclodecanyl group, a dicyclopentenyl group, a norbornane epoxy group, a menthyl group, an isomenthyl group, a neomenthyl group and a tetracyclododecanyl group.

The ring formed resulting from at least two members out of $R_{13}'$ to $R_{16}'$ being combined includes a ring having a carbon number of 5 to 12, such as cyclopentene, cyclohexene, cycloheptane and cyclooctane.

The alkoxy group of $R_{17}'$ includes an alkoxy group having a carbon number of 1 to 4, such as methoxy group, ethoxy group, propoxy group and butoxy group.

Examples of the substituent which the alkyl group, cycloalkyl group and alkoxy group may further have include a hydroxyl group, a halogen atom, a carboxyl group, an alkoxy group, an acyl group, a cyano group, an acyloxy group, an alkyl group and a cycloalkyl group. Examples of the halogen atom include a chlorine atom, a bromine atom, a fluorine atom and an iodine atom; examples of the alkoxy group include an alkoxy group having a carbon number of 1 to 4, such as methoxy group, ethoxy group, propoxy group and butoxy group; examples of the acyl group include a formyl group and an acetyl group; and examples of the acyloxy group include an acetoxy group.

Examples of the alkyl group and cyclic hydrocarbon group include those described above.

The divalent linking group of A' includes a sole group or a combination of two or more groups, selected from the group consisting of an alkylene group, an ether group, a thioether group, a carbonyl group, an ester group, an amido group, a sulfonamido group, a urethane group and a urea group.

In the alicyclic hydrocarbon-based acid-decomposable resin for use in the present invention, the group capable of decomposing under the action of an acid may be contained in at least one repeating unit out of the repeating unit having an alicyclic hydrocarbon-containing partial structure represented by any one of formulae (PI) to (pVI), the repeating unit represented by formula (II-AB), and the repeating unit of a copolymerization component which is described later.

Various substituents $R_{13}'$ to $R_{16}'$ in formulae (II-A) and (II-B) may become the substituents of an atomic group for forming an alicyclic structure in formula (II-AB) or an atomic group Z for forming a crosslinked alicyclic structure.

Specific examples of the repeating units represented by formulae (II-A) and (II-B) are set forth below, but the present invention is not limited to these specific examples.

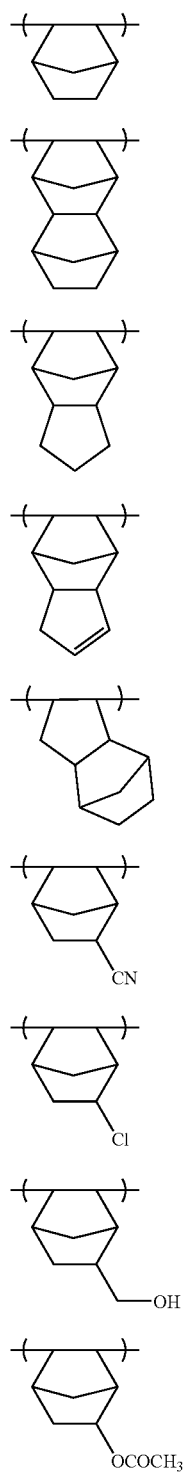

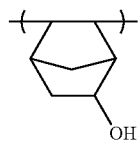
[II-10]

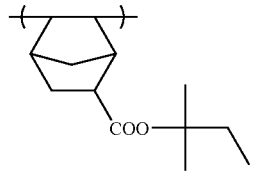
[II-11]

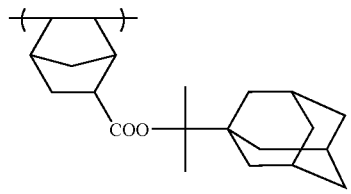
[II-12]

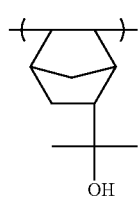
[II-13]

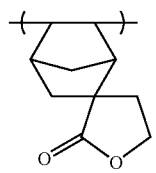
[II-14]

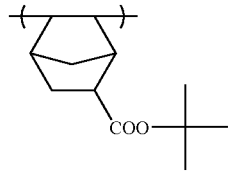
[II-15]

[II-16]

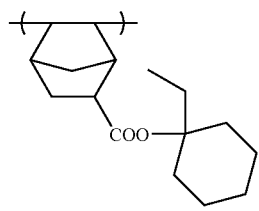
[II-17]

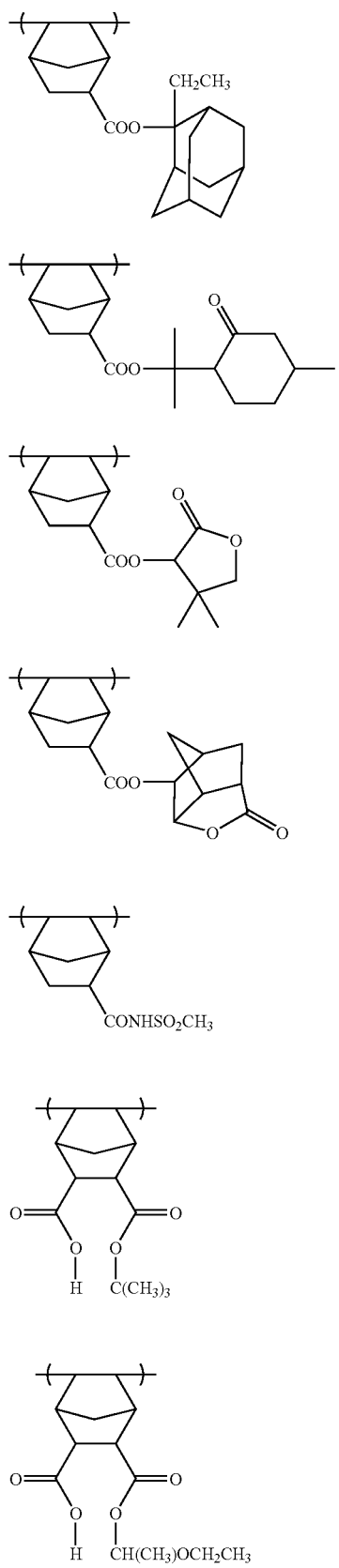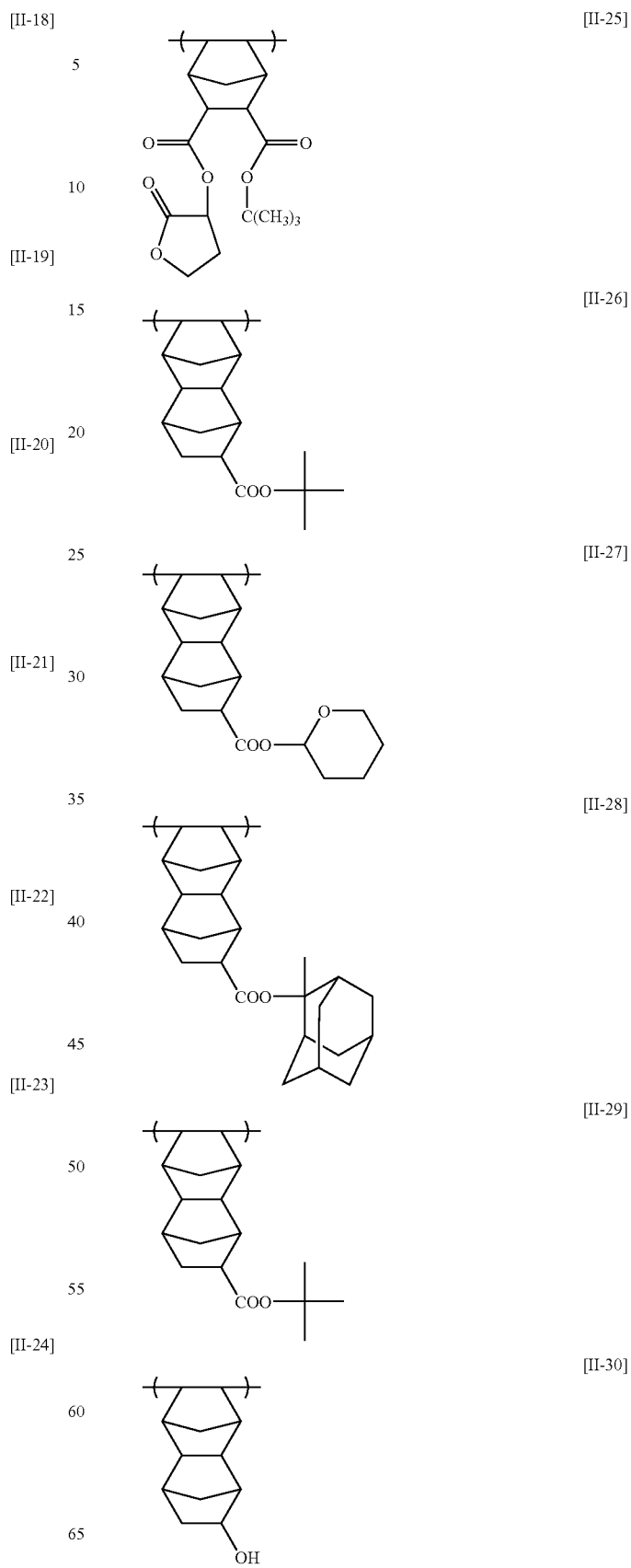

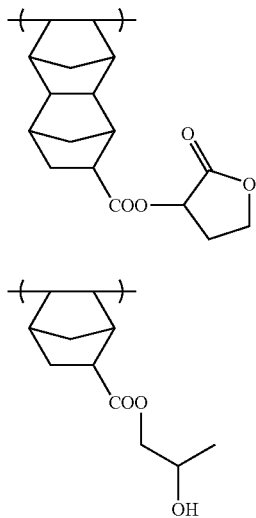

The alicyclic hydrocarbon-based acid-decomposable resin of the present invention preferably contains a lactone group, more preferably a repeating unit containing a group having a lactone structure represented by the following formula (Lc) or by any one of the following formulae (V-1) to (V-5). Also, the group having a lactone structure may be bonded directly to the main chain.

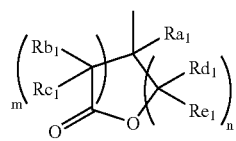

(Lc)

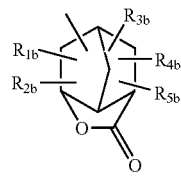

(V-1)

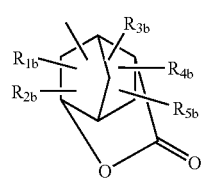

(V-2)

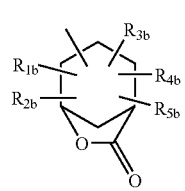

(V-3)

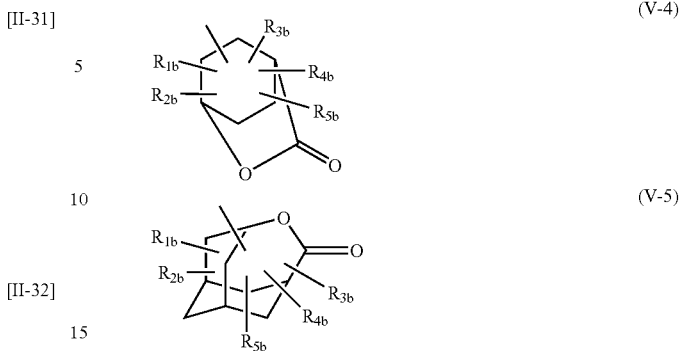

In formula (Lc), $Ra_1$, $Rb_1$, $Rc_1$, $Rd_1$ and $Re_1$, each independently represents a hydrogen atom or an alkyl group, m and n each independently represents an integer of 0 to 3, and m+n is from 2 to 6.

In formulae (V-1) to (V-5), $R_{1b}$ to $R_{5b}$ each independently represents a hydrogen atom, an alkyl group, a cycloalkyl group, an alkoxy group, an alkoxycarbonyl group, an alkylsulfonylimino group or an alkenyl group, and two members out of $R_{1b}$ to $R_{5b}$ may combine to form a ring.

The alkyl group of $Ra_1$ to $Re_1$ in formula (Lc) and the alkyl group in the alkyl group, alkoxy group, alkoxycarbonyl group and alkylsulfonylimino group of $R_{1b}$ to $R_{5b}$ in formulae (V-1) to (V-5) include a linear or branched alkyl group and may have a substituent. Preferred examples of the substituent which the alkyl group may have include a hydroxyl group, a halogen atom, a carboxyl group, an alkoxy group, an acyl group, a cyano group, an acyloxy group and a cycloalkyl group.

Examples of the repeating unit containing a group having a lactone structure represented by formula (Lc) or by any one of formulae (V-1) to (V-5) include a repeating unit where at least one of $R_{13}'$ to $R_{16}'$ in formula (II-A) or (II-B) has a group represented by formula (Lc) or by any one of formulae (V-1) to (V-5) (for example, when $R_5$ of —$COOR_5$ is a group represented by formula (Lc) or by any one of formulae (V-1) to (V-5)), and a repeating unit represented by the following formula (AI):

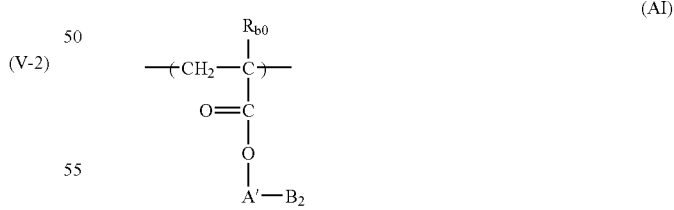

In formula (AI), $R_{b0}$ represents a hydrogen atom, a halogen atom or an alkyl group having a carbon number of 1 to 4. Preferred examples of the substituent which the alkyl group of $R_{b0}$ may have include those described above as preferred examples of the substituent which the alkyl group of $R_{1b}$ in formulae (V-1) to (V-5) may have.

Examples of the halogen atom of $R_{b0}$ include a fluorine atom, a chlorine atom, a bromine atom and an iodine atom. $R_{b0}$ is preferably a hydrogen atom.

A' represents a single bond, an ether group, an ester group, a carbonyl group, an alkylene group or a divalent group comprising a combination thereof B₂ represents a group represented by formula (Lc) or by any one of formulae (V-1) to (V-5).

Specific examples of the repeating unit containing a group having a lactone structure are set forth below, but the present invention is not limited thereto.

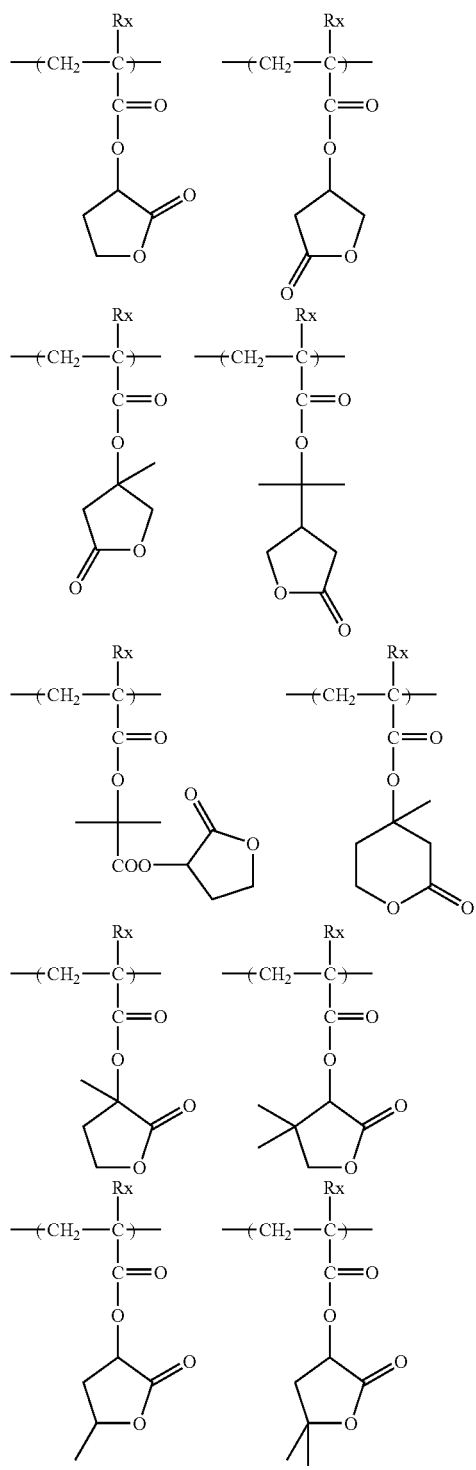
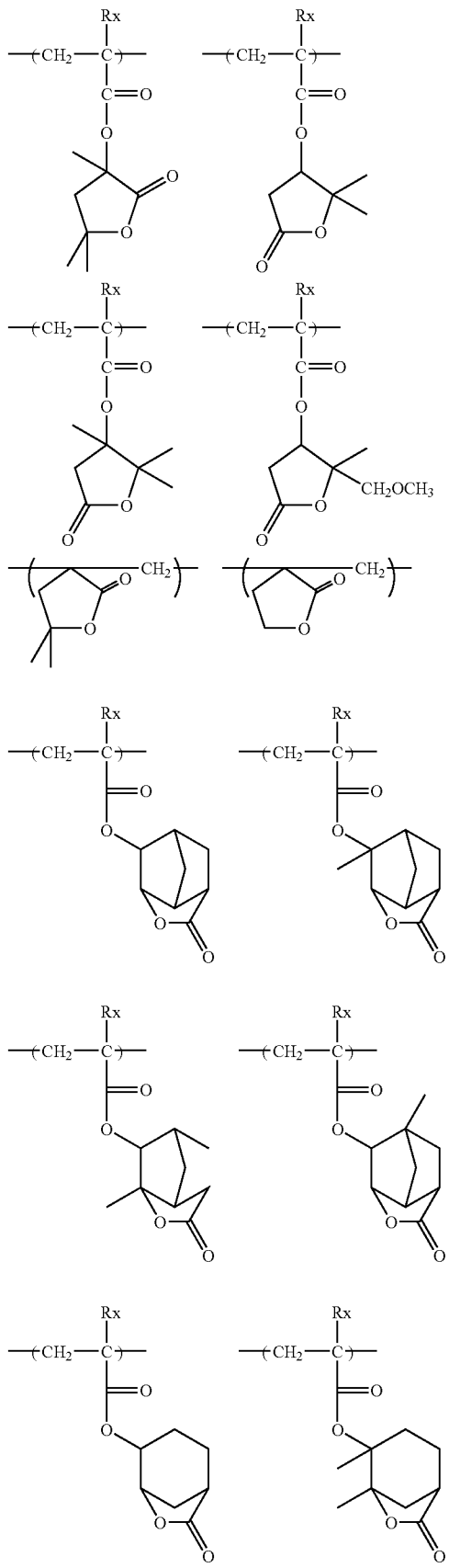

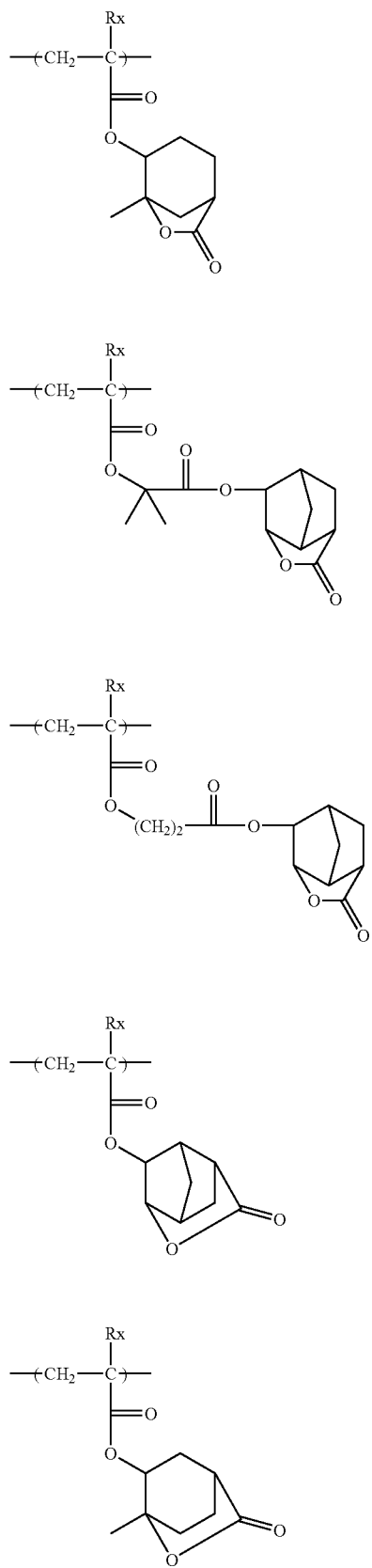
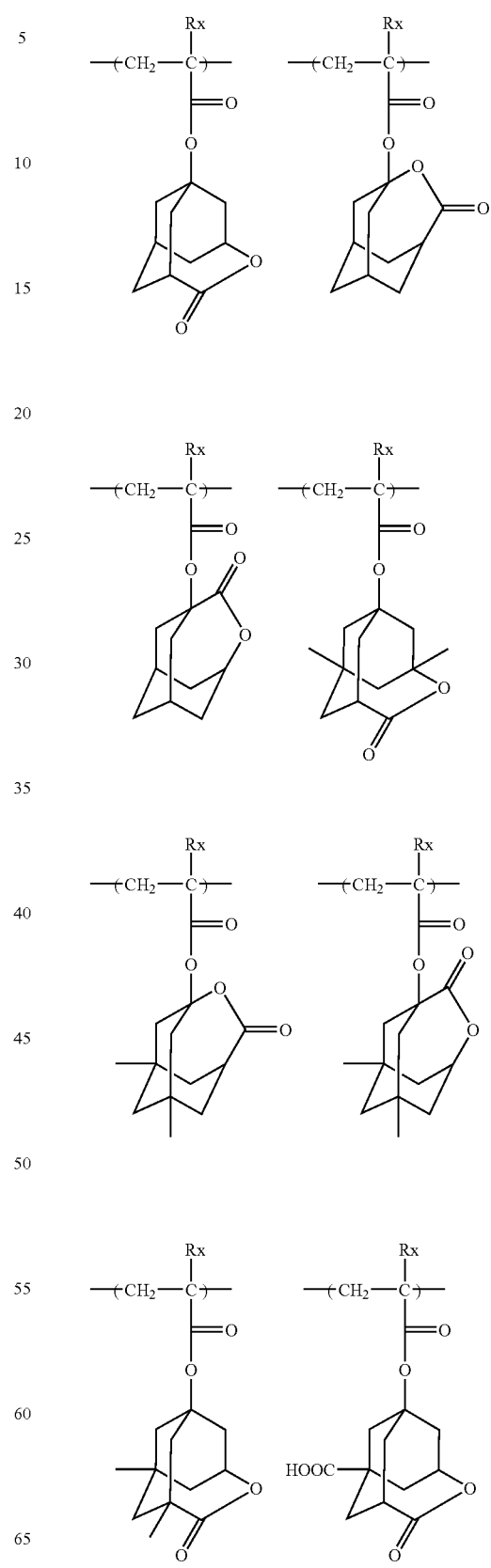

-continued

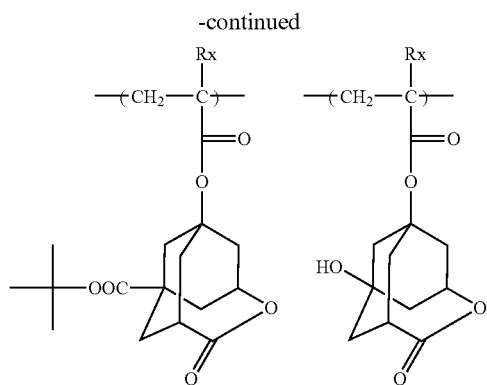

(In formulae, Rx is H, CH₃ or CF₃.)

The alicyclic hydrocarbon-based acid-decomposable resin for use in the present invention may have a repeating unit containing a group having an adamantane structure, represented by the following formula (VII):

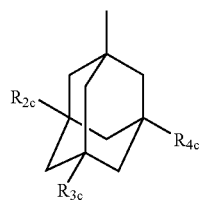

(VII)

In formula (VII), $R_{2c}$ to $R_{4c}$ each independently represents a hydrogen atom or a hydroxyl group, provided that at least one of $R_{2c}$ to $R_{4c}$ represents a hydroxyl group.

The group represented by formula (VII) is preferably a dihydroxy form or a monohydroxy form, more preferably a dihydroxy form.

Examples of the repeating unit having a group represented by formula (VII) include a repeating unit where at least one of $R_{13}'$ to $R_{16}'$ in formula (II-A) or (II-B) has a group represented by formula (VII) (for example, when $R_5$ in —COOR₅ is a group represented by formula (VII)), and a repeating unit represented by the following formula (AII):

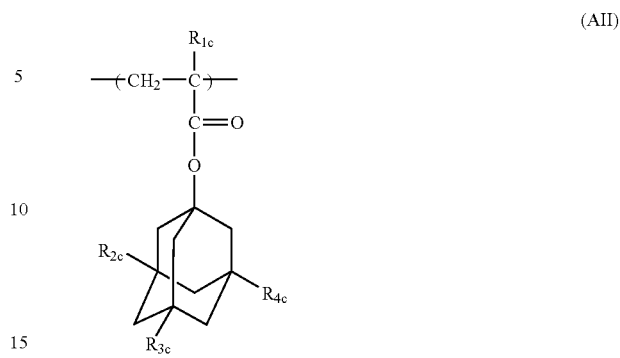

In formula (AII), $R_{1c}$ represents a hydrogen atom or a methyl group.

$R_{2c}$ to $R_{4c}$ each independently represents a hydrogen atom or a hydroxyl group, provided that at least one of $R_{2c}$ to $R_{4c}$ represents a hydroxyl group. A repeating unit where two members out of $R_{2c}$ to $R_{4c}$ are a hydroxyl group is preferred.

Specific examples of the repeating unit having the structure represented by formula (AII) are set forth below, but the present invention is not limited thereto.

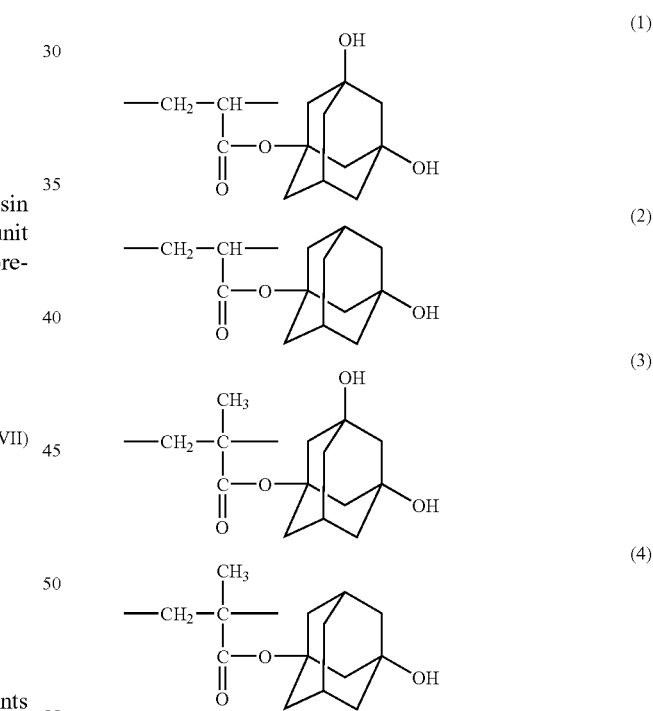

The alicyclic hydrocarbon-based acid-decomposable resin for use in the present invention may contain a repeating unit represented by the following formula (VIII):

(VIII)

In formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group or a camphor residue. The alkyl group of $R_{41}$ and $R_{42}$ may be substituted by a halogen atom (preferably a fluorine atom) or the like.

Specific examples of the repeating unit represented by formula (VIII) are set forth below, but the present invention is not limited thereto.

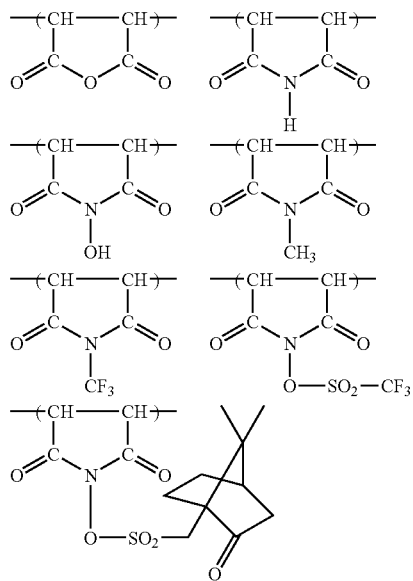

The alicyclic hydrocarbon-based acid-decomposable resin for use in the present invention preferably contains a repeating unit having an alkali-soluble group, more preferably a repeating unit having a carboxyl group. By virtue of containing such a repeating unit, the resolution increases in usage of forming contact holes. As for the repeating unit having a carboxyl group, a repeating unit where a carboxyl group is directly bonded to the resin main chain, such as repeating unit by an acrylic acid or a methacrylic acid, and a repeating unit where a carboxyl group is bonded to the resin main chain through a linking group, both are preferred. The linking group may have a monocyclic or polycyclic hydrocarbon structure. An acrylic acid and a methacrylic acid are most preferred.

The alicyclic hydrocarbon-based acid-decomposable resin for use in the present invention may contain, in addition to the above-described repeating units, various repeating structural units for the purpose of controlling the dry etching resistance, suitability for standard developer, adhesion to substrate, resist profile and properties generally required of the resist, such as resolving power, heat resistance and sensitivity.

Examples of such repeating structural units include repeating structural units corresponding to the monomers described below, but the present invention is not limited thereto.

By containing these repeating structural units, the performances required of the alicyclic hydrocarbon-based acid-decomposable resin, particularly, (1) solubility in the coating solvent, (2) film-forming property (glass transition point), (3) alkali developability, (4) film loss (selection of hydrophilic, hydrophobic or alkali-soluble group), (5) adhesion of unexposed area to substrate, (6) dry etching resistance and the like, can be subtly controlled.

Examples of the monomer include compounds having one addition polymerizable unsaturated bond, selected from acrylic acid esters, methacrylic acid esters, acrylamides, methacrylamides, allyl compounds, vinyl ethers and vinyl esters.

Other than these, an addition polymerizable unsaturated compound copolymerizable with the monomer corresponding to the above-described various repeating structural units may be copolymerized.

In the alicyclic hydrocarbon-based acid-decomposable resin, the molar ratio of each repeating structural unit contained is appropriately determined to control the dry etching resistance of resist, suitability for standard developer, adhesion to substrate, resist profile and performances generally required of the resist, such as resolving power, heat resistance and sensitivity.

Preferred embodiments of the alicyclic hydrocarbon-based acid-decomposable resin for use in the present invention include:

(1) a resin containing a repeating unit having an alicyclic hydrocarbon-containing partial structure represented by any one of formulae (pI) to (pVI) (side chain type), and (2) a resin containing a repeating unit represented by formula (II-AB) (main chain type).

The resin of (2) further includes, for example, (3) a resin having a repeating unit represented by formula (II-AB), a maleic anhydride derivative and a (meth)acrylate structure (hybrid type).

In the alicyclic hydrocarbon-based acid-decomposable resin, the content of the repeating unit having an acid-decomposable group is preferably from 10 to 60 mol %, more preferably from 20 to 50 mol %, still more preferably from 25 to 40 mol %, based on all repeating structural units.

In the present invention, at least one methacrylic acid ester repeating unit and at least one acrylic acid ester repeating unit are preferably contained as the repeating unit having an acid-decomposable group. The molar ratio of the acrylic acid ester and the methacrylic acid ester is generally from 10/90 to 90/10, preferably from 20/80 to 80/20, still more preferably from 30/70 to 70/30, and most preferably from 40/60 to 60/40.

In the alicyclic hydrocarbon-based acid-decomposable resin, the content of the repeating unit having an alicyclic hydrocarbon-containing partial structure represented by any one of formulae (pI) to (pVT) is preferably from 30 to 70 mol %, more preferably from 35 to 65 mol %, still more preferably from 40 to 60 mol %, based on all repeating structural units.

In the alicyclic hydrocarbon-based acid-decomposable resin, the content of the repeating unit represented by formula (II-AB) is preferably from 10 to 60 mol %, more preferably from 15 to 55 mol %, still more preferably from 20 to 50 mol %, based on all repeating structural units.

In the resin, the content of the repeating structural unit based on the monomer as the further copolymerization component can also be appropriately selected according to the desired resist performance but in general, the content thereof is preferably 99 mol % or less, more preferably 90 mol % or less, still more preferably 80 mol % or less, based on the total molar number of the repeating structural unit having an alicyclic hydrocarbon-containing partial structure represented by any one of formulae (pI) to (pVT) and the repeating unit represented by formula (II-AB).

The alicyclic hydrocarbon-based acid-decomposable resin for use in the present invention can be synthesized by an ordinary method (for example, radical polymerization). For example, in a general synthesis method, the monomer species are charged into a reaction vessel en bloc or in the course of reaction and dissolved, if desired, in a reaction solvent such as tetrahydrofuran, 1,4-dioxane, ethers (e.g., diisopropyl ether) and ketones (e.g., methyl ethyl ketone, methyl isobutyl ketone), an ester solvent such as ethyl acetate, or a solvent capable of dissolving the composition of the present invention, such as propylene glycol monomethyl ether acetate described later, to prepare a uniform solution, and the polymerization is then initiated using a commercially available radical initiator (e.g., azo-based initiator, peroxide) in an inert gas atmosphere such as nitrogen or argon under heating, if desired. The initiator is added additionally or in parts, if desired. After the completion of reaction, the reactant is charged into a solvent, and the desired polymer is recovered by a method such as powder or solid recovery. The reaction concentration is 20 mass % or more, preferably 30 mass % or more, still more preferably 40 mass % or more, and the reaction temperature is from 10 to 150° C., preferably from 30 to 120° C., more preferably from 50 to 100° C. (In this specification, mass ratio is equal to weight ratio.)

In the photosensitive composition of the present invention, it is usually preferred that the component B has an acid-decomposable group having a carbon number of 4 or more, more preferably 10 or more, still more preferably 12 or more.

As for the compound of the component (B), one kind may be used alone or two or more kinds may be used in combination.

[2] (Z) Compound containing a sulfonium cation having a structure represented by formula (Z-I) (hereinafter sometimes referred to as the "compound (Z)" or "component (Z)")

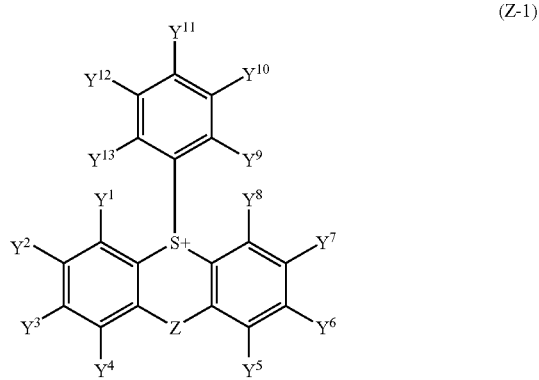

(Z-I)

In formula (Z-I), $Y^1$ to $Y^{13}$ each independently represents a hydrogen atom or a substituent, and adjacent members may combine with each other to form a ring.

Z represents a single bond or a divalent linking group.

The substituent represented by $Y^1$ to $Y^{13}$ in formula (Z-I) is not particularly limited and may be any substituent, but examples thereof include a halogen atom, an alkyl group, a cycloalkyl group (including a bicycloalkyl group and a tricycloalkyl group), an alkenyl group (including a cycloalkenyl group and a bicycloalkenyl group), an alkynyl group, an aryl group, a heterocyclic group (may be called a hetero-ring group), a cyano group, a hydroxyl group, a nitro group, a carboxyl group, an alkoxy group (including a cycloalkoxy group), an aryloxy group, a silyloxy group, a heterocyclic oxy group, an acyloxy group, a carbamoyloxy group, an alkoxycarbonyloxy group (including a cycloalkoxycarbonyloxy group), an aryloxycarbonyloxy group, an amino group (including an anilino group), an ammonio group, an acylamino group, an aminocarbonylamino group, an alkoxycarbonylamino group (including a cycloalkoxycarbonylamino group), an aryloxycarbonylamino group, a sulfamoylamino group, an alkyl-, cycloalkyl- or aryl-sulfonylamino group, a mercapto group, an alkylthio group (including a cycloalkylthio group), an arylthio group, a heterocyclic thio group, a sulfamoyl group, a sulfo group, an alkyl-, cycloalkyl- or aryl-sulfinyl group, an alkyl-, cycloalkyl- or aryl-sulfonyl group, an acyl group, an aryloxycarbonyl group, an alkoxycarbonyl group (including a cycloalkoxycarbonyl group), a carbamoyl group, an aryl or heterocyclic azo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H) and other known substituents.

As the additional substituents which these groups may have, an alcoholic hydroxyl group is preferred.

$Y^1$ to $Y^{13}$ each is preferably a hydrogen atom, a halogen atom, an alkyl group, a cycloalkyl group (including a bicycloalkyl group and a tricycloalkyl group), an alkenyl group (including a cycloalkenyl group and a bicycloalkenyl group), an alkynyl group, an aryl group, a cyano group, a hydroxyl group, a carboxyl group, an alkoxy group (including a cycloalkoxy group), an aryloxy group, an acyloxy group, a carbamoyloxy group, an acylamino group, an aminocarbonylamino group, an alkoxycarbonylamino group (including a cycloalkoxycarbonylamino group), an aryloxycarbonylamino group, a sulfamoylamino group, an alkyl-, cycloalkyl- or aryl-sulfonylamino group, an alkylthio group (including a cycloalkylthio group), an arylthio group, a sulfamoyl group, an alkyl-, cycloalkyl- or aryl-sulfonyl group, an aryloxycarbonyl group, an alkoxycarbonyl group (including a cycloalkoxycarbonyl group), a carbamoyl group, an imido group, a silyl group or a ureido group.

$Y^1$ to $Y^{13}$ each is more preferably a hydrogen atom, a halogen atom, an alkyl group, a cycloalkyl group (including a bicycloalkyl group and a tricycloalkyl group), a cyano group, a hydroxyl group, an alkoxy group (including a cycloalkoxy group), an acyloxy group, an acylamino group, an aminocarbonylamino group, an alkoxycarbonylamino group (including a cycloalkoxycarbonylamino group), an alkyl-, cycloalkyl- or aryl-sulfonylamino group, an alkylthio group (including a cycloalkylthio group), a sulfamoyl group, an alkyl-, cycloalkyl- or aryl-sulfonyl group, an alkoxycarbonyl group (including a cycloalkoxycarbonyl group) or a carbamoyl group.

$Y^1$ to $Y^{13}$ each is still more preferably a hydrogen atom, an alkyl group, a cycloalkyl group (including a bicycloalkyl group and a tricycloalkyl group), a cyano group, a hydroxyl group, an alkoxy group (including a cycloalkoxy group) or an alkylsulfonyl group.

The ring formed resulting from adjacent members out of $Y^1$ to $Y^{13}$ combining with each other includes an aromatic or non-aromatic hydrocarbon ring, a heterocyclic ring, and a polycyclic condensed ring formed by further combining these rings. Examples thereof include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring and a phenazine ring.

Examples of the divalent linking group of Z include an alkylene group, an arylene group, an ether group, a thioether group, an amino group, —CH=CH—, —C≡C—, a carbonyl group, a sulfide group, a sulfone group, a sulfoxide group, —COO—, —CONH—, —SO$_2$NH—, —CF$_2$—, —CF$_2$CF$_2$—, —OCF$_2$O—, —CF$_2$OCF$_2$—, —SS—, —CH$_2$SO$_2$CH$_2$—, —CH$_2$COCH$_2$—, —COCF$_2$CO—, —COCO—, —OCOO— and —OSO$_2$O—.

Z is preferably a single bond, an alkylene group (preferably a methylene group), an ether group, a thioether group, a carbonyl group, a sulfide group, a sulfone group, —COO—, —CONH—, —SO$_2$NH—, —CF$_2$—, —CF$_2$CF$_2$— or —COCO—, more preferably a single bond, an ether group, a thioether group, a carbonyl group, a sulfide group or a sulfone group, still more preferably a single bond or a sulfone group.

The compound as the component (Z) has a counter anion. The counter anion is preferably an organic anion. The organic anion indicates an anion having at least one carbon atom. The organic anion is preferably a non-nucleophilic anion. The non-nucleophilic anion is an anion having an extremely low ability of causing a nucleophilic reaction, and this anion can suppress the decomposition in aging due to intramolecular nucleophilic reaction.

Examples of the non-nucleophilic anion include a sulfonate anion, a carboxylate anion, a sulfonylimide anion, a bis(alkylsulfonyl)imide anion and a tris(alkylsulfonyl)methyl amon.

Examples of the non-nucleophilic sulfonate anion include an aliphatic sulfonate anion, an aromatic sulfonate anion and a camphorsulfonate anion. Examples of the non-nucleophilic carboxylate anion include an aliphatic carboxylate anion, an aromatic carboxylate anion and an aralkylcarboxylate anion.

The aliphatic moiety in the aliphatic sulfonate anion may be an alkyl group or a cycloalkyl group and is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a boronyl group.

The aromatic group in the aromatic sulfonate anion is preferably an aryl group having a carbon number of 6 to 14, and examples thereof include a phenyl group, a tolyl group and a naphthyl group.

Examples of the substituent for the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 5), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), and an alkoxycarbonyloxy group (preferably having a carbon number of 2 to 7). As for the aryl group or ring structure in each group, examples of the substituent further include an alkyl group (preferably having a carbon number of 1 to 15).

Examples of the aliphatic moiety in the aliphatic carboxylate anion include the same alkyl group and cycloalkyl group as those in the aliphatic sulfonate anion.

Examples of the aromatic group in the aromatic carboxylate anion include the same aryl group as those in the aromatic sulfonate anion.

The aralkyl group in the aralkylcarboxylate anion is preferably an aralkyl group having a carbon number of 6 to 12, and examples thereof include a benzyl group, a phenethyl group, a naphthylmethyl group and a naphthylethyl group.

Examples of the substituent for the alkyl group, cycloalkyl group, aryl group and aralkyl group in the aliphatic carboxylate anion, aromatic carboxylate anion and aralkylcarboxylate anion include the same halogen atom, alkyl group, cycloalkyl group, alkoxy group and alkylthio group as those in the aromatic sulfonate anion.

Examples of the sulfonylimide anion include a saccharine anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent for this alkyl group include a halogen atom, an alkyl group substituted by a halogen atom, an alkoxy group and an alkylthio group.

Other examples of the non-nucleophilic anion include fluorinated phosphorus, fluorinated boron, and fluorinated antimony.

The counter anion of the compound as the component (Z) is preferably a sulfonate anion, more preferably an aromatic sulfonate anion.

Specific preferred examples of the counter anion include methanesulfonate anion, trifluoromethanesulfonate anion, pentafluoroethanesulfonate anion, heptafluoro-propanesulfonate anion, perfluorobutanesulfonate anion, perfluorohexanesulfonate anion, perfluorooctanesulfonate anion, pentafluorobenzenesulfonate anion, 3,5-bistrifluoromethylbenzenesulfonate anion, 2,4,6-triisopropylbenzenesulfonate anion, perfluoroethoxyethanesulfonate anion, 2,3,5,6-tetrafluoro-4-dodecyloxybenzenesulfonate anion, p-toluenesulfonate anion, pentafluorobenzenesulfonate anion, and camphorsulfonate anion.

The counter anion present together with the sulfonium cation represented by formula (Z-I) in the compound as the component (Z) may be monovalent or may be divalent or more. In the case where the counter anion is divalent or more, the compound as the component (Z) may have two or more sulfonium cations represented by formula (Z-I).

The content of the compound as the component (Z) is preferably from 0.1 to 20 mass %, more preferably from 0.5 to 10 mass %, still more preferably from 1 to 7 mass %, based on the entire solid content of the positive resist composition.

The compound as the component (Z) is an acid generator capable of generating an acid upon irradiation with actinic rays or radiation.

One species of the compound as the component (Z) may be used alone, or two or more species thereof may be used in combination.

Specific examples of the sulfonium salt (Z) represented by formula (Z-I) are set forth below, but the present invention is not limited thereto.

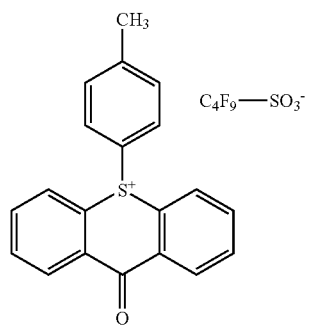 (Z-1)
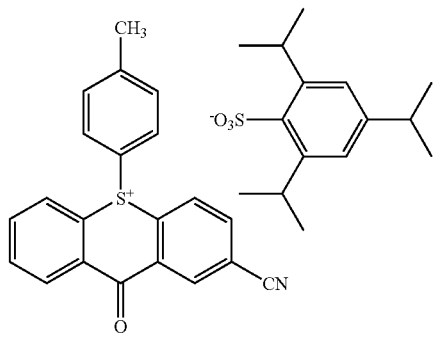 (Z-5)
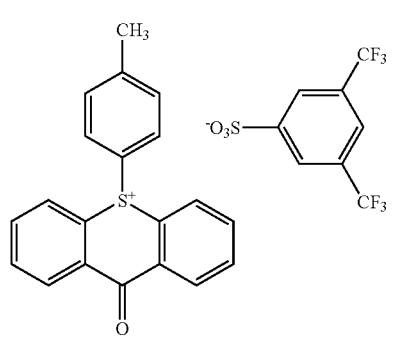 (Z-2)
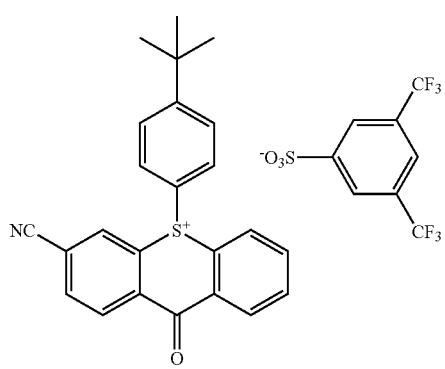 (Z-6)
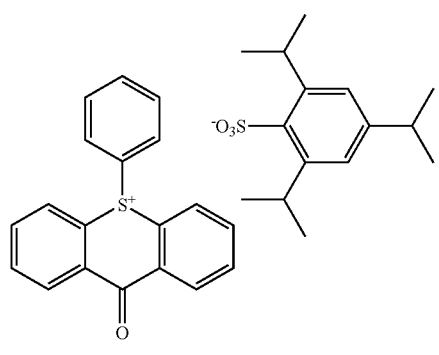 (Z-3)
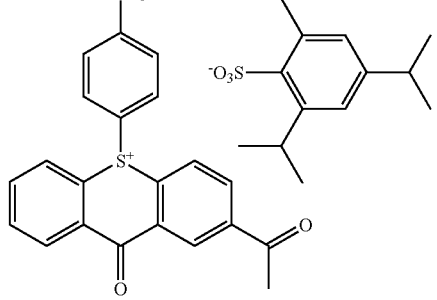 (Z-7)
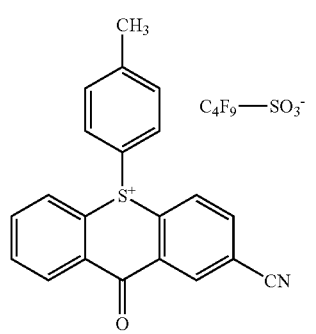 (Z-4)
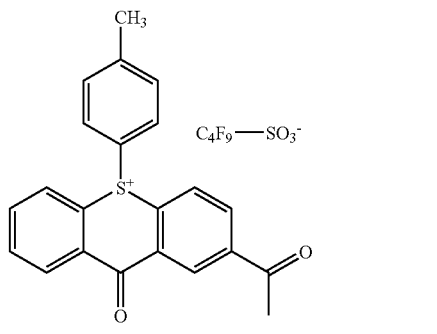 (Z-8)

(Z-9) 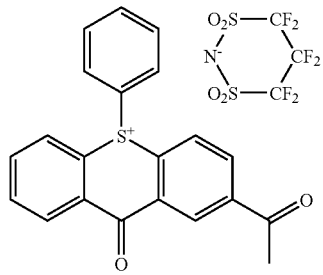
(Z-10) 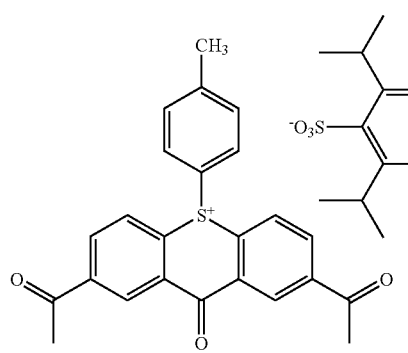
(Z-11) 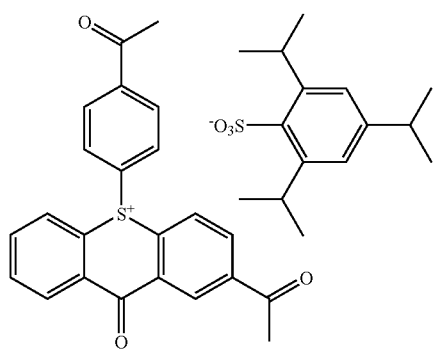
(Z-12) 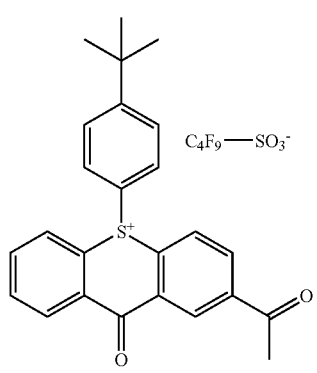
(Z-13) (Z-14) (Z-15) (Z-16) 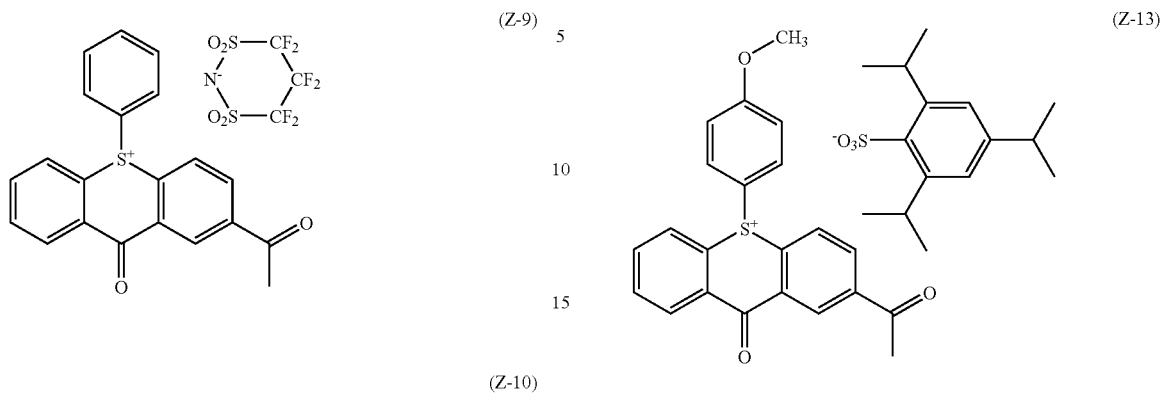 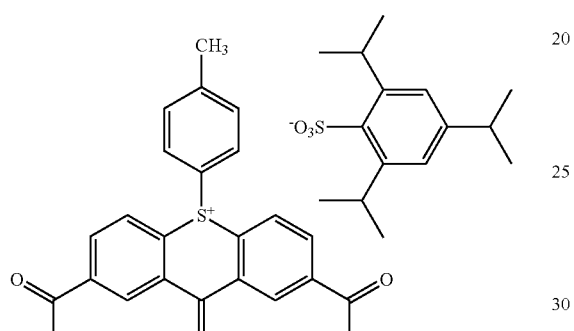 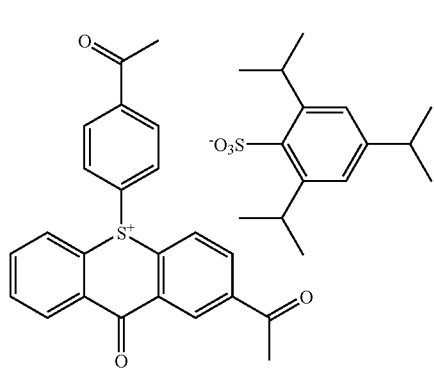 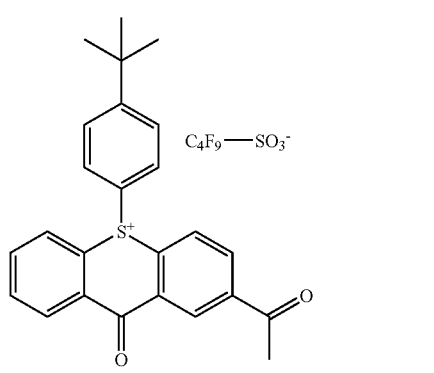

-continued
(Z-17)
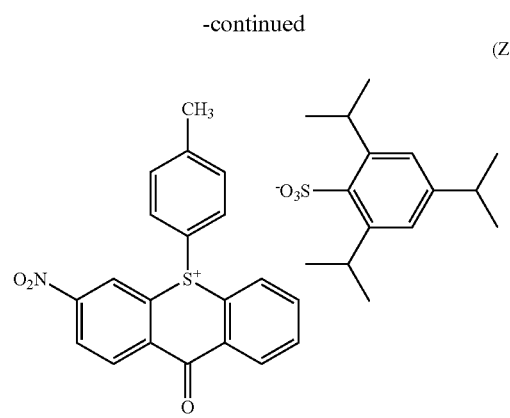
(Z-18)
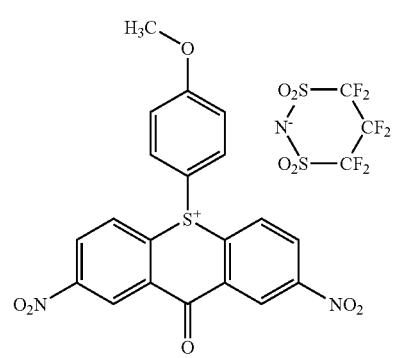
(Z-19)
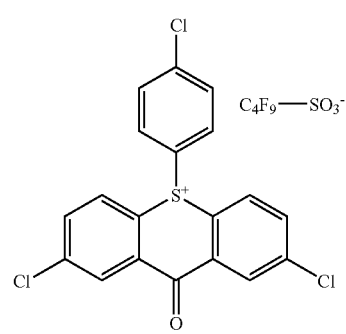
(Z-20)
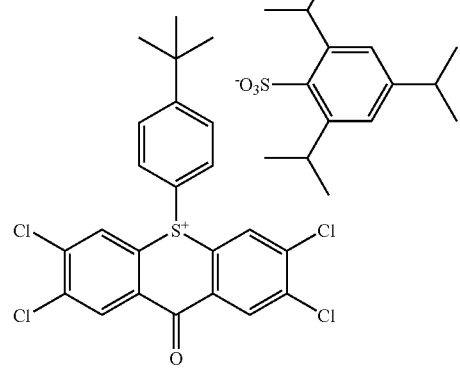
-continued
(Z-21)
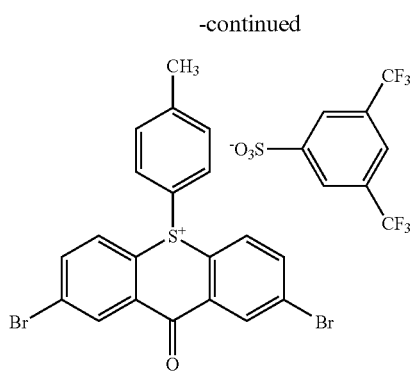
(Z-22)
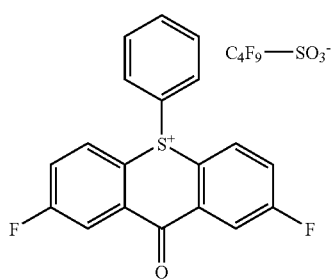
(Z-23)
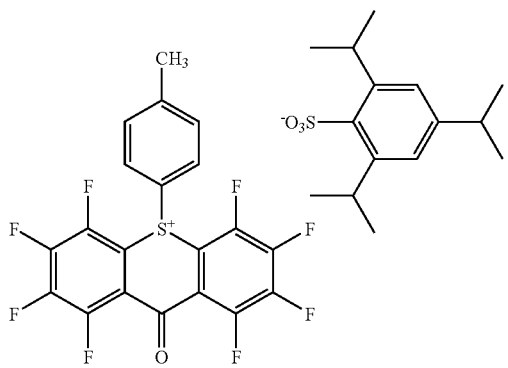
(Z-24)
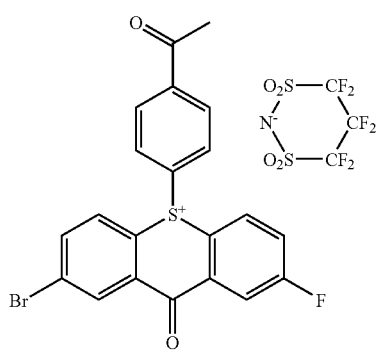
(Z-25)
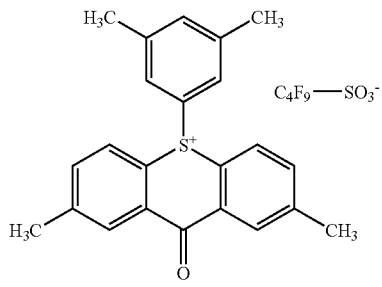

-continued
(Z-26)
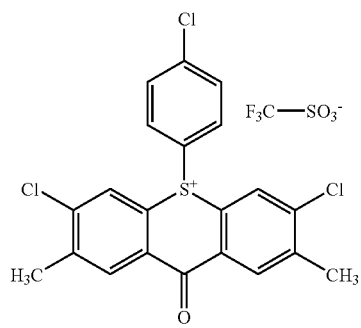
(Z-27)
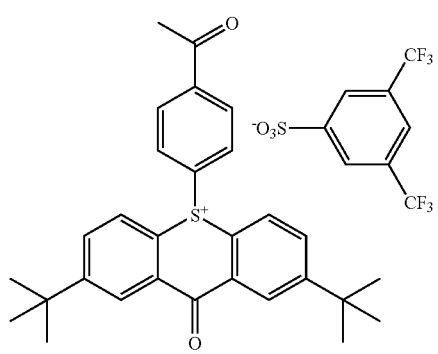
(Z-28)
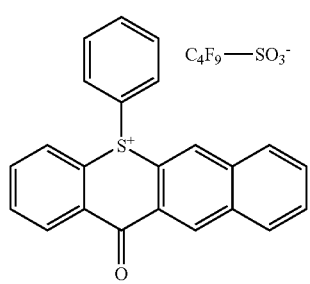
(Z-29)
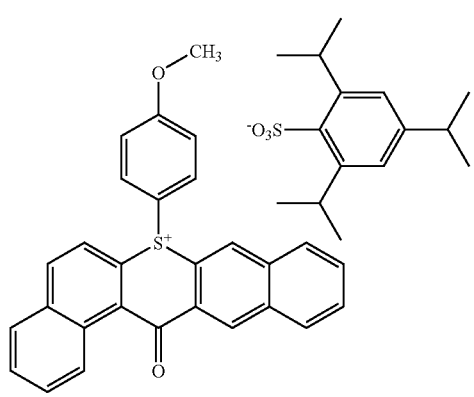
-continued
(Z-30)
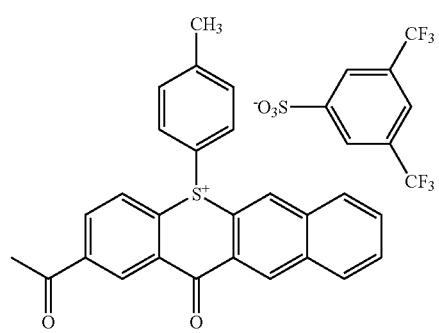
(Z-31)
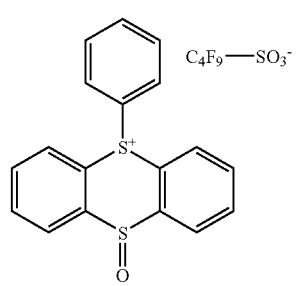
(Z-32)
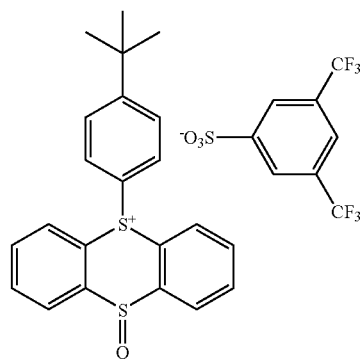
(Z-33)
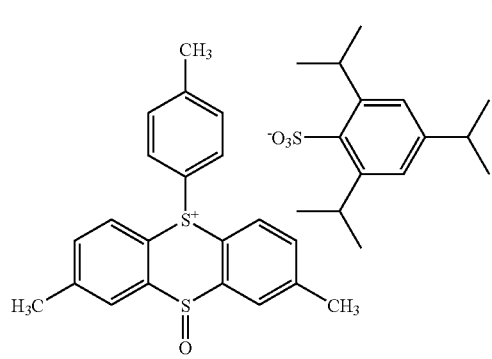

(Z-34)
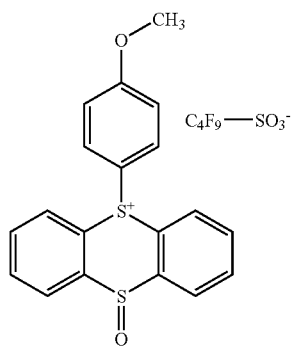
(Z-35)
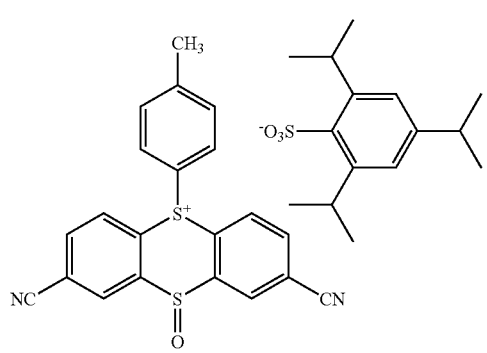
(Z-36)
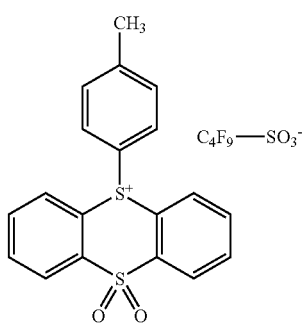
(Z-37)
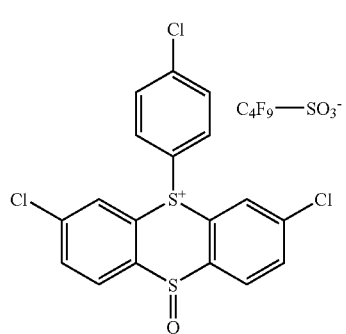
(Z-38)
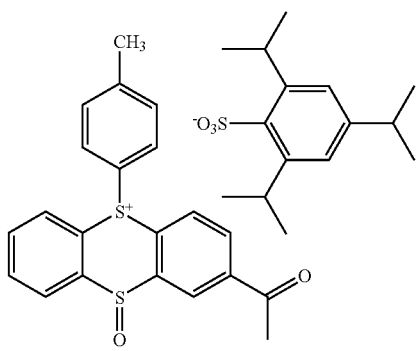
(Z-39)
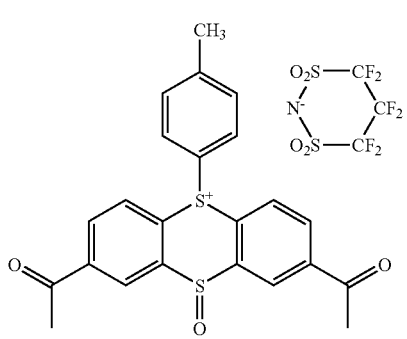
(Z-40)
(Z-41)
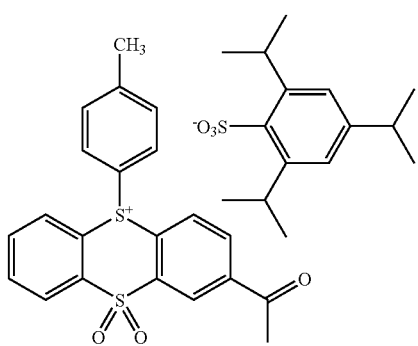

(Z-42)
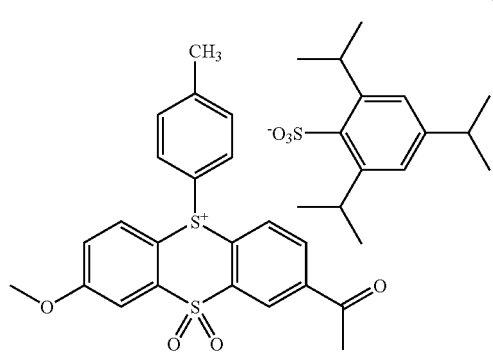
(Z-43)
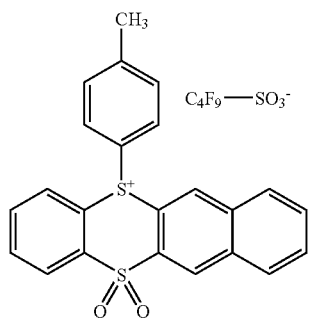
(Z-44)
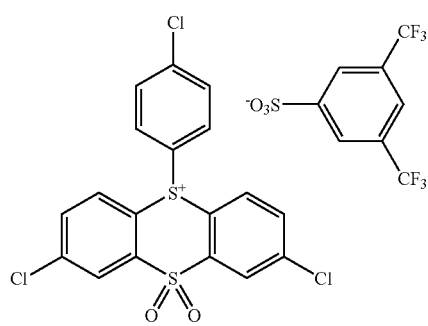
(Z-45)
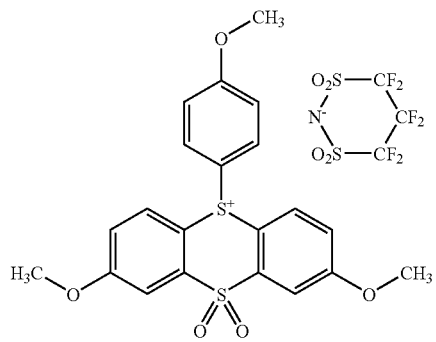
(Z-46)
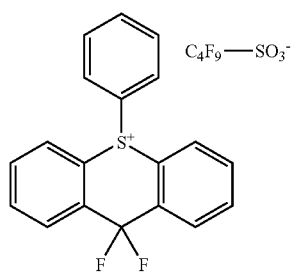
(Z-47)
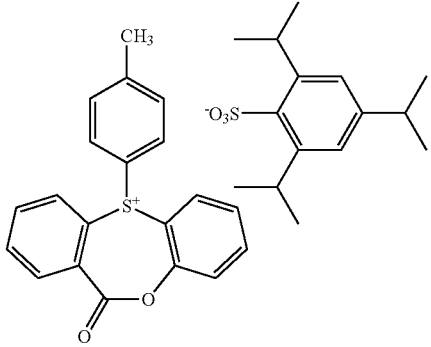
(Z-48)
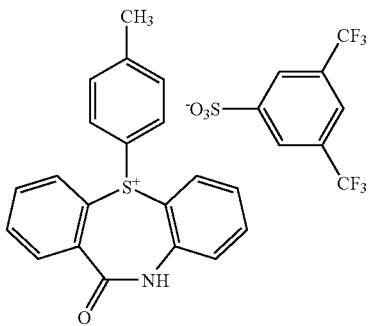
(Z-49)
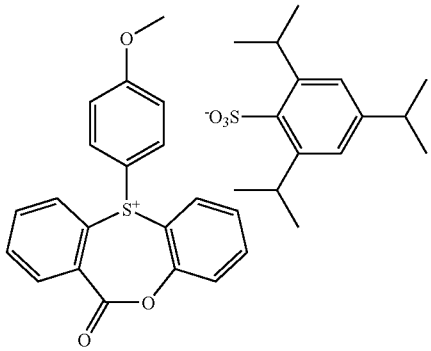
(Z-50)
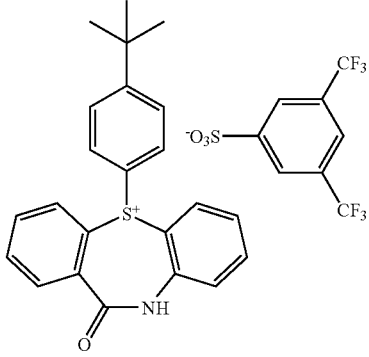

-continued
(Z-51)
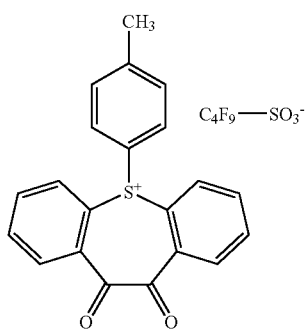
(Z-52)
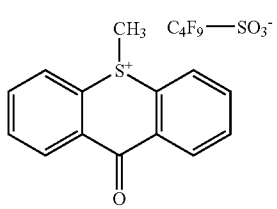
(Z-53)
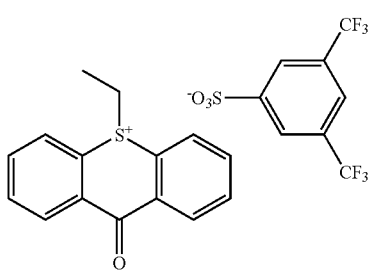
(Z-54)
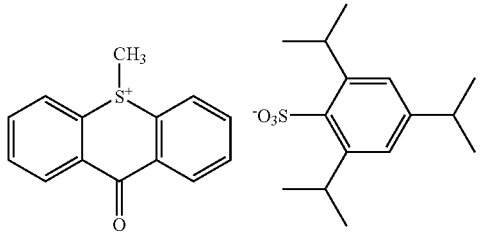
(Z-55)
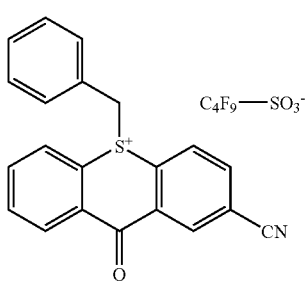
-continued
(Z-56)
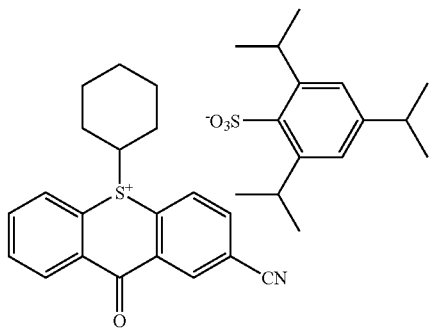
(Z-57)
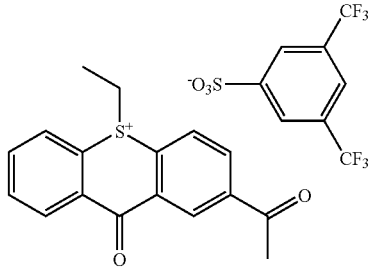
(Z-58)
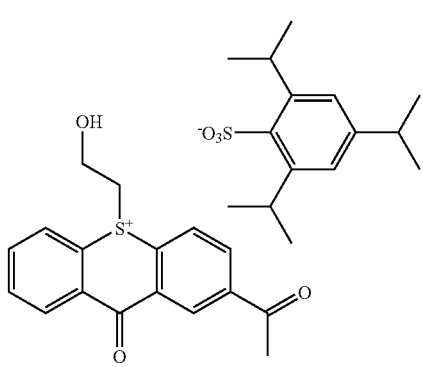
(Z-59)
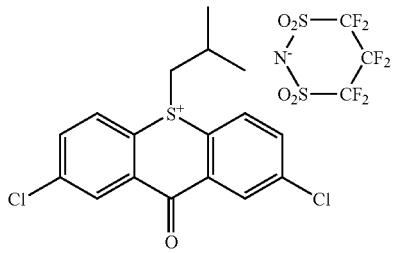
(Z-60)
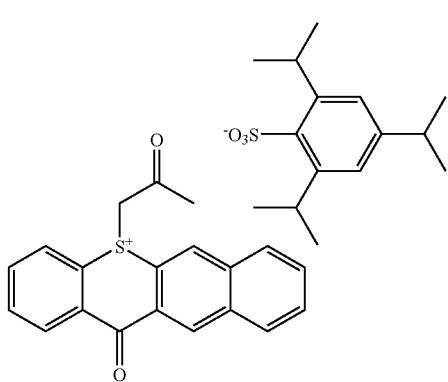

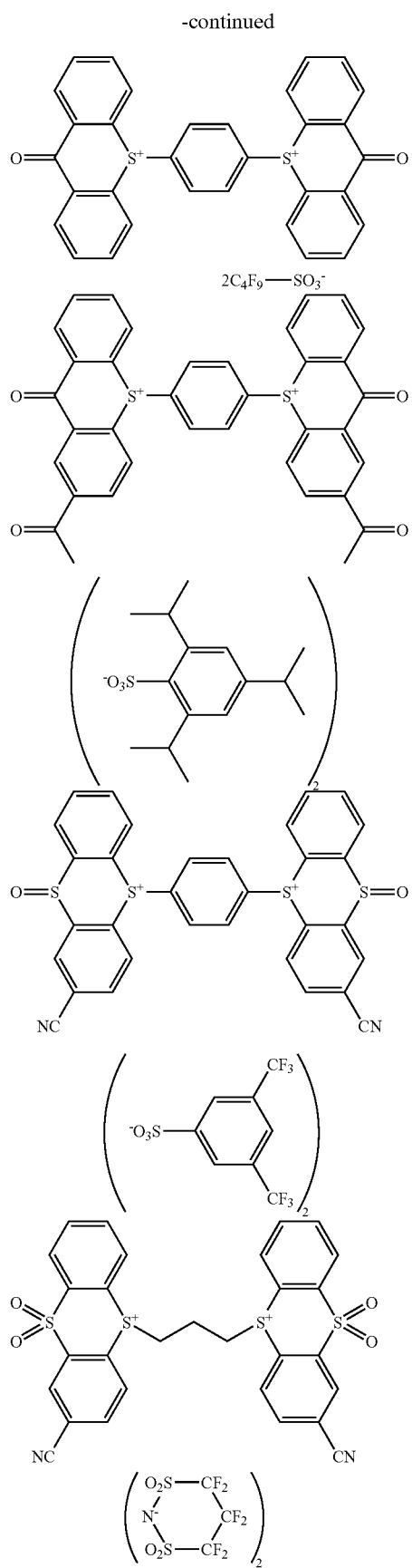

(Z-69) 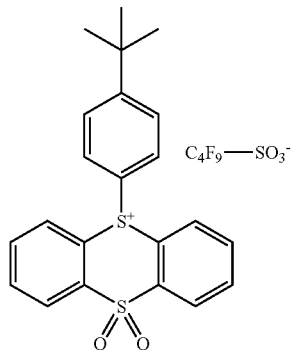
(Z-70) 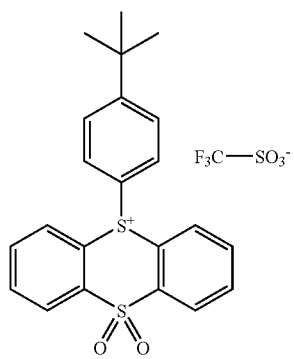
(Z-71) 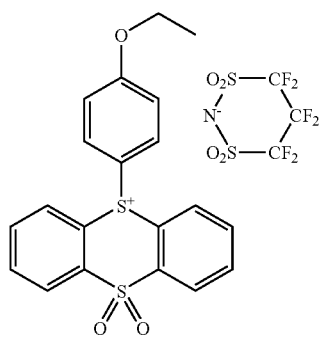
(Z-72) 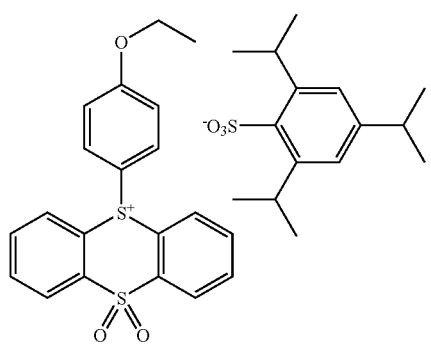
(Z-73) 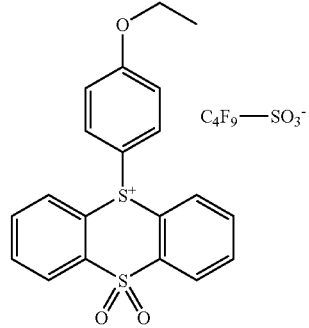
(Z-74) 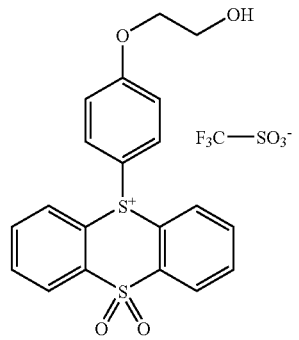
(Z-75) 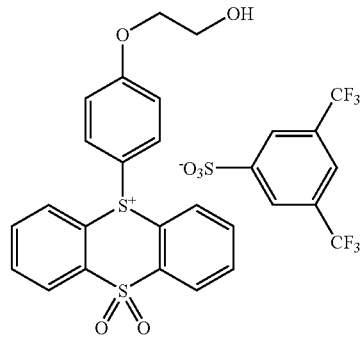
(Z-76) 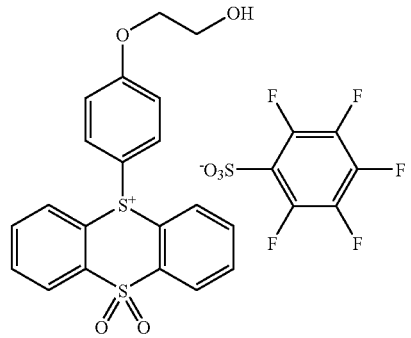

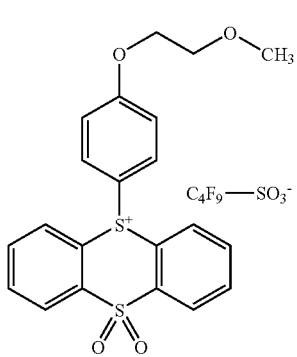 (Z-77)
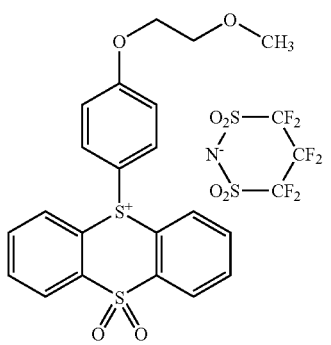 (Z-78)
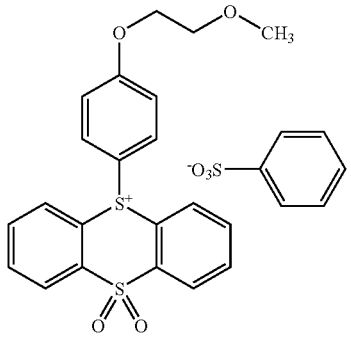 (Z-79)
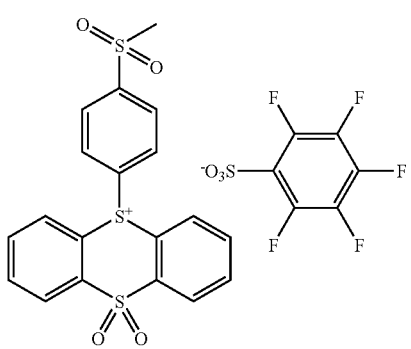 (Z-80)
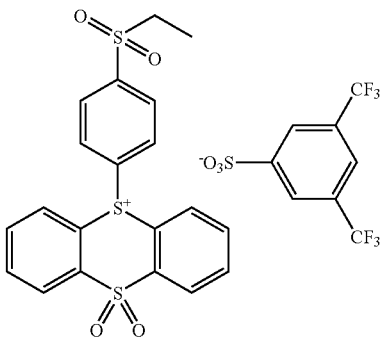 (Z-81)
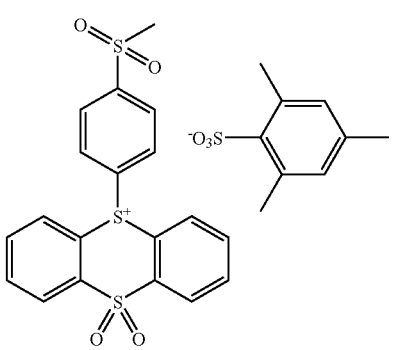 (Z-82)
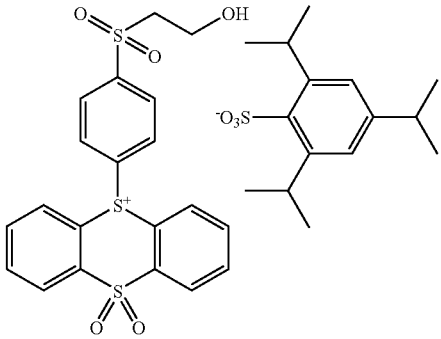 (Z-83)
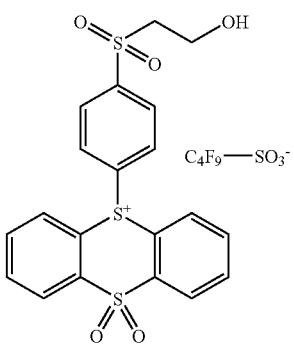 (Z-84)

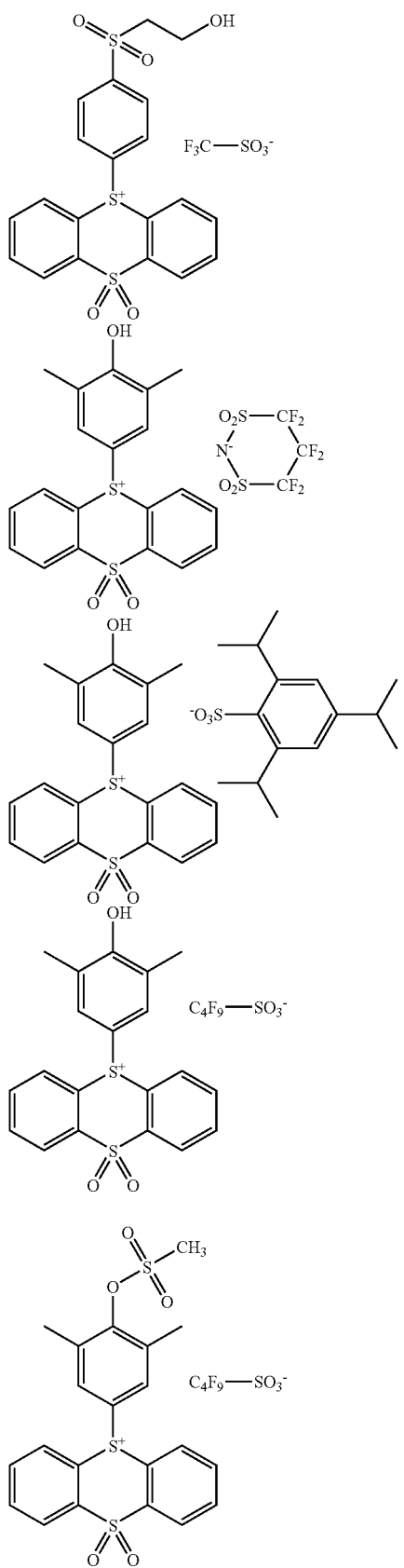
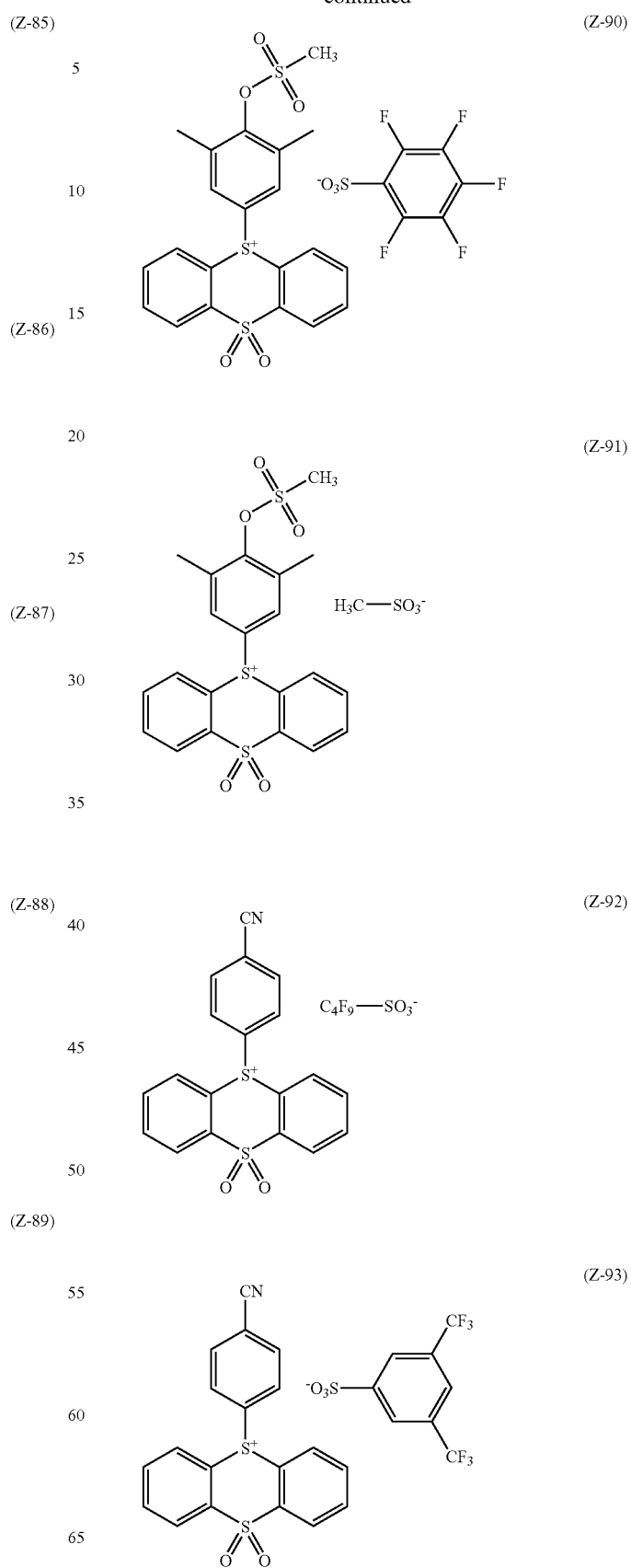

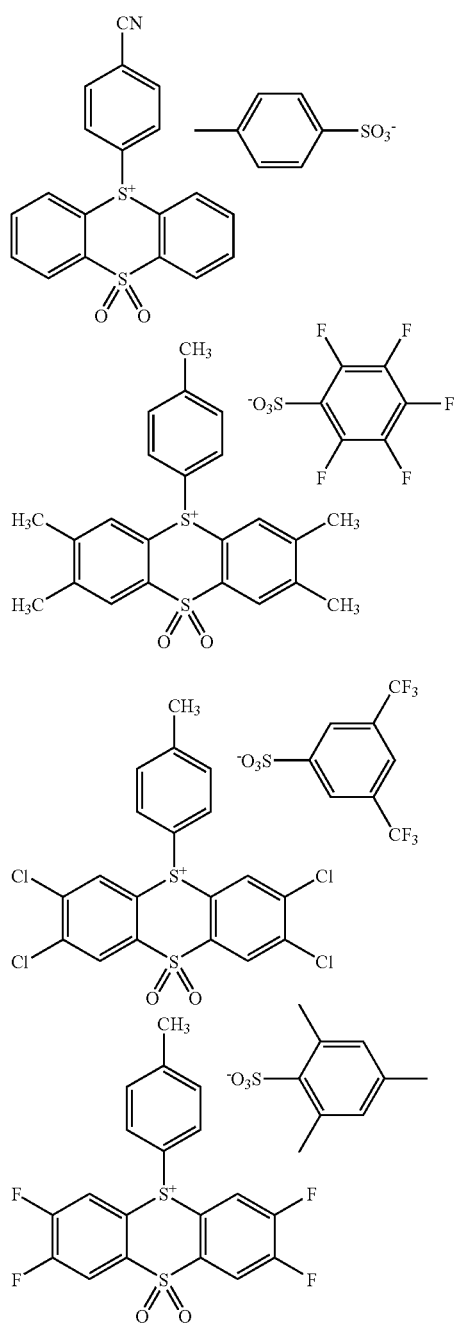
(Z-94)
(Z-95)
(Z-96)
(Z-97)
(Z-98)
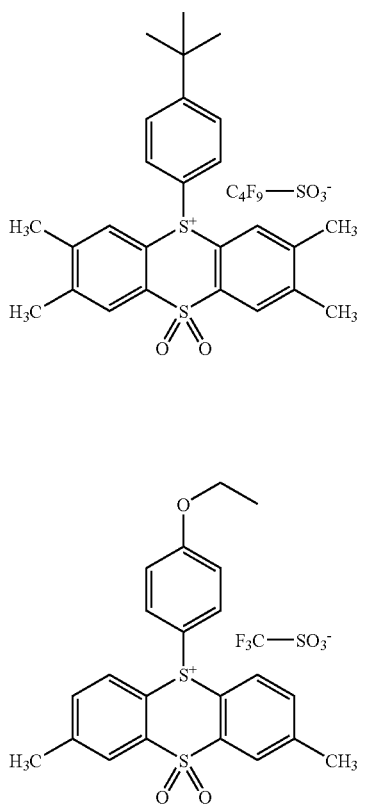
(Z-99)
(Z-100)
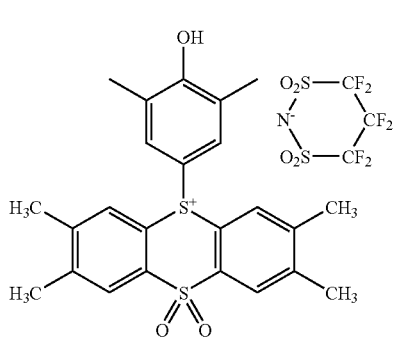
(Z-101)
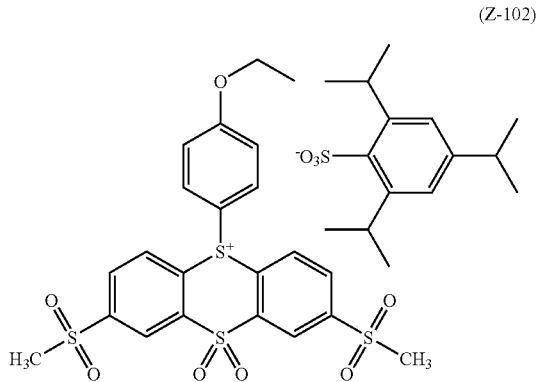
(Z-102)

-continued
(Z-103)
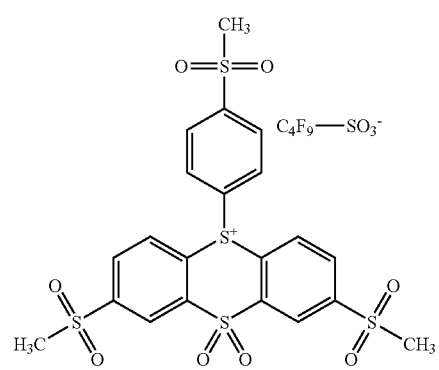
(Z-104)
(Z-105)
(Z-106)
(Z-107)
-continued
(Z-108)
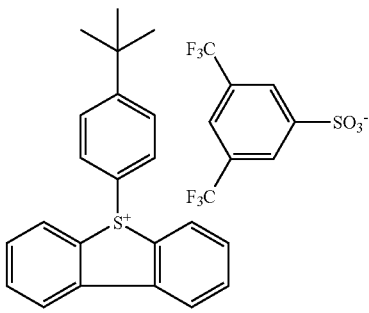
(Z-109)
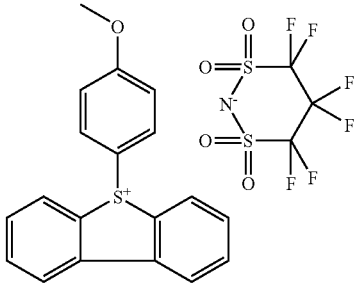
(Z-110)
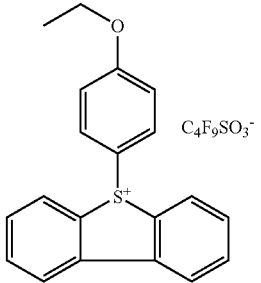
(Z-111)
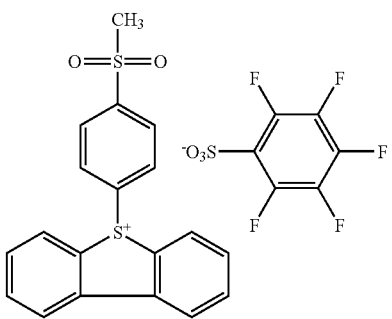
(Z-112)
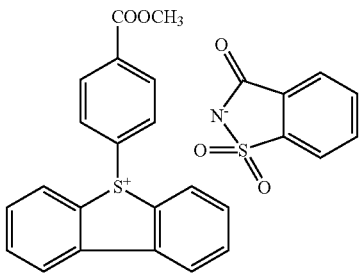

-continued
(Z-113)
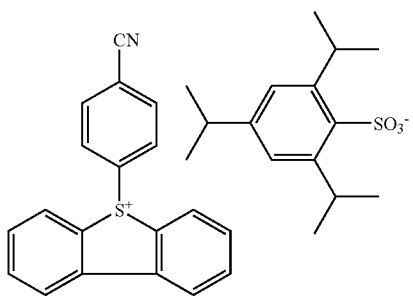
(Z-114)
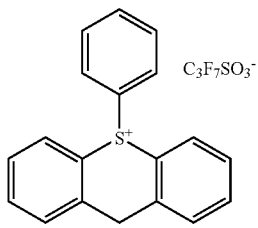
(Z-115)
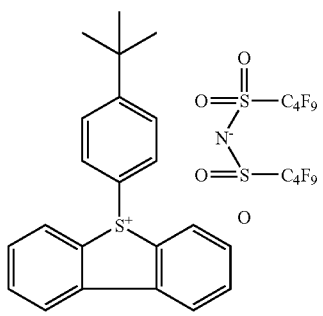
(Z-116)
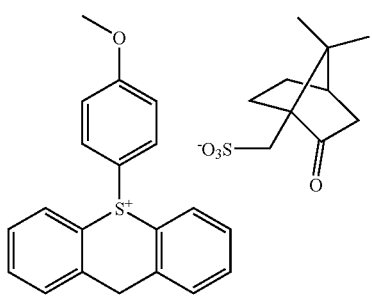
(Z-117)
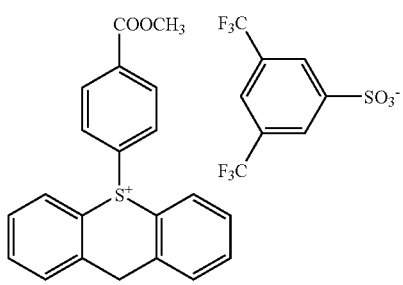
-continued
(Z-118)
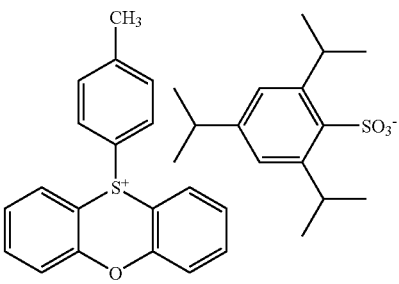
(Z-119)
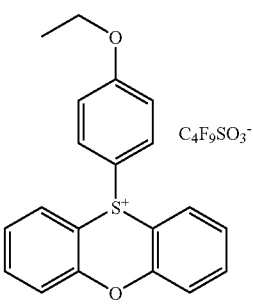
(Z-120)
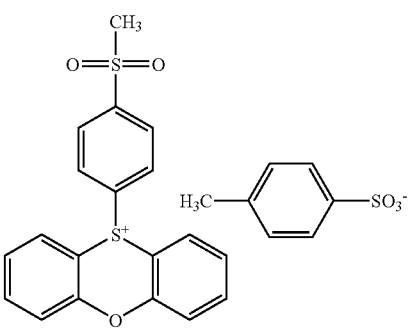
(Z-121)
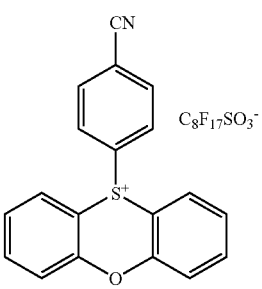
(Z-122)
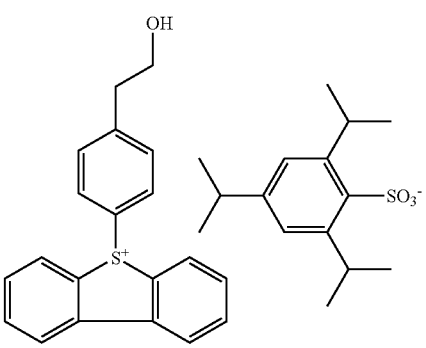

-continued (Z-123)

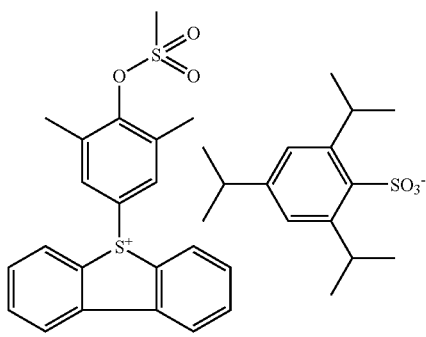

[3] (A) Compound capable of generating a compound represented by the following formula (A-I) upon irradiation with actinic rays or radiation (hereinafter sometimes referred to as a "compound (A)")

$$Q_1\text{-}X_1\text{—NH—}X_2\text{-}Q_2 \qquad (A\text{-}I)$$

In formula (A-I), $Q_1$ and $Q_2$ each independently represents a monovalent organic group, provided that either one of $Q_1$ and $Q_2$ has a proton acceptor functional group. $Q_1$ and $Q_2$ may combine to form a ring, and the ring formed may have a proton acceptor functional group.

$X_1$ and $X_2$ each independently represents —CO— or —SO$_2$—.

The monovalent organic group of $Q_1$ and $Q_2$ in formula (A-I) is preferably a monovalent organic group having a carbon number of 1 to 40, and examples thereof include an alkyl group, a cycloalkyl group, an aryl group, an aralkyl group, and an alkenyl group. In the case where a proton acceptor functional group is present, the proton acceptor functional group may be present at the terminal, in the chain or as a side chain of the monovalent organic group such as alkyl group, cycloalkyl group, aryl group, aralkyl group and alkenyl group.

The alkyl group of $Q_1$ and $Q_2$, which may further have a substituent, is preferably a linear or branched alkyl group having a carbon number of 1 to 30 and may contain an oxygen atom, a sulfur atom or a nitrogen atom in the alkyl chain. Specific examples thereof include a linear alkyl group such as methyl group, ethyl group, n-propyl group, n-butyl group, n-pentyl group, n-hexyl group, n-octyl group, n-dodecyl group, n-tetradecyl group and n-octadecyl group; and a branched alkyl group such as isopropyl group, isobutyl group, tert-butyl group, neopentyl group and 2-ethylhexyl group.

The cycloalkyl group of $Q_1$ and $Q_2$, which may further have a substituent, is preferably a cycloalkyl group having a carbon number of 3 to 20 and may contain an oxygen atom or a nitrogen atom in the ring. Specific examples thereof include a cyclopropyl group, a cyclopentyl group, a cyclohexyl group, a norbornyl group and an adamantyl group.

The aryl group of $Q_1$ and $Q_2$, which may further have a substituent, is preferably an aryl group having a carbon number of 6 to 14, and examples thereof include a phenyl group and a naphthyl group.

The aralkyl group of $Q_1$ and $Q_2$, which may further have a substituent, is preferably an aralkyl group having a carbon number of 7 to 20, and examples thereof include a benzyl group, a phenethyl group, a naphthylmethyl group and a naphthylethyl group.

The alkenyl group of $Q_1$ and $Q_2$, which may further have a substituent, includes a group having a double bond at an arbitrary position of the alkyl group above.

Examples of the substituent which these groups each may further have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 10).

As for the cyclic structure in the aryl group, cycloalkyl group and the like, examples of the substituent further include an alkyl group (preferably having a carbon number of 1 to 10). As for the aminoacyl group, examples of the substituent further include an alkyl group (preferably having a carbon number of 1 to 10). Examples of the alkyl group having a substituent include a perfluoroalkyl group such as perfluoromethyl group, perfluoroethyl group, perfluoropropyl group and perfluorobutyl group.

Either one monovalent organic group of $Q_1$ an $Q_2$ has a proton acceptor functional group. The proton acceptor functional group is a group capable of electrostatically interacting with a proton or a functional group having a lone pair of electrons, and examples thereof include a functional group having a microcyclic structure such as cyclic polyether, and a functional group containing a nitrogen atom having a lone pair of electrons less contributing to 7-conjugation. Examples of the nitrogen atom having a lone pair of electrons less contributing to π-conjugation include a nitrogen atom having a partial structure represented by either one of the following formulae:

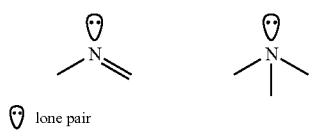

⊖ lone pair

Preferred examples of the partial structure of the proton acceptor functional group include a crown ether structure, an aza-crown ether structure, a tertiary amine structure, a secondary amine structure, a primary amine structure, a pyridine structure, an imidazole structure, a pyrazine structure and an aniline structure. The carbon number thereof is preferably from 4 to 30. Examples of the group containing such a structure include an alkyl group, a cycloalkyl group, an aryl group, an aralkyl group and an alkenyl group. The alkyl group, cycloalkyl group, aryl group, aralkyl group and alkenyl group are the same as those described above.

These groups each may further have a substituent.

Examples of the substituent which the above-described groups each may further have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 20). As for the cyclic structure in the aryl group, cycloalkyl group and the like, examples of the substituent further include an alkyl group (preferably having a carbon number of 1 to 20). As for the aminoacyl group, examples of the substituent further include an alkyl group (preferably having a carbon number of 1 to 20).

The proton acceptor functional group may be substituted by an organic group having a bond which is breakable by an acid. Examples of the organic group having a bond breakable by an acid include an amido group, an ester group (preferably a tertiary alkyloxycarbonyl group), an acetal group (preferably a 1-alkyloxy-alkyloxy group), a carbamoyl group and a carbonate group.

When $Q_1$ and $Q_2$ combine to form a ring and the ring formed has a proton acceptor functional group, examples of the structure therefor include a structure where the organic group of $Q_1$ or $Q_2$ is further bonded by an alkylene group, an oxy group, an imino group or the like.

In formula (A-I), at least either one of $X_1$ and $X_2$ is preferably —$SO_2$—.

The compound represented by formula (A-I) preferably has a structure represented by the following formula (A-TI):

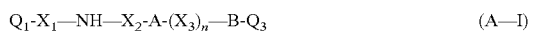

$$Q_1\text{-}X_1\text{—}NH\text{—}X_2\text{-}A\text{-}(X_3)_n\text{—}B\text{-}Q_3 \qquad (A\text{—}I)$$

In formula (A-TI), $Q_1$ and $Q_3$ each independently represents a monovalent organic group, provided that either one of $Q_1$ and $Q_3$ has a proton acceptor functional group. $Q_1$ and $Q_3$ may combine to form a ring and the ring formed may have a proton acceptor functional group.

$X_1$, $X_2$ and $X_3$ each independently represents —CO— or —$SO_2$—.

A represents a divalent linking group.

B represents a single bond, an oxygen atom or —N($Q_x$)-.

$Q_x$ represents a hydrogen atom or a monovalent organic group.

When B is —N($Q_x$)-, $Q_3$ and $Q_x$ may combine to form a ring.

n represents 0 or 1.

$Q_1$ has the same meaning as $Q_1$ in formula (A-I).

Examples of the organic group of $Q_3$ are the same as those of the organic group of $Q_1$ and $Q_2$ in formula (A-I).

The divalent linking group of A is preferably a divalent linking group having a carbon number of 1 to 8 and containing a fluorine atom, and examples thereof include a fluorine atom-containing alkylene group having a carbon number of 1 to 8, preferably from 2 to 6, more preferably from 2 to 4, and a fluorine atom-containing phenylene group, with a fluorine atom-containing alkylene group being preferred. The alkylene chain may contain a linking group such as oxygen atom and sulfur atom. The alkylene group is preferably an alkylene group where from 30 to 100% by number of the hydrogen atom is replaced by a fluorine atom, more preferably a perfluoroakylene group, still more preferably a perfluoroethylene group, a perfluoropropylene group or a perfluorobutylene group.

The monovalent organic group of $Q_x$ is preferably an organic group having a carbon number of 4 to 30, and examples thereof include an alkyl group, a cycloalkyl group, an aryl group, an aralkyl group and an alkenyl group. Examples of the alkyl group, cycloalkyl group, aryl group, aralkyl group and alkenyl group are the same as those described above for $Q_1$ and $Q_2$.

In formula (A-II), $X_1$, $X_2$ and $X_3$ each is preferably —$SO_2$—.

Specific examples of the compound represented by formula (A-I) are set forth below, but the present invention is not limited thereto.

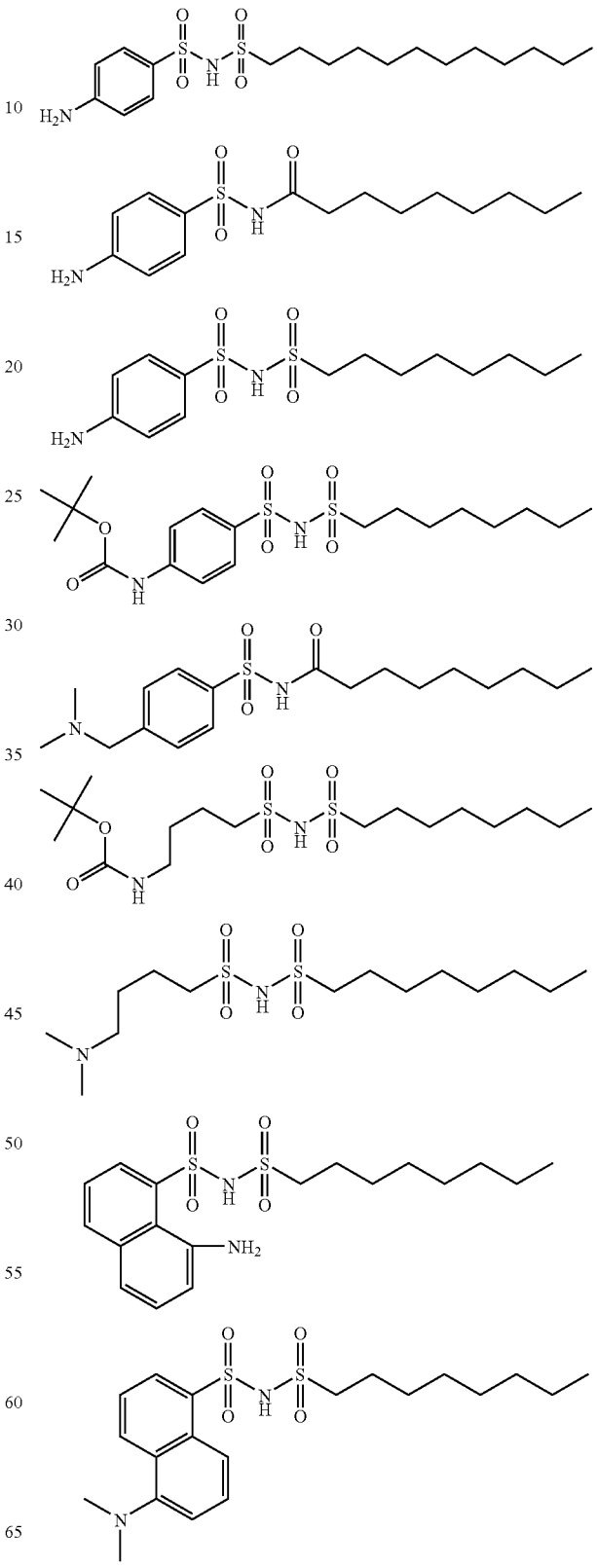

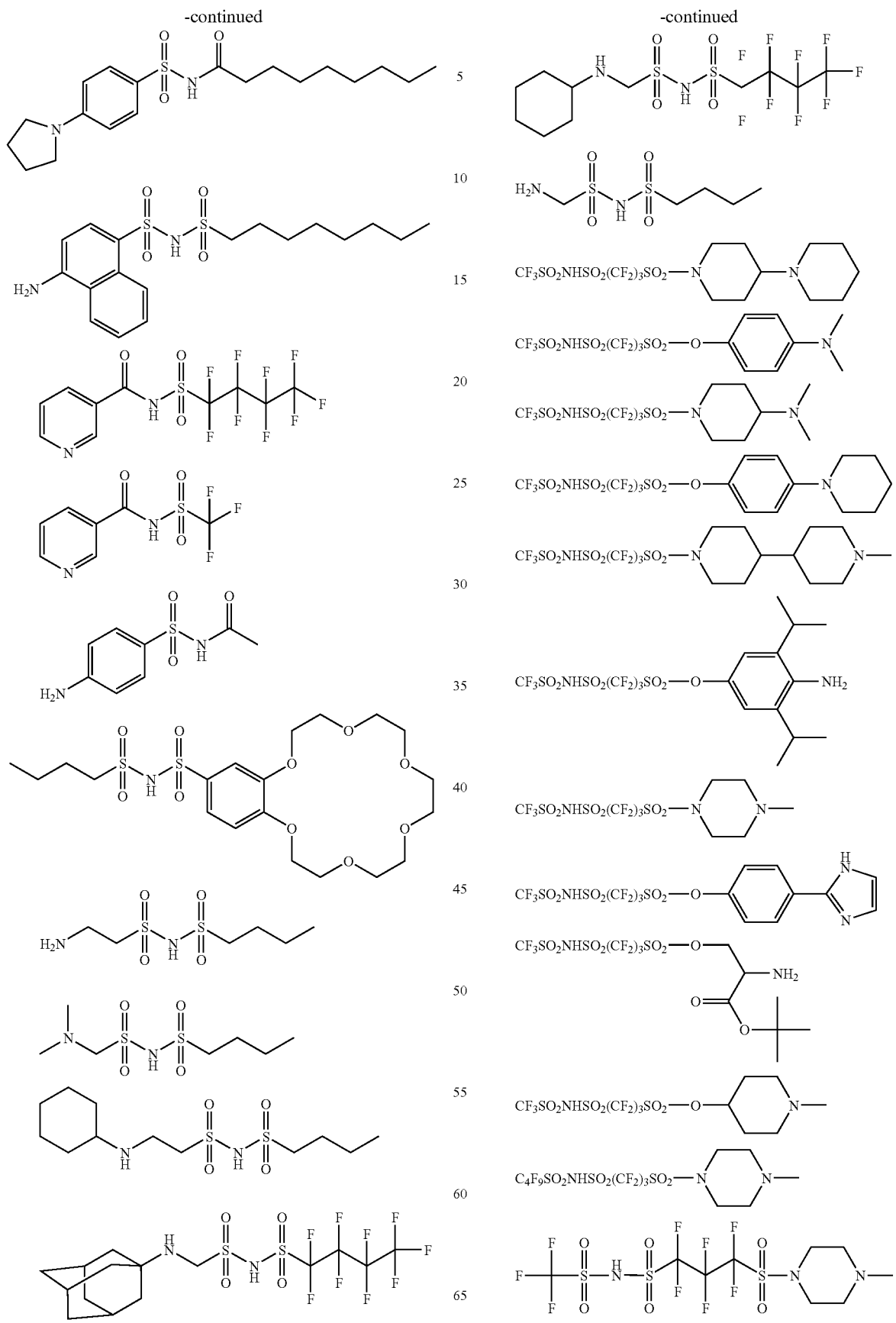

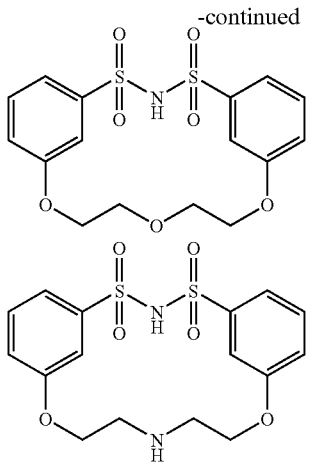

The compound capable of generating a compound represented by formula (A-I) upon irradiation with actinic rays or radiation is preferably a sulfonium salt compound of the compound represented by formula (A-I), or an iodonium salt compound of the compound represented by formula (A-I).

The compound capable of generating a compound represented by formula (A-I) upon irradiation with actinic rays or radiation is more preferably a compound represented by the following formula (A1) or (A2):

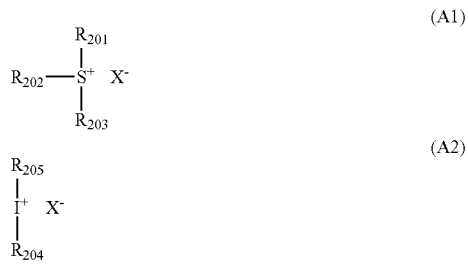

In formula (A1), $R_{201}$, $R_{202}$ and $R_{203}$ each independently represents an organic group.

$X^-$ represents an anion of the compound represented by formula (A-I). In the anion of the compound represented by formula (A-I), the nitrogen atom shown in formula (A-I) becomes a negative ion.

The carbon number of the organic group of $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amido bond or a carbonyl group. Examples of the group formed resulting from combining of two members out of $R_{201}$ to $R_{203}$ include an alkylene group (e.g., butylene, pentylene).

Specific examples of the organic group of $R_{201}$, $R_{202}$ and $R_{203}$ include the corresponding groups in the compounds (A1a), (A1b) and (A1c) described later.

The compound may be a compound having a plurality of structures represented by formula (A1). For example, the compound may be a compound having a structure that at least one of $R_{201}$ to $R_{203}$ in the compound represented by formula (A1) is bonded to at least one of $R_{201}$ to $R_{203}$ in another compound represented by formula (A1).

The component (A1) is more preferably a compound (A1a), (A1b) or (A1c) described below.

The compound (A1a) is an arylsulfonium compound where at least one of $R_{201}$ to $R_{203}$ in formula (A1) is an aryl group, that is, a compound having arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, a diarylcycloalkylsulfonium compound, an aryldialkyl-sulfonium compound, an aryldicycloalkylsulfonium compound and an arylalkylcycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the aryl group having a heterocyclic structure include a pyrrole residue (a group formed by the removal of one hydrogen atom from a pyrrole), a furan residue (a group formed by the removal of one hydrogen atom from a furan), a thiophene residue (a group formed by the removal of one hydrogen atom from a thiophene), an indole residue (a group formed by the removal of one hydrogen atom from an indole), a benzofuran residue (a group formed by the removal of one hydrogen atom from a benzofuran) and a benzothiophene residue (a group formed by the removal of one hydrogen atom from a benzothiophene). In the case where the arylsulfonium compound has two or more aryl groups, these two or more aryl groups may be the same of different.

The alkyl group which is present, if desired, in the arylsulfonium compound is preferably a linear or branched alkyl group having a carbon number of 1 to 15, and examples thereof include a methyl group, an ethyl group, a propyl group, an n-butyl group, a sec-butyl group and a tert-butyl group.

The cycloalkyl group which is present, if desired, in the arylsulfonium compound is preferably a cycloalkyl group having a carbon number of 3 to 15, and examples thereof include a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, and most preferably an alkyl group having a carbon number of 1 to 4, or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (A1b) is described below.

The compound (A1b) is a compound when $R_{201}$ to $R_{203}$ in formula (A1) each independently represents an organic group having no aromatic ring. The aromatic ring as used herein includes an aromatic ring having a heteroatom.

The aromatic ring-free organic group of $R_{201}$ to $R_{203}$ has a carbon number of generally from 1 to 30, preferably from 1 to 20.

$R_{201}$ to $R_{203}$ each independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group. The alkyl group of $R_{201}$ to $R_{203}$ may be either linear or branched and is preferably a linear or branched alkyl group having a carbon number of 1 to 20 (e.g., methyl, ethyl, propyl, butyl, pentyl). The alkyl group of $R_{201}$ to $R_{203}$ is more preferably a linear or branched 2-oxoalkyl group or an alkoxycarbonylmethyl group.

The cycloalkyl group of $R_{201}$ to $R_{203}$ is preferably a cycloalkyl group having a carbon number of 3 to 10 (e.g., cyclopentyl, cyclohexyl, norbornyl). The cycloalkyl group of $R_{201}$ to $R_{203}$ is more preferably a 2-oxocycloalkyl group.

The linear or branched 2-oxoalkyl group of $R_{201}$ to $R_{203}$ may have a double bond in the chain and is preferably a group having >C=O at the 2-position of the alkyl group above.

The 2-oxocycloalkyl group of $R_{201}$ to $R_{203}$ may have a double bond in the chain and is preferably a group having >C=O at the 2-position of the cycloalkyl group above.

The alkoxy group in the alkoxycarbonylmethyl group of $R_{201}$ to $R_{203}$ is preferably an alkoxy group having a carbon number of 1 to 5 (e.g., methoxy, ethoxy, propoxy, butoxy, pentoxy).

$R_{201}$ to $R_{203}$ each may be further substituted by a halogen atom, an alkoxy group (for example, an alkoxy group having a carbon number of 1 to 5), an alkoxycarbonyl group (for example, an alkoxycarbonyl group having a carbon number of 1 to 5), a hydroxyl group, a cyano group or a nitro group.

The compound (A1c) is a compound represented by the following formula (A1c), and this is a compound having an arylacylsulfonium salt structure.

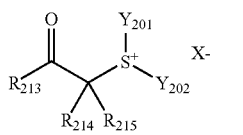

(A1c)

In formula (A1c), $R_{213}$ represents an aryl group and is preferably a phenyl group or a naphthyl group.

Preferred examples of the substituent which the aryl group of $R_{213}$ may have include an alkyl group, an alkoxy group, an acyl group, a nitro group, a hydroxyl group, an alkoxycarbonyl group and a carboxy group.

$R_{214}$ and $R_{215}$ each independently represents a hydrogen atom, an alkyl group or a cycloalkyl group.

$Y_{201}$ and $Y_{202}$ each independently represents an alkyl group, a cycloalkyl group, an aryl group or a vinyl group.

$X^-$ represents an anion of the compound represented by formula (A-I).

$R_{213}$ and $R_{214}$ may combine with each other to form a ring structure, $R_{214}$ and $R_{215}$ may combine with each other to form a ring structure, and $Y_{201}$ and $Y_{202}$ may combine with each other to form a ring structure. The ring structure formed may contain an oxygen atom, a sulfur atom, an ester bond or an amide bond. Examples of the group formed resulting from combining of each pair of $R_{213}$ and $R_{214}$, $R_{214}$ and $R_{215}$, or $Y_{201}$ and $Y_{202}$ include a butylene group and a pentylene group.

The alkyl group of $R_{214}$, $R_{215}$, $Y_{201}$ and $Y_{202}$ is preferably a linear or branched alkyl group having a carbon number of 1 to 20. The alkyl group of $Y_{201}$ and $Y_{202}$ is more preferably a 2-oxoalkyl group having >C=O at the 2-position of the alkyl group, an alkoxycarbonylalkyl group (preferably with an alkoxy group having a carbon number of 2 to 20), or a carboxyalkyl group.

The cycloalkyl group of $R_{214}$, $R_{215}$, $Y_{201}$ and $Y_{202}$ is preferably a cycloalkyl group having a carbon number of 3 to 20.

The aryl group of $Y_{201}$ and $Y_{202}$ is preferably a phenyl group or a naphthyl group.

$Y_{201}$ and $Y_{202}$ each is preferably an alkyl group having a carbon number of 4 or more, more preferably from 4 to 6, still more preferably from 4 to 12.

At least either one of $R_{214}$ and $R_{215}$ is preferably an alkyl group, and more preferably, $R_{214}$ and $R_{215}$ both are an alkyl group.

In formula (A2), $R_{204}$ and $R_{205}$ each independently represents an aryl group, an alkyl group or a cycloalkyl group.

$X^-$ represents an anion of the compound represented by formula (A-I).

The aryl group of $R_{204}$ and $R_{205}$ is preferably a phenyl group or a naphthyl group, more preferably a phenyl group. The aryl group of $R_{204}$ and $R_{205}$ may be an aryl group having a heterocyclic structure containing an oxygen atom, a nitrogen atom, a sulfur atom or the like. Examples of the aryl group having a heterocyclic structure include a pyrrole residue (a group formed by the removal of one hydrogen atom from a pyrrole), a furan residue (a group formed by the removal of one hydrogen atom from a furan), a thiophene residue (a group formed by the removal of one hydrogen atom from a thiophene), an indole residue (a group formed by the removal of one hydrogen atom from an indole), a benzofuran residue (a group formed by the removal of one hydrogen atom from a benzofuran) and a benzothiophene residue (a group formed by the removal of one hydrogen atom from a benzothiophene).

The alkyl group of $R_{204}$ and $R_{205}$ may be either linear or branched and is preferably a linear or branched alkyl group having a carbon number of 1 to 10 (e.g., methyl, ethyl, propyl, butyl, pentyl).

The cycloalkyl group of $R_{204}$ and $R_{205}$ is preferably a cycloalkyl group having a carbon number of 3 to 10 (e.g., cyclopentyl, cyclohexyl, norbornyl).

$R_{204}$ and $R_{205}$ each may have a substituent, and examples of the substituent which $R_{204}$ and $R_{205}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

The compound (A) is preferably a compound represented by formula (A1), more preferably a compound represented by any one of formulae (A1a) to (A1c).

Specific examples of the compound (A) are set forth below, but the present invention is not limited thereto.

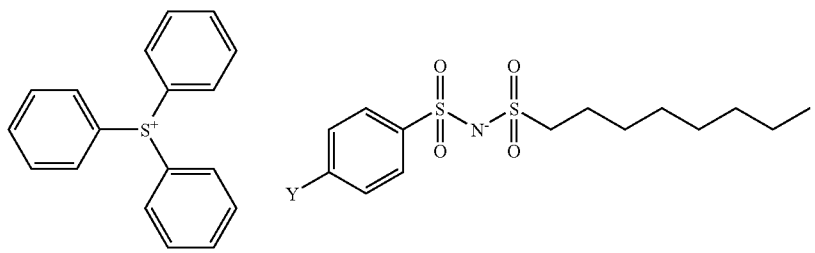 (A-1)
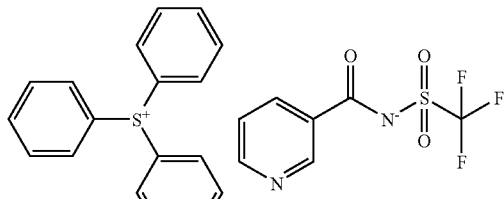 (A-2)
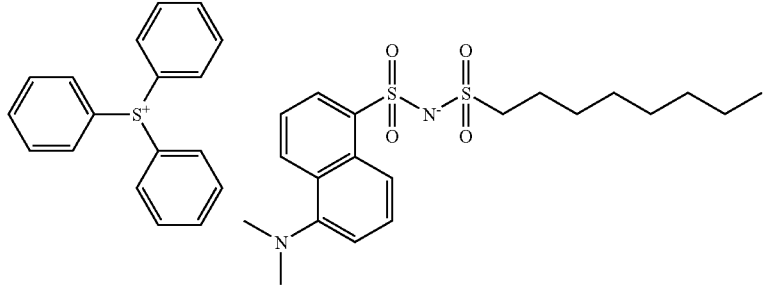 (A-3)
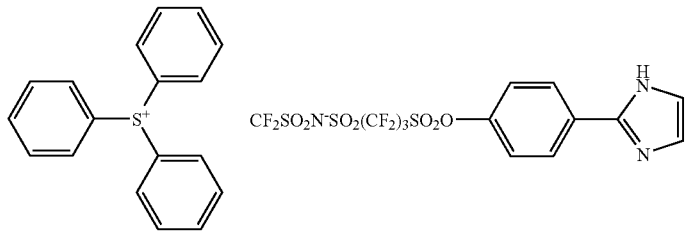 (A-4)
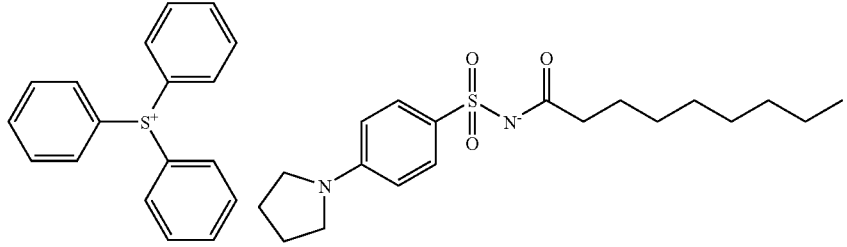 (A-5)
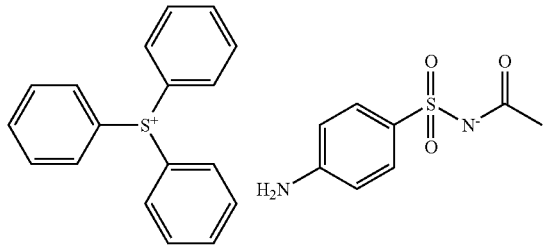 (A-6)

-continued
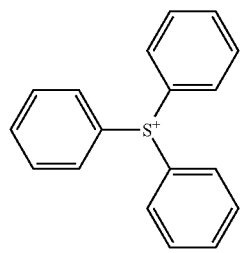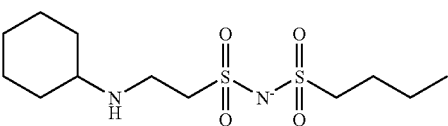
(A-7)
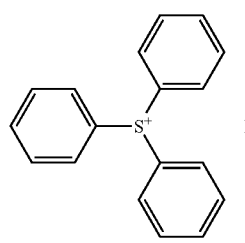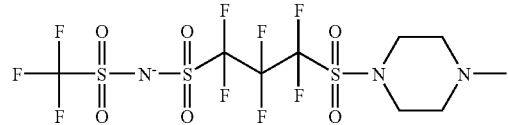
(A-8)
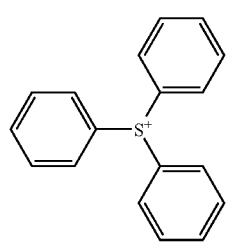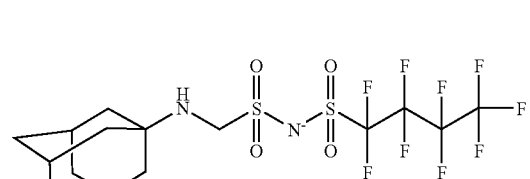
(A-9)
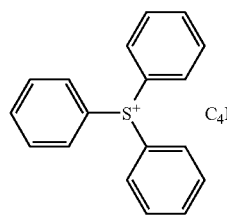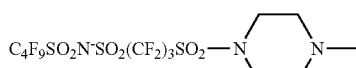
(A-10)
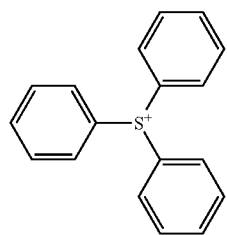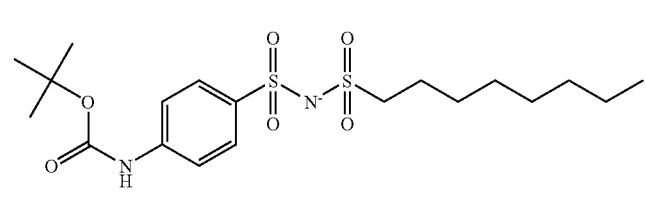
(A-11)
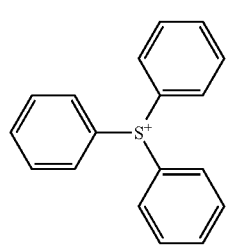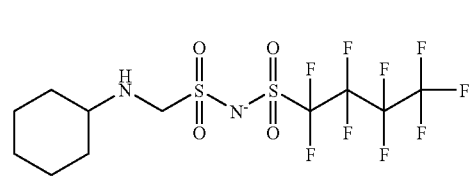
(A-12)

(A-13)
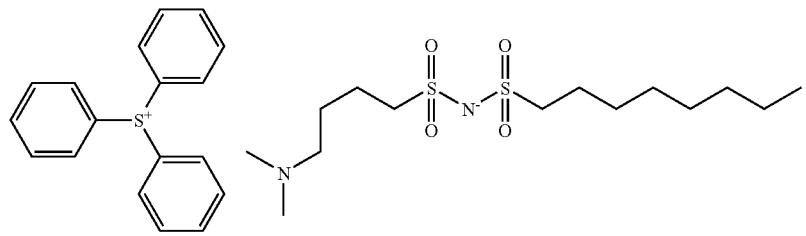
(A-14)
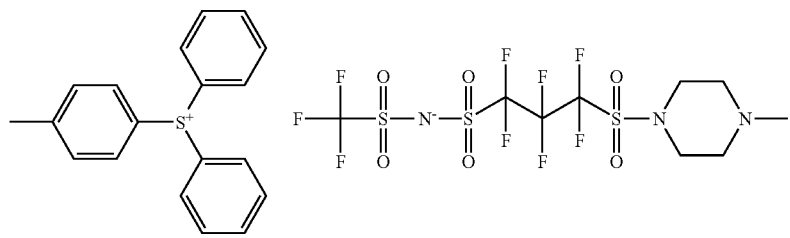
(A-15)
(A-16)
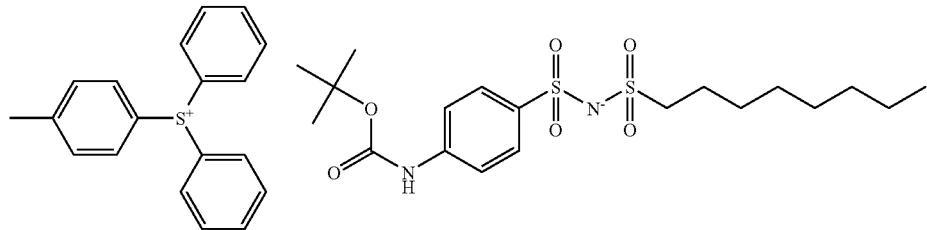
(A-17)
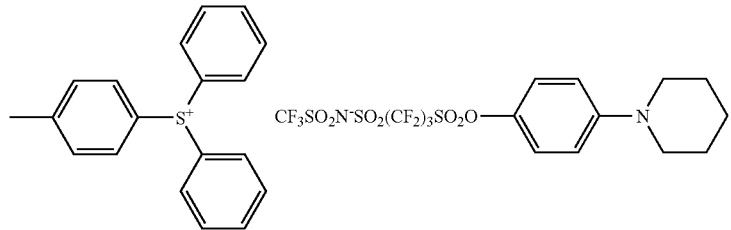
(A-18)
(A-19)
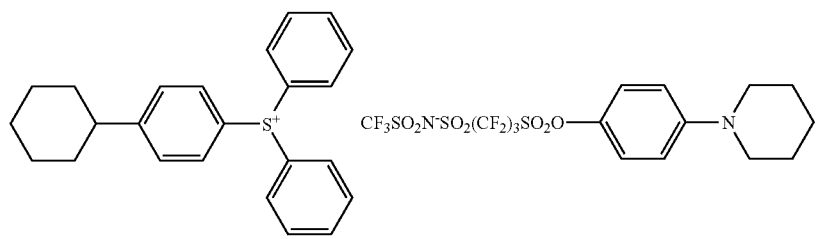

-continued
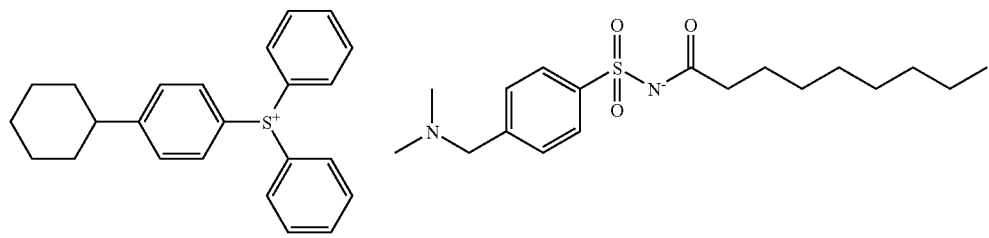
(A-20)
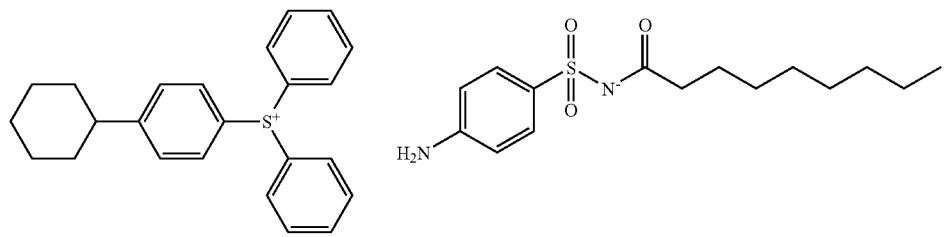
(A-21)
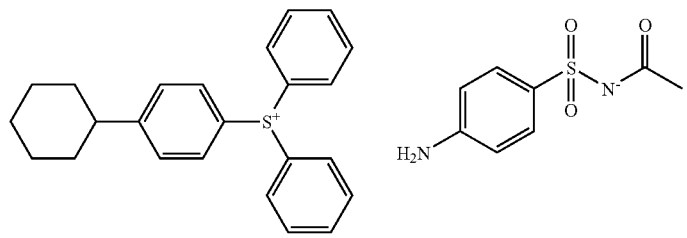
(A-22)
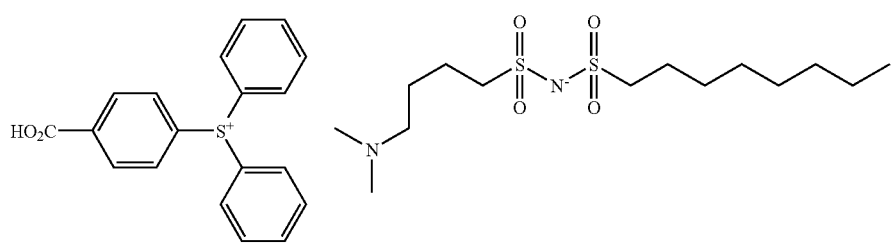
(A-23)
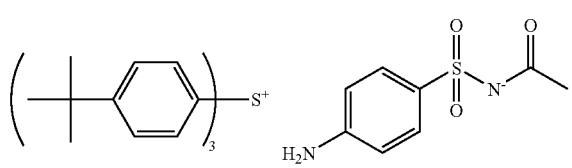
(A-24)
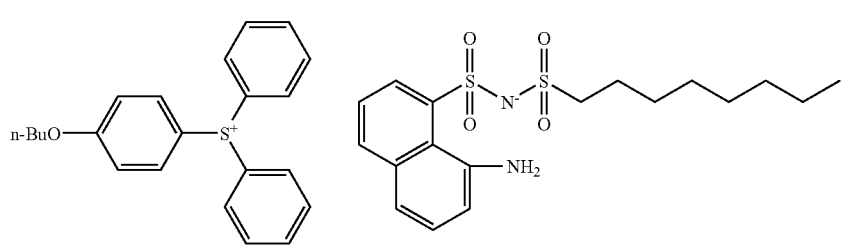
(A-25)
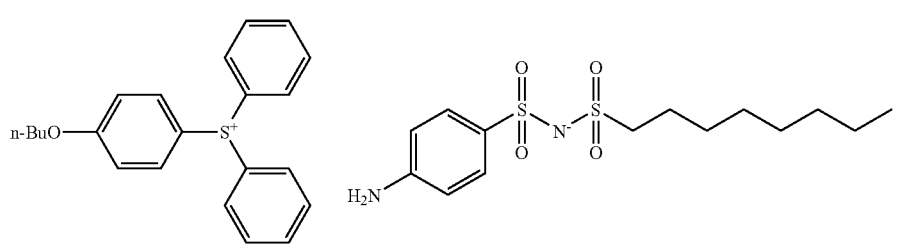
(A-26)

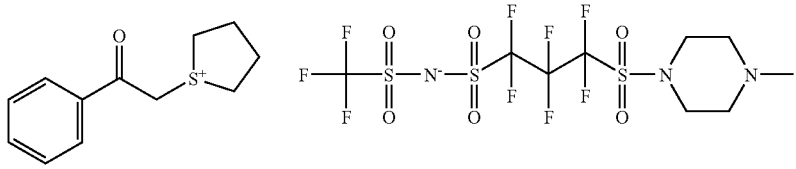
(A-27)
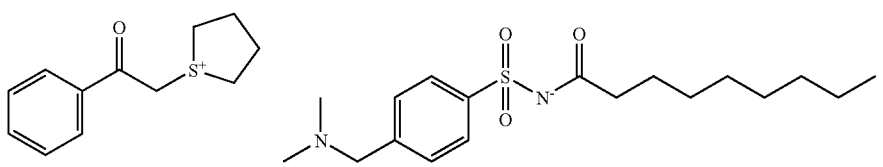
(A-28)
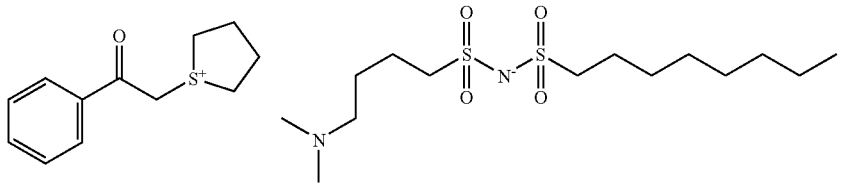
(A-29)
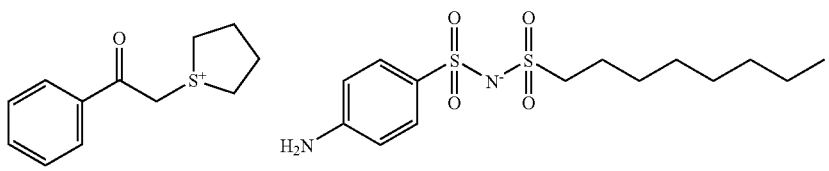
(A-30)
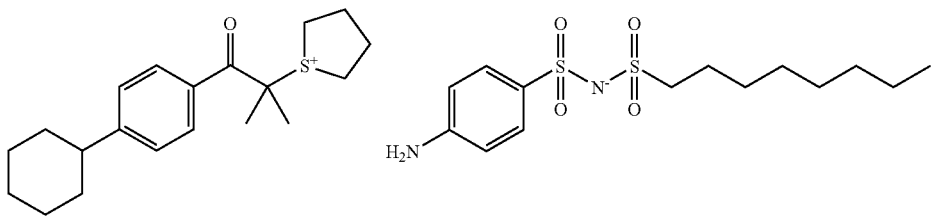
(A-31)
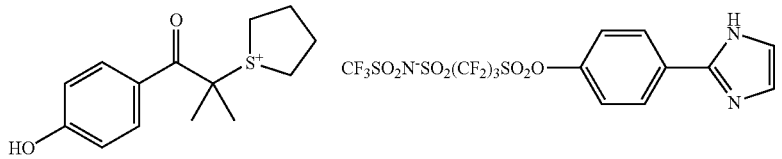
(A-32)
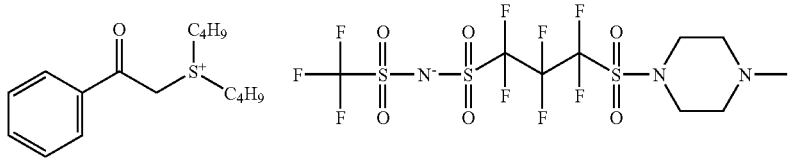
(A-33)
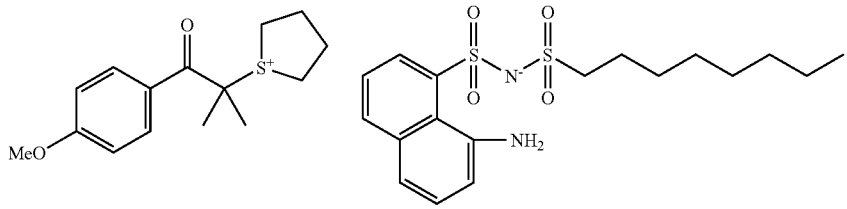
(A-34)

(A-35)
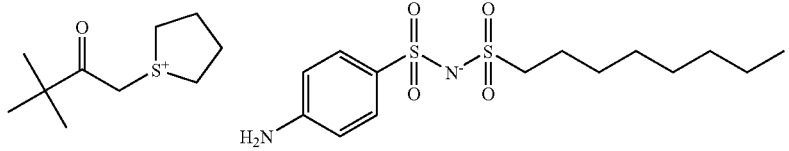
(A-36)
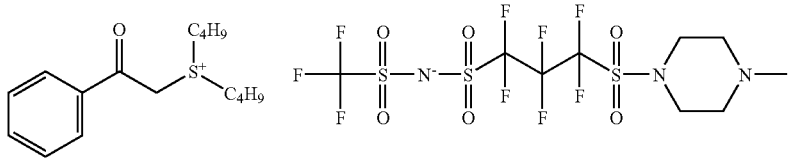
(A-37)
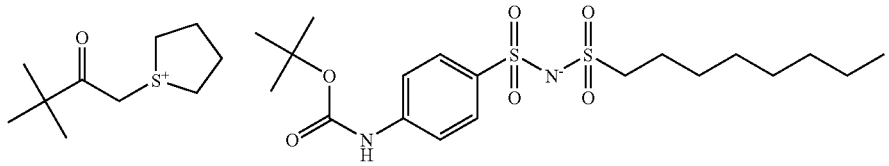
(A-38)
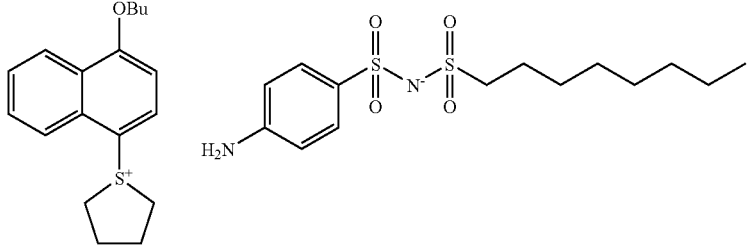
(A-39) (A-40)
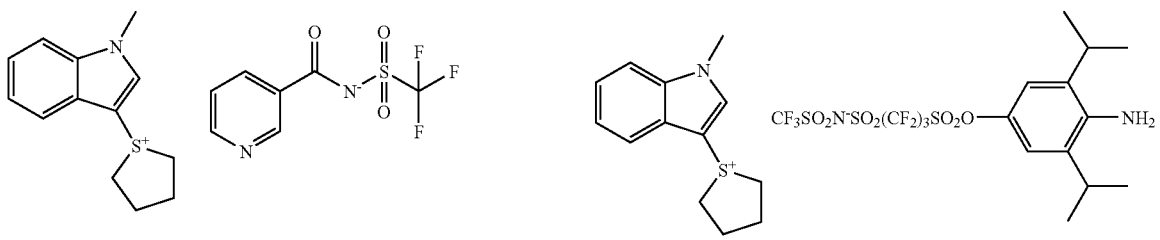
(A-41)
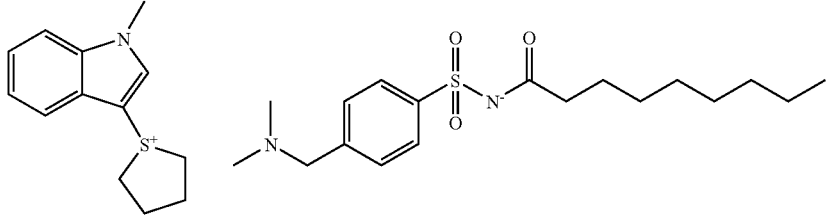
(A-42)
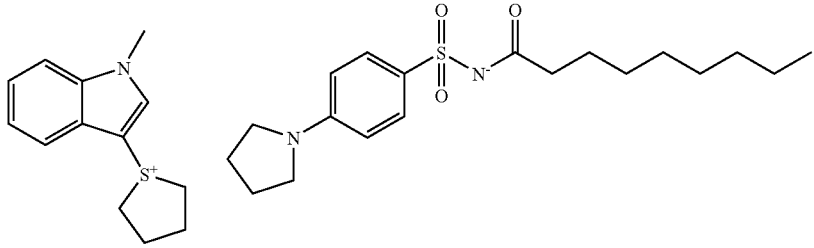

-continued

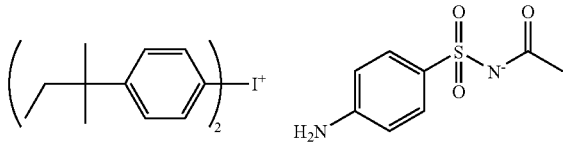
(A-43)

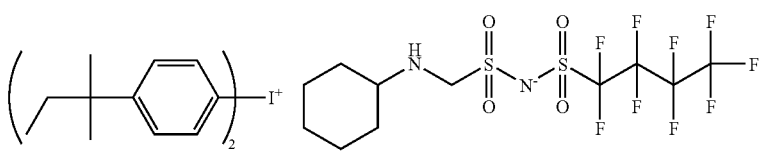
(A-44)

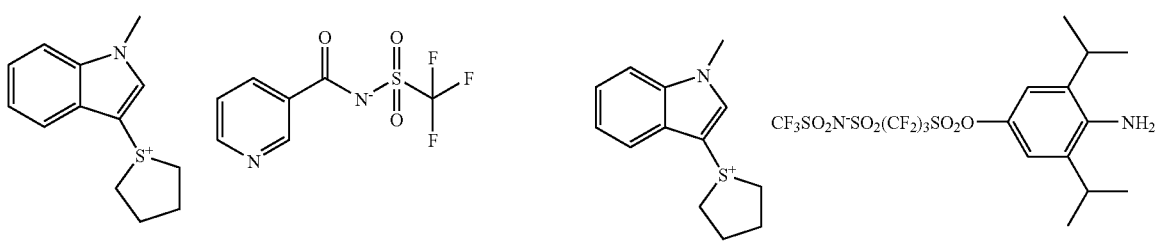
(A-39) (A-40)

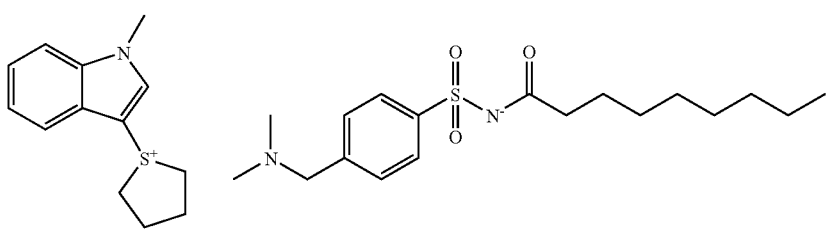
(A-41)

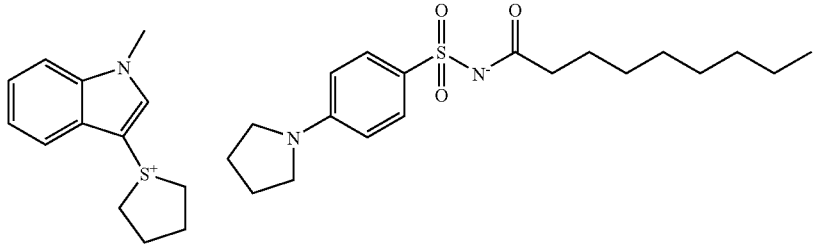
(A-42)

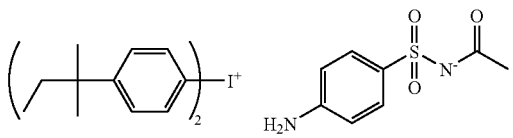
(A-43)

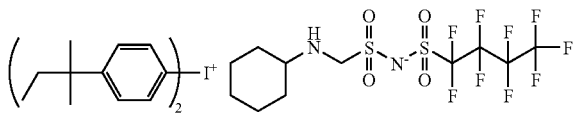
(A-44)

One species of the compound (A) may be used alone or two or more species thereof may be used in combination.

The content of the compound (A) in the positive resist composition of the present invention is preferably from 0.1 to 20 mass %, more preferably from 0.1 to 10 mass %, based on the solid content of the composition.

The compound (A) can be easily synthesized by using a general sulfonic acid esterification reaction or sulfonamidation reaction. For example, this compound may be obtained by a method of selectively reacting one sulfonyl halide moiety of a bis-sulfonyl halide compound with an amine, alcohol or the like containing a partial structure represented by formula (A-I) to form a sulfonamide bond or a sulfonic acid ester bond, and then hydrolyzing the other sulfonyl halide moiety, or a method of ring-opening a cyclic sulfonic anhydride with an amine or alcohol containing a partial structure represented by formula (A-I). The amine or alcohol containing a partial structure represented by formula (A-I) can be synthesized by reacting an amine or alcohol with an anhydride (e.g., (R'O$_2$C)$_2$O, R'O$_2$CCl) or an acid chloride compound under the basic condition.

<Other Components>

[4] (G) Nitrogen-Containing Basic Compound

In the present invention, (G) a nitrogen-containing basic compound is preferably used from the standpoint of enhancing the performance such as resolution or the storage stability.

Preferred structures of the nitrogen-basic compound include structures represented by the following formulae (A) to (E).

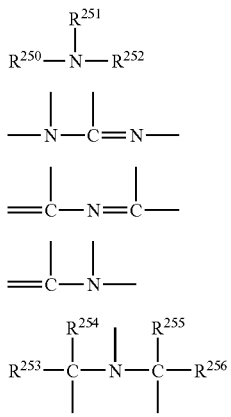

(A)
(B)
(C)
(D)
(E)

In these formulae, $R^{250}$, $R^{251}$ and $R^{252}$ each independently represents a hydrogen atom, an alkyl group having a carbon number of 1 to 20, a cycloalkyl group having a carbon number of 3 to 20, or an aryl group having a carbon number of 6 to 20, and $R^{250}$ and $R^{251}$ may combine with each other to form a ring. These groups each may have a substituent. The alkyl or cycloalkyl group having a substituent is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20.

The alkyl chain thereof may contain an oxygen atom, a sulfur atom or a nitrogen atom.

$R^{253}$, $R^{254}$, $R^{255}$ and $R^{256}$ each independently represents an alkyl group having a carbon number of 1 to 6 or a cycloalkyl group having a carbon number of 3 to 6.

Preferred examples of the compound include guanidine, aminopyrrolidine, pyrazole, pyrazoline, piperazine, aminomorpholine, aminoalkylmorpholine and piperidine, and these compounds each may have a substituent. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include a triarylsulfonium hydroxide, a phenacylsulfonium hydroxide and a sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure is converted into a carboxylate, and examples thereof include acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline and N,N-dimethylaniline. Examples of the alkylamine derivative having a hydroxyl group and/or an ether bond include ethanolamine, diethanolamine, triethanolamine and tris-(methoxyethoxyethyl)amine. Examples of the aniline derivative having a hydroxyl group and/or an ether bond include N,N-bis(hydroxyethyl)aniline.

One of these basic compounds may be used alone, or two or more species thereof may be used in combination. However, when the amount of the component (B) used is 0.05 mass % or more, the basic substance may or may not be used. In the case of using the basic compound, the amount used thereof is usually from 0.001 to 10 mass %, preferably from 0.01 to 5 mass %, based on the solid content of the resist composition. The amount used is preferably 0.001 mass % or more for obtaining a sufficiently high addition effect and preferably 10 mass % or less in view of sensitivity and developability of unexposed area.

[5] (H) Fluorine- and/or Silicon-Containing Surfactant

The resist composition of the present invention preferably further contains any one of fluorine- and/or silicon-containing surfactants (a fluorine-containing surfactant, a silicon-containing surfactant or a surfactant containing both a fluorine atom and a silicon atom), or two or more thereof.

When the resist composition of the present invention contains a fluorine- and/or silicon-containing surfactant, a resist pattern with good sensitivity, resolution and adhesion and less development defect can be obtained at the time of using an exposure light source of 250 nm or less, particularly 220 nm or less.

Examples of the fluorine- and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K.K.), Florad FC430 and 431 (produced by Sumitomo 3M Inc.), Megafac F171, F173, F176, F189 and R08 (produced by Dainippon Ink & Chemicals, Inc.), Surflon S-382, SCIOI, 102, 103, 104, 105 and 106 (produced by Asahi Glass Co., Ltd.), and Troysol S-366 (produced by Troy Chemical). In addition, a polysiloxane polymer KP-341 (produced by Shin-Etsu Chemical Co., Ltd.) may also be used as the silicon-containing surfactant.

Other than these known surfactants, a surfactant using a polymer having a fluoro-aliphatic group which is derived from a fluoro-aliphatic compound produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group). The poly(oxyalkylene) group may also be a unit having alkylenes differing in the chain length within the same chain, such as block-linked poly(oxyethylene, oxypropylene and oxyethylene) and block-linked poly(oxyethylene and oxypropylene). The copolymer of a fluoro-aliphatic group-containing monomer with a (poly(oxyalkylene)) acrylate (or methacrylate) may be not only a binary copolymer but also a ternary or greater copolymer obtained by simultaneously copolymerizing two or more different fluoro-aliphatic group-containing monomers or two or more different (poly(oxyalkylene)) acrylates (or methacrylates).

Examples thereof include commercially available surfactants such as Megafac F178, F-470, F-473, F-475, F-476 and F-472 (produced by Dainippon Ink & Chemicals, Inc.), and further include a copolymer of a $C_6F_{13}$ group-containing acrylate (or methacrylate) with a (poly(oxyalkylene)) acrylate (or methacrylate), a copolymer of a $C_6F_{13}$ group-containing acrylate (or methacrylate) with (poly(oxyethylene)) acrylate (or methacrylate) and (poly(oxy-propylene)) acrylate (or methacrylate), a copolymer of a $C_8F_{17}$ group-containing acrylate (or methacrylate) with a (poly(oxyalkylene)) acrylate (or methacrylate), and a copolymer of a $C_8F_{17}$ group-containing acrylate (or methacrylate) with (poly(oxyethylene)) acrylate (or methacrylate) and (poly(oxypropylene)) acrylate (or methacrylate).

The amount of the fluorine- and/or silicon-containing surfactant used is preferably from 0.0001 to 2 mass %, more preferably from 0.001 to 1 mass %, based on the entire amount of the resist composition (excluding the solvent).

[6] Organic Solvent

The resist composition of the present invention is used by dissolving the above-described components in a predetermined organic solvent.

Examples of the organic solvent which can be used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran.

The solvent for use in the present invention is preferably a solvent having at least one ketone structure.

The solvent having a ketone structure includes a chain ketone solvent and a cyclic ketone solvent. A compound having a total carbon number of 5 to 8 is preferred in view of good coatability.

Examples of the chain ketone solvent include 2-heptanone, methyl ethyl ketone and methyl isobutyl ketone, with 2-heptanone being preferred.

Examples of the cyclic ketone solvent include cyclopentanone, 3-methyl-2-cyclopentanone, cyclohexanone, 2-methylcyclohexanone, 2,6-dimethylcyclohexanone, cyclo-heptanone, cyclooctanone and isophorone, with cyclohexanone and cycloheptanone being preferred.

The solvent is preferably used as a sole solvent having a ketone structure or as a mixed solvent with another solvent. Examples of the solvent mixed (solvent used in combination) include a propylene glycol monoalkyl ether carboxylate, an alkyl lactate, a propylene glycol monoalkyl ether, an alkyl alkoxypropionate and a lactone compound.

Examples of the propylene glycol monoalkyl ether carboxylate include propylene glycol monomethyl ether acetate, propylene glycol monomethyl ether propionate and propylene glycol monoethyl ether acetate.

Examples of the alkyl lactate include methyl lactate and ethyl lactate.

Examples of the propylene glycol monoalkyl ether include propylene glycol monomethyl ether and propylene glycol monoethyl ether.

Examples of the alkyl alkoxypropionate include methyl methoxypropionate, ethyl methoxypropionate, methyl ethoxypropionate and ethyl ethoxypropionate.

Examples of the lactone compound include γ-butyrolactone.

The solvent used in combination is preferably a propylene glycol monoalkyl ether carboxylate, an alkyl lactate or a propylene glycol monoalkyl ether, more preferably propylene glycol monomethyl ether acetate.

By virtue of mixing the ketone-based solvent and the solvent used in combination, adhesion to substrate, developability, DOF and the like are improved.

The ratio (by mass) of the ketone-based solvent and the solvent used in combination is preferably from 10/90 to 95/5, more preferably from 20/80 to 80/20, still more preferably from 30/70 to 70/30.

From the standpoint of enhancing uniformity of film thickness or performance against development defect, a high boiling point solvent having a boiling point of 200° C. or more, such as ethylene carbonate and propylene carbonate, may be mixed.

The amount of the high boiling point solvent added is usually from 0.1 to 15 mass %, preferably from 0.5 to 10 mass %, more preferably from 1 to 5 mass %, based on the entire solvent.

In the present invention, a resist composition having a solid content concentration of usually from 1 to 20 mass %, preferably from 1 to 10 mass %, more preferably from 1 to 8 mass %, is prepared by using a solvent alone, preferably by using two or more kinds of solvents.

[7] Other Additives

If desired, the resist composition of the present invention may further contain, for example, a dye, a plasticizer, a surfactant other than the component (H), a photosensitizer, and a compound capable of accelerating the solubility in a developer.

In the present invention, a surfactant other than (H) the fluorine- and/or silicon-containing surfactant may also be added. Specific examples thereof include a nonionic surfactant such as polyoxyethylene alkyl ethers, polyoxyethylene alkylallyl ethers, polyoxyethyleneepolyoxypropylene block copolymers, sorbitan fatty acid esters and polyoxyethylene sorbitan fatty acid esters.

One of these surfactants may be used alone, or some species thereof may be used in combination.

[8] Pattern Forming Method

The resist composition of the present invention is used by dissolving the above-described components in a predetermined organic solvent, preferably a mixed solvent described above, and coating the obtained solution on a predetermined support as follows.

For example, the resist composition is coated on a substrate (e.g., silicon/silicon dioxide-coated substrate) as used in the production of a precision integrated circuit device, by an appropriate coating method such as spinner or coater, and dried to form a photosensitive film.

The formed photosensitive film is irradiated with actinic rays or radiation through a predetermined mask, preferably baked (heated), and then developed, whereby a good pattern can be obtained.

At the irradiation with actinic rays or radiation, the exposure may be performed by filling a liquid having a refractive index higher than that of air between the photosensitive film and the lens (immersion exposure). By this exposure, resolution can be elevated.

Examples of the actinic ray or radiation include infrared light, visible light, ultraviolet light, far ultraviolet light, X-ray and electron beam. Among these, preferred is far ultraviolet light at a wavelength of 250 nm or less, more preferably 220 nm or less. Specifically, a KrF excimer laser (248 nm), an ArF excimer laser (193 nm), an $F_2$ excimer laser (157 nm), an X-ray, an electron beam and the like are used. A KrF excimer laser (248 nm), EUV (13 nm) and an electron beam are more preferred.

In the development step, an alkali developer is used as follows. The alkali developer usable for the resist composition is an alkaline aqueous solution such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimethylethanolamine, triethanolamine), quaternary ammonium salts (e.g., tetramethylammonium hydroxide, tetraethylammonium hydroxide) and cyclic amines (e.g., pyrrole, piperidine).

In the alkali developer, alcohols and a surfactant may also be added in an appropriate amount.

The alkali concentration of the alkali developer is usually from 0.1 to 20 mass %.

The pH of the alkali developer is usually from 10.0 to 15.0.

EXAMPLES

The present invention is described in greater detail below by referring to Examples, but the present invention should not be construed as being limited thereto.

<Compound (Z)>

Synthesis Example 1

Synthesis of 10-tolyl-9-oxothioxanthenium nonafluorobutanesulfonate (Z-1)

Thioxanthen-9-one (10 g) was stirred in 40 ml of trifluoroacetic acid, and a solution prepared by mixing 5.4 ml of aqueous 30% hydrogen peroxide and 10.8 ml of trifluoroacetic acid was gradually added thereto under ice cooling. The resulting solution was stirred for 30 minutes under ice cooling and then stirred at room temperature for 1 hour. The reaction solution obtained was poured in water, and the crystal precipitated was collected by filtration. The obtained crystal was recrystallized from acetonitrile to obtain 4.6 g of a sulfoxide form. Subsequently, 3 g of the sulfoxide form was stirred in 20 ml of toluene, and 3.7 ml of trifluoroacetic anhydride and 2.2 ml nonafluorobutanesulfonic acid were added thereto under ice cooling. The reaction solution obtained was gradually heated to room temperature and then stirred for 1 hour. The crystal was precipitated by adding diisopropyl ether to the reaction solution and then recrystallized from a mixed solvent of ethyl acetate and diisopropyl ether to obtain 3.9 g of 10-tolyl-9-oxothioxanthenium nonafluorobutanesulfonate (Z-1).

$^1$H-NMR (400 MHz, CDCl$_3$): δ 2.38 (s, 3H), 7.34 (d, 2H), 7.72 (m, 2H), 7.95 (m, 4H), 8.28 (m, 2H), 8.63 (d, 2H).

Synthesis Example 2

Synthesis of 10-tolyl-9-oxothioxanthenium 3,5-bistrifluoromethylbenzenesulfonate (Z-2)

This compound was synthesized using 1.5 g of 10-tolyl-9-oxothioxanthenium nonafluorobutanesulfonate (Z-1) obtained in Synthesis Example 1. 10-Tolyl-9-oxothioxanthenium nonafluorobutanesulfonate (1.5 g) was dissolved in a methanol/water (=1/1) solution, and the resulting solution was passed through an ion exchange resin (Amberlite IRA402C1 in which the anion is replaced by OH with use of aqueous NaOH). After adding 1 g of 3,5-bistrifluoromethylbenzenesulfonic acid thereto, the solution was extracted with chloroform to obtain 1.7 g of 10-tolyl-9-oxothioxanthenium 3,5-bistrifluoromethylbenzene-sulfonate (Z-2) as a compound changed in the counter salt.

$^1$H-NMR (400 MHz, CDCl$_3$): δ 2.37 (s, 3H), 7.34 (d, 2H), 7.79 (m, 3H), 7.93 (m, 4H), 8.34 (m, 4H), 8.62 (d, 2H).

Synthesis Example 3

Synthesis of 2-acetyl-10-tolyl-9-oxothioxanthenium nonafluorobutanesulfonate (Z-8)

Thiosalicylic acid (15 g) and 20 g of 4-bromoacetophenone were stirred in 200 ml of dimethylformamide in the presence of 12 g of sodium carbonate and 0.2 g of a copper catalyst at 170° C. for 6 hours, and the reaction solution obtained was poured in an aqueous hydrochloric acid solution and filtered. The collected crystal was recrystallized from acetonitrile to obtain 16 g of sulfide. Subsequently, 10 g of the sulfide obtained was stirred in 100 g of polyphosphoric acid at 60° C. for 5 hours and then poured in ice water. The crystal was collected by filtration, washed with an aqueous sodium hydrogencarbonate solution and water, and then recrystallized from ethanol to obtain 5 g of 2-acetyl-9H-thioxan-9-one. Furthermore, 3 g of 2-acetyl-9H-thioxan-9-one obtained was stirred in 12 ml of trifluoroacetic acid under ice cooling, and a mixed solution containing 1.4 ml of aqueous 30% hydrogen peroxide and 2.7 ml of trifluoroacetic acid was gradually added thereto. After the addition, the solution was stirred for 30 minutes under ice cooling and then stirred at room temperature for 1 hour, thereby completing the reaction. The reaction solution obtained was poured in water and subjected to liquid separation with ethyl acetate and an aqueous sodium hydroxide solution, and the organic layer was removed by distillation under reduced pressure to obtain 3.6 g of a sulfoxide form. This sulfoxide form was stirred in 15 g of toluene, and 3.3 ml of trifluoroacetic anhydride and 1.9 ml of nonafluorobutanesulfonic acid were added thereto under ice cooling, followed by stirring for 30 minutes under ice cooling and then at room temperature for 1 hour. The reaction solution obtained was subjected to crystallization by adding diisopropyl ether, and the crystal obtained was recrystallized from a mixed solvent of ethyl acetate and diisopropyl ether to obtain 1 g of 2-acetyl-10-tolyl-9-oxothioxanthenium nonafluorobutanesulfonate (Z-8).

$^1$H-NMR (400 MHz, CDCl$_3$): δ 2.39 (s, 3H), 2.74 (s, 3H), 7.37 (d, 2H), 7.72 (m, 2H), 7.97 (m, 2H), 8.19 (m, 1H), 8.39 (m, 2H), 8.67 (d, 1H), 9.09 (s, 1H).

Synthesis Example 4

Synthesis of (Z-40)

Thianthrene (20 g) was refluxed in 300 ml of acetic acid, and 36 ml of dilute nitric acid was gradually added dropwise thereto. After allowing the reaction to proceed for 5 hours, the reaction solution obtained was poured in 1.2 liter of water to precipitate a crystal. The crystal was collected by filtration and then recrystallized from acetonitrile to obtain 12 g of thianthrene-5-oxide.

$^1$H-NMR (400 MHz, CDCl$_3$): δ 7.42 (t, 2H), 7.56 (t, 2H), 7.63 (d, 2H), 7.93 (d, 2H).

Subsequently, 2 g of thianthrene-S-oxide was dissolved in 10 ml of toluene and ice-cooled, and 2.8 ml of trifluoroacetic anhydride and 1.2 ml of nonafluorobutanesulfonic acid were added thereto, followed by stirring for 1 hour. Furthermore, diisopropyl ether was added thereto and after removing the supernatant, the residue was purified through a silica gel column (chloroform/methanol=19/1) to obtain 4.4 g of 5-(p-tolyl)thianthrenium nonafluorobutanesulfonate.

$^1$H-NMR (400 MHz, CDCl$_3$): δ 2.34 (s, 3H), 7.08 (d, 2H), 7.22 (d, 2H), 7.78 (m, 6H), 8.65 (d, 2H).

Thereafter, 2 g of 5-(p-tolyl)thianthrenium nonafluorobutanesulfonate was suspended in 6 ml of trifluoroacetic acid, and 0.75 ml of aqueous 30% hydrogen peroxide was added dropwise thereto at room temperature. The resulting solution was stirred at 80° C. for 1 hour and then subjected to liquid separation by adding water and chloroform. The chloroform layer was removed by distillation under reduced pressure, and the residue was purified through a silica gel column (chloroform/methanol=19/1) to obtain 1.2 g of (Z-40).

$^1$H-NMR (400 MHz, CDCl$_3$): δ 2.47 (s, 3H), 7.47 (d, 2H), 7.66 (d, 2H), 7.98 (t, 2H), 8.04 (t, 2H), 8.40 (d, 2H), 8.43 (d, 2H).

Synthesis Example 5

Synthesis of (Z-73)

Thianthrene-5-oxide (1 g) and 1.1 ml of ethoxybenzene were mixed and ice-cooled, and 1.2 ml of trifluoroacetic anhydride and 0.71 ml of nonafluorobutanesulfonic acid were added thereto, followed by stirring for 15 minutes. Subsequently, diisopropyl ether was added thereto and after removing the supernatant, the residue was subjected to liquid separation by adding chloroform and water. The chloroform layer was removed by distillation under reduced pressure to obtain 2.5 g of 5-(p-ethoxybenzene)thianthrenium nonafluorobutanesulfonate.

$^1$H-NMR (400 MHz, CDCl$_3$): δ 1.38 (t, 3H), 4.00 (q, 2H), 6.92 (d, 2H), 7.29 (d, 2H), 7.75 (m, 6H), 8.56 (d, 2H).

Thereafter, 2.5 g of 5-(p-ethoxybenzene)thianthrenium nonafluorobutanesulfonate was suspended in 10 ml of trifluoroacetic acid and ice-cooled, and 0.89 ml of aqueous 30% hydrogen peroxide was added dropwise thereto, followed by stirring for 1 hour. After the reaction, the reaction solution obtained was poured in water and subjected to liquid separation by adding chloroform. The chloroform layer was removed by distillation under reduced pressure, and the residue was recrystallized from a mixed solvent of diisopropyl ether and ethyl acetate to obtain 1.3 g of (Z-73).

$^1$H-NMR (400 MHz, CDCl$_3$): δ 1.47 (t, 3H), 4.20 (q, 2H), 7.26 (d, 2H), 7.91 (m, 6H), 7.98 (m, 2H), 8.39 (d, 2H).

Compounds (Z-1) to (Z-105) except for those obtained above were synthesized in the same manner. Compounds (Z-106) to (Z-122) were synthesized by a known method described, for example, in JP-A-2003-149800.

<Compound (B)>

The structure, weight average molecular weight, dispersity and compositional ratio (by mol) of the compound (B) used in Examples are shown below.

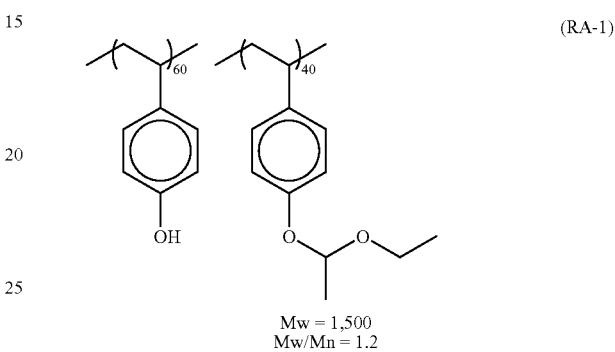

(RA-1)

Mw = 1,500
Mw/Mn = 1.2

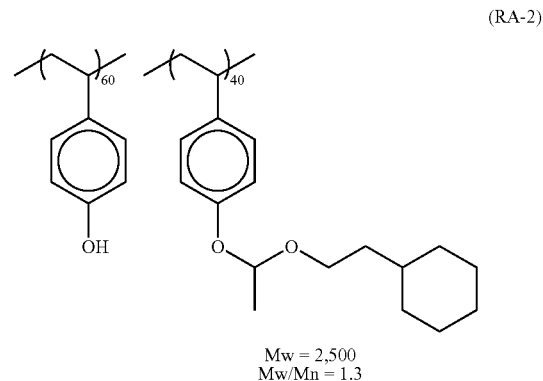

(RA-2)

Mw = 2,500
Mw/Mn = 1.3

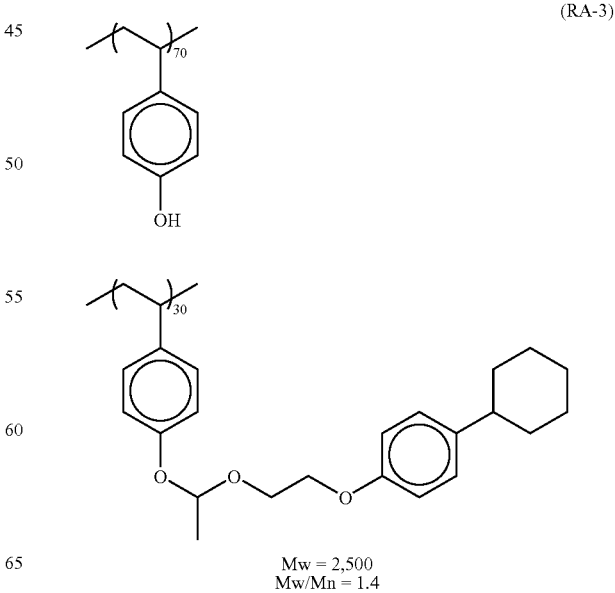

(RA-3)

Mw = 2,500
Mw/Mn = 1.4

(RA-4)
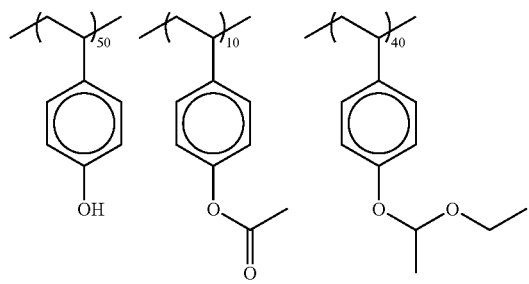
Mw = 2,500
Mw/Mn = 1.5
(RA-5)
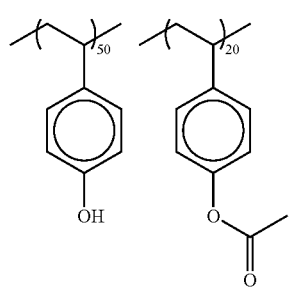
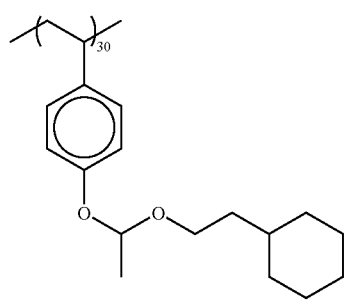
Mw = 2,500
Mw/Mn = 1.3
(RA-6)
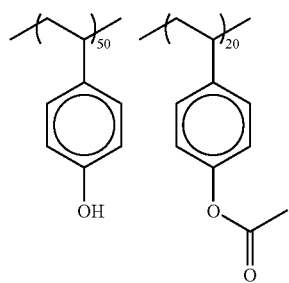
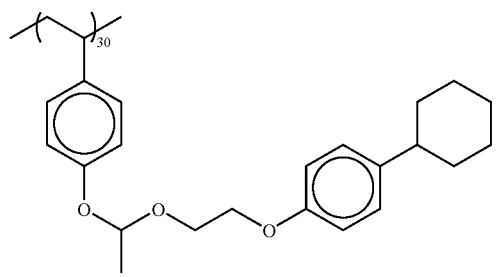
Mw = 2,500
Mw/Mn = 1.4
(RA-7)
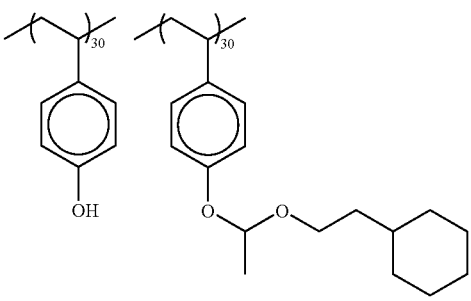
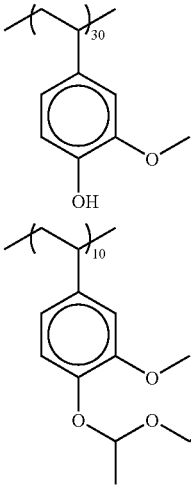
Mw = 2,500
Mw/Mn = 1.4
(RA-8)
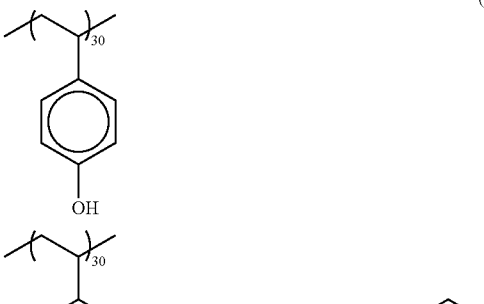

-continued
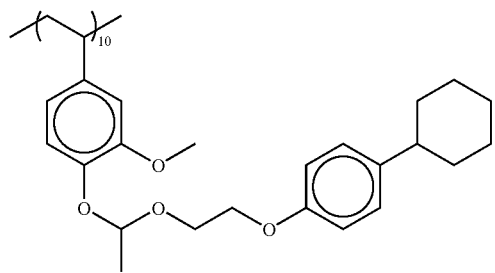
Mw = 3,500
Mw/Mn = 1.4
(RA-9)
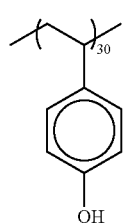
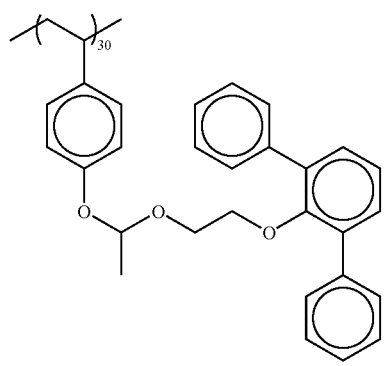
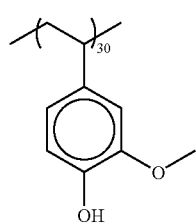
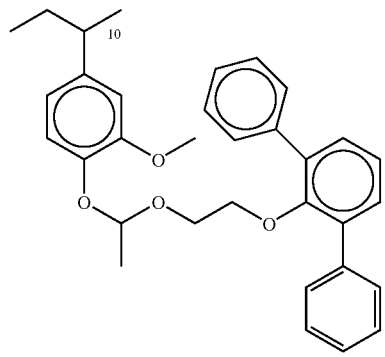
Mw = 3,500
Mw/Mn = 1.4
-continued
(RA-10)
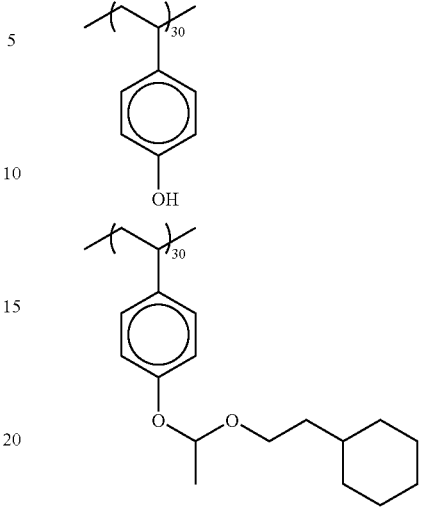
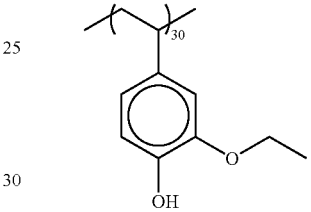
Mw = 4,000
Mw/Mn = 1.4
(RA-11)
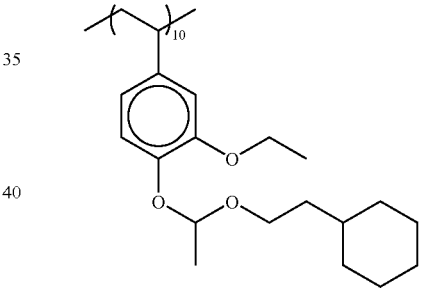
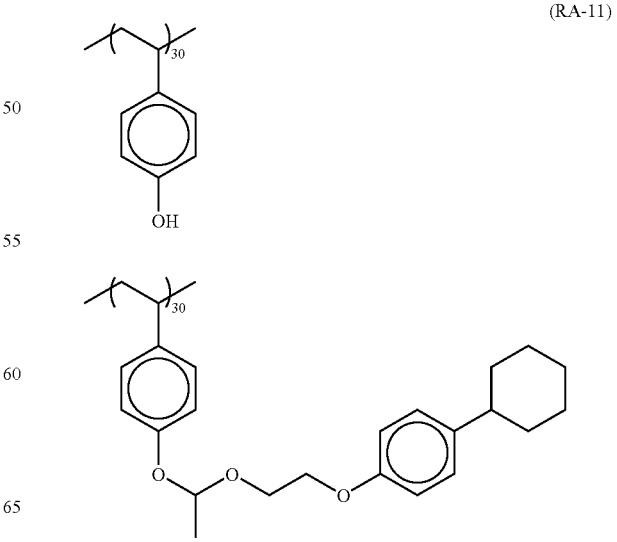

-continued
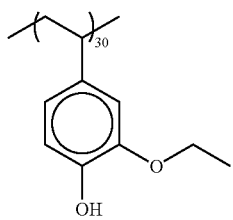
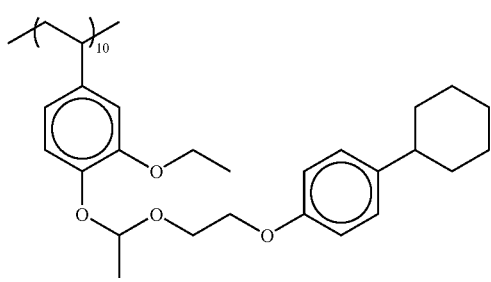
Mw = 2,500
Mw/Mn = 1.4
(RA-12)
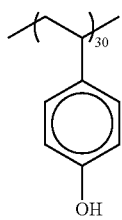
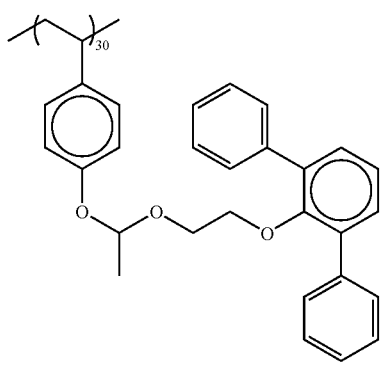
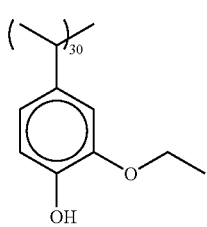
-continued
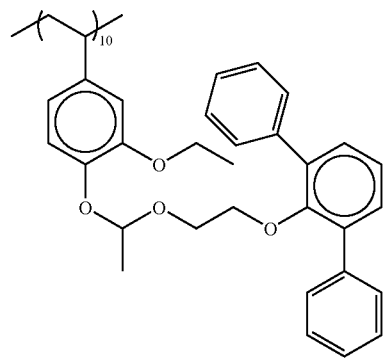
Mw = 2,500
Mw/Mn = 1.4
(RA-13)
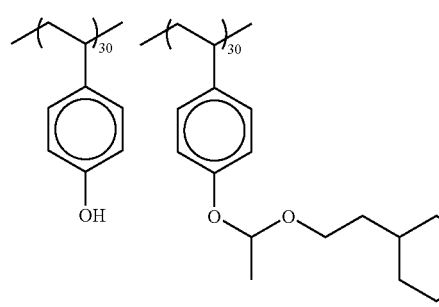
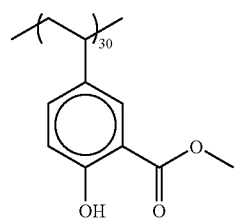
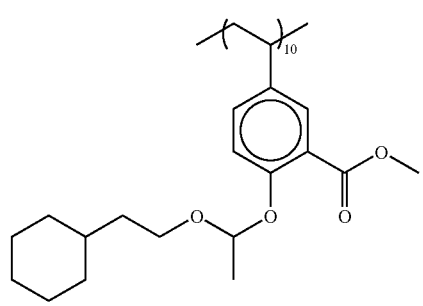
Mw = 2,500
Mw/Mn = 1.3
(RA-14)
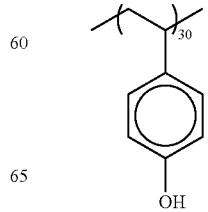

-continued
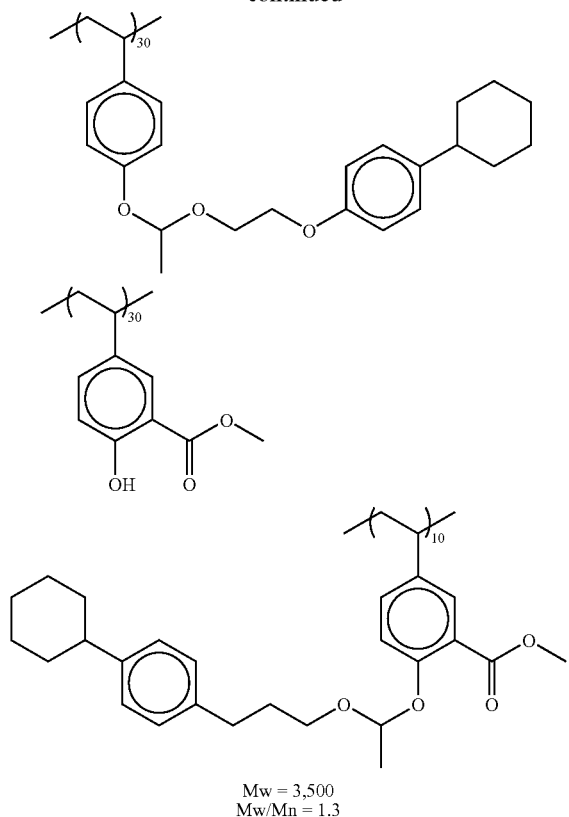
(RA-15)
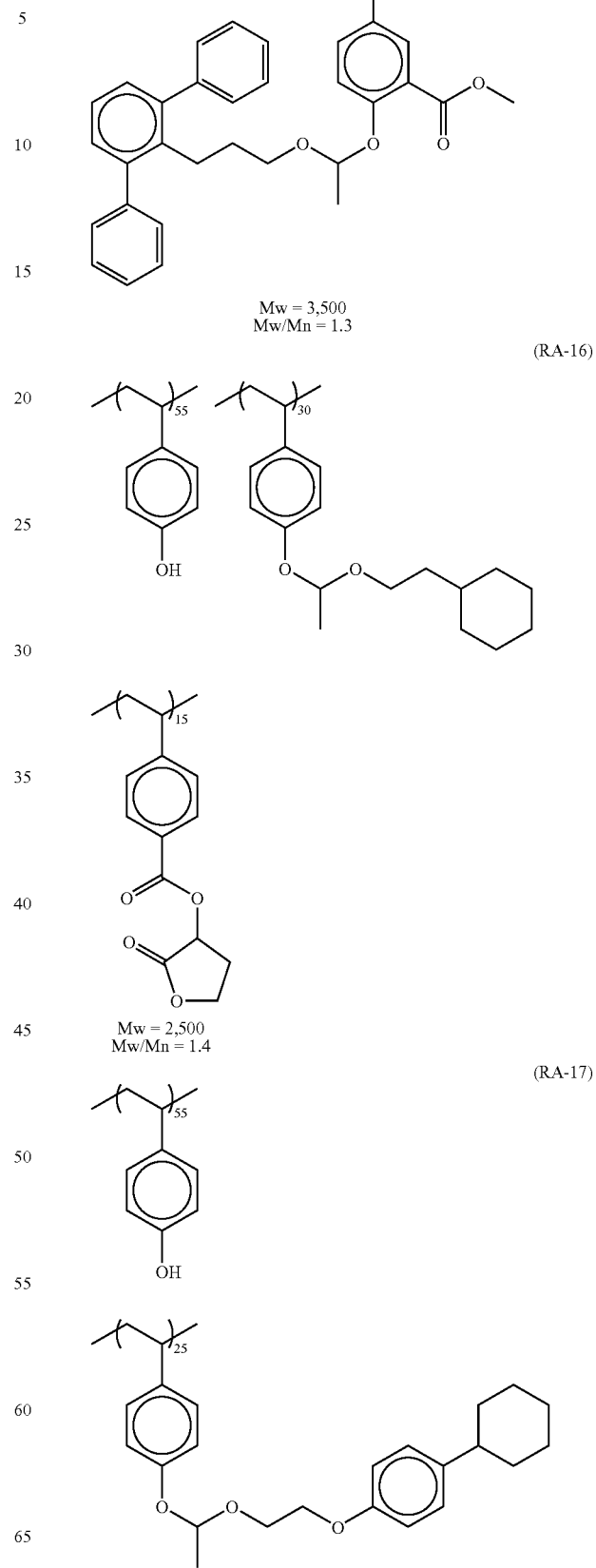
(RA-16)
(RA-17)

-continued
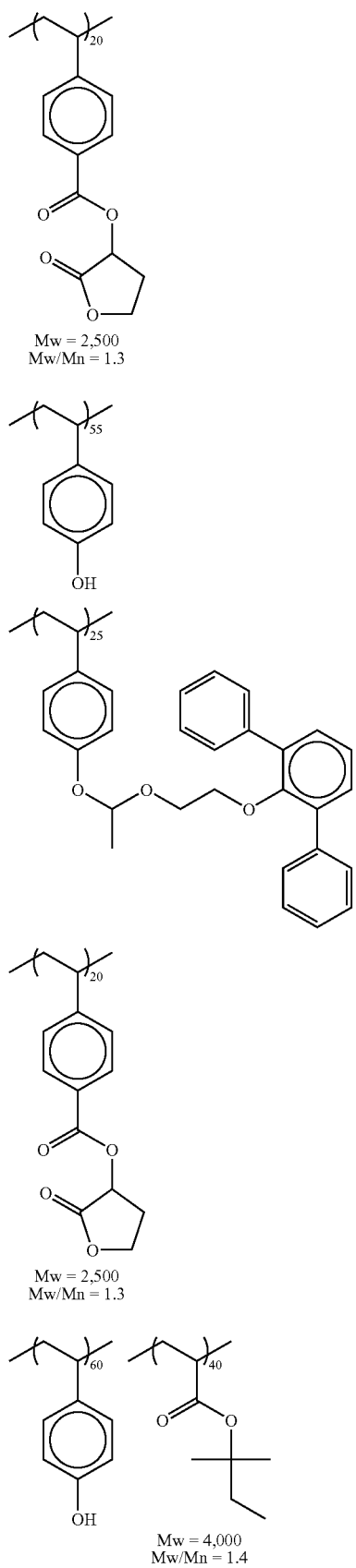
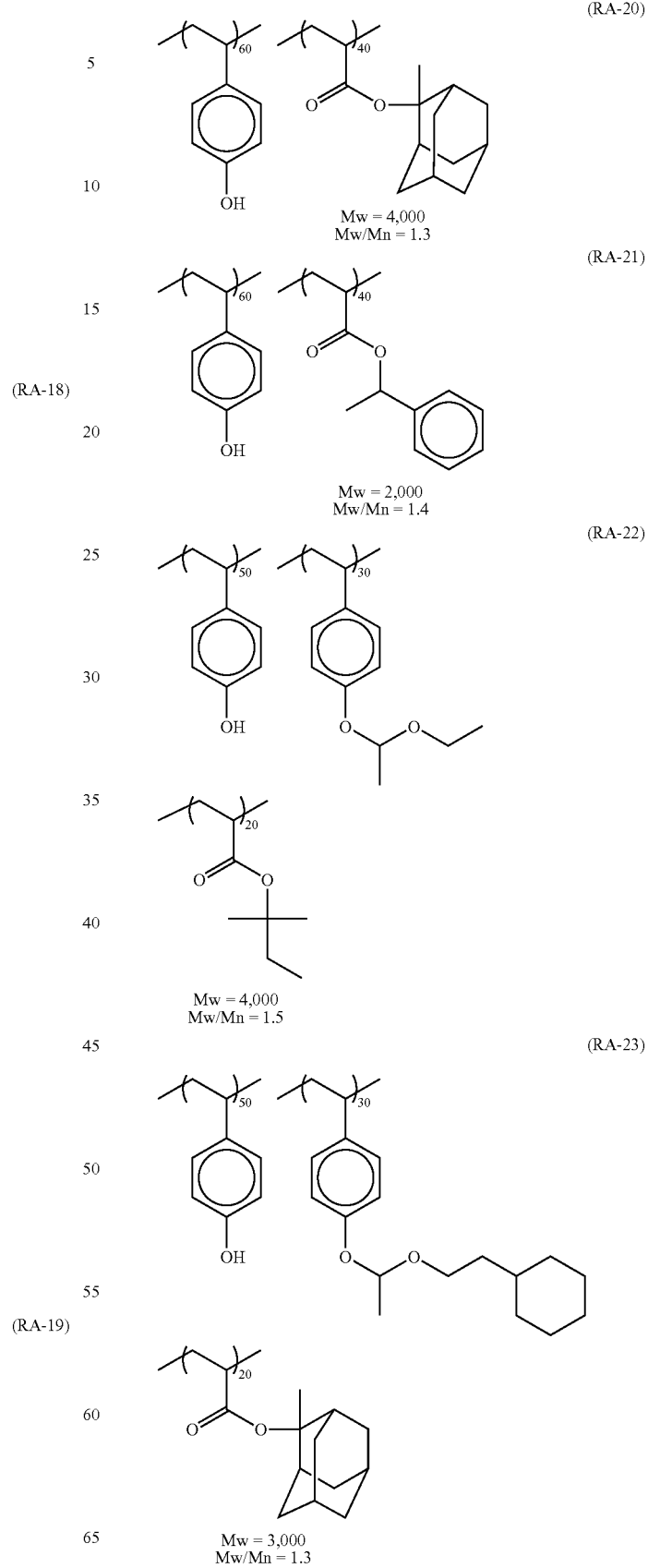

-continued
(RA-24)
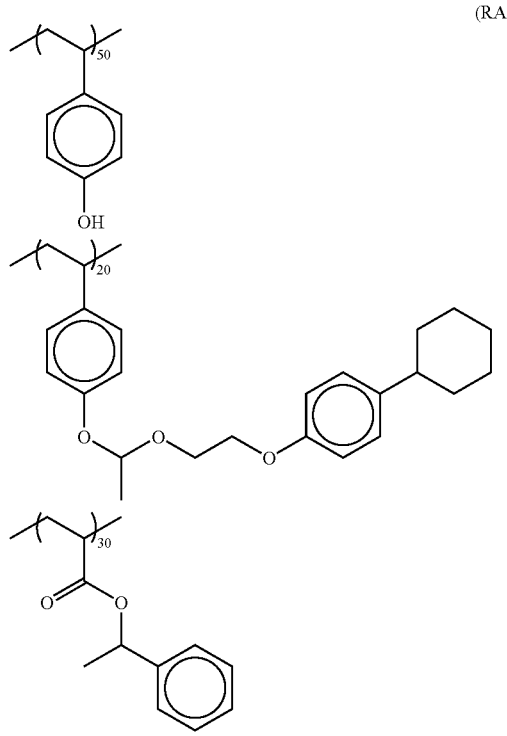
Mw = 2,000
Mw/Mn = 1.4
(RA-25)
(RA-26)
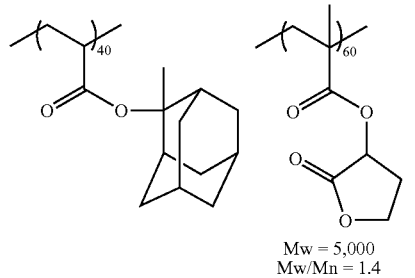
Mw = 5,000
Mw/Mn = 1.4
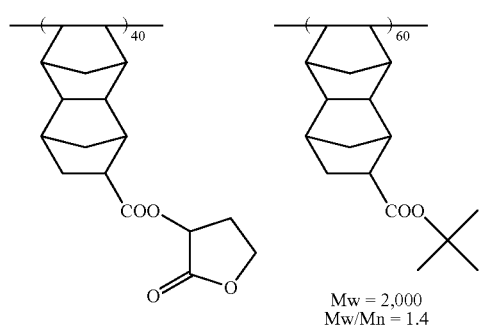
Mw = 2,000
Mw/Mn = 1.4
(RA-27)
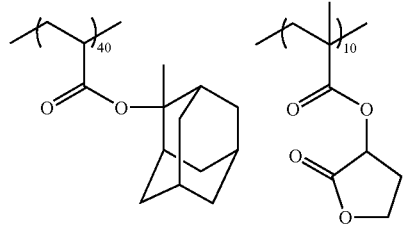
-continued
(RA-28)
(RA-29)
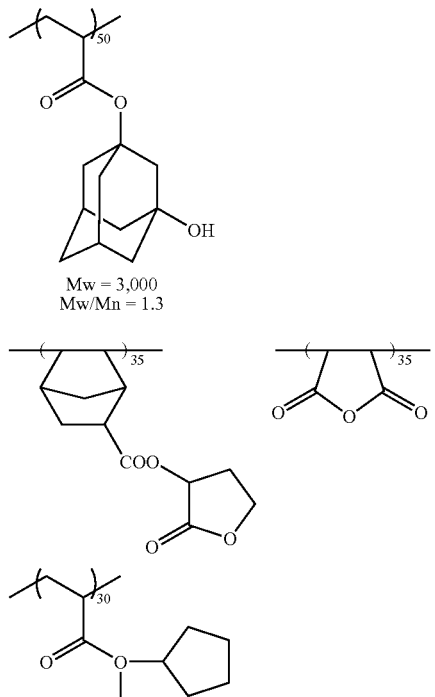
Mw = 3,000
Mw/Mn = 1.3
Mw = 4,000
Mw/Mn = 1.4
Mw = 3,000
Mw/Mn = 1.5
(Polymer-1)
Mw = 7000
Mw/Mn = 1.2

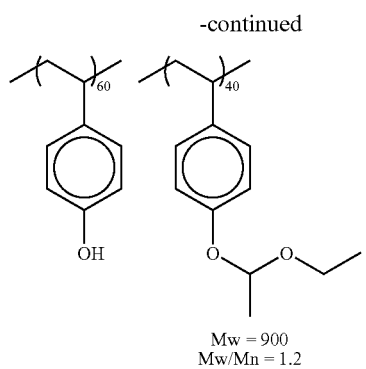

(Polymer-2)

Mw = 900
Mw/Mn = 1.2

<Compound (A)>

Synthesis Example of Compound A-1

In a 1,000 ml-volume three-neck flask equipped with a 100-ml dropping funnel and a nitrogen inlet tube, 34.4 g (200 mmol) of sulfanylamide was charged and then dissolved in 200 ml of 10% NaOH, and the resulting solution was stirred under ice cooling. Subsequently, 55.3 g (200 mmol) of 1-octanesulfonyl chloride was added dropwise through the dropping funnel over 1 hour. After the dropwise addition, the mixed solution was stirred under ice cooling for 1 hour, the ice bath was then removed, and the solution was further stirred at room temperature for 3 hours. Thereafter, the reaction solution was rendered neutral by adding dropwise thereto concentrated hydrochloric acid, and the precipitated white solid was collected by filtration. This solid was then recrystallized from water/methanol to obtain 45.1 g of the following compound as a plate-like crystal.

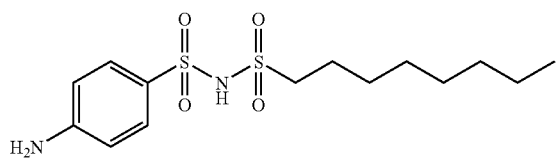

Separately, 16.1 g (46.9 mmol) of triphenylsulfonium bromide and 12.4 g (53.5 mmol) of silver oxide were added to 150 ml of methanol, followed by stirring at room temperature for 2 hours. After removing the silver salt by filtration, 16.34 g (46.9 mmol) of the compound above was added to the filtrate, and this solution was further stirred for 1 hour. Subsequently, the solvent was removed and after adding 200 ml of chloroform to the residue, the organic layer was washed with water. The solvent was then removed, and the residue was dried to obtain 20.9 g of a white solid.

$^1$H-NMR (400 MHz, CD$_3$OD): δ 0.93 (t, 3H), 1.34-1.46 (m, 10H), 1.81 (quin, 2H), 3.24 (t, 2H), 6.78 (d, 2H), 7.66-7.78 (m, 17H).

Synthesis Example of Compound A-6

Triphenylsulfonium bromide (8.01 g (23.34 mmol)) and 5.68 g (24.51 mmol) of silver oxide were added to 100 ml of methanol, followed by stirring at room temperature for 2 hours. After removing the silver salt by filtration, 5.0 g (23.34 mmol) of sulfacetamide as the compound above was added to the filtrate, and the solution was further stirred for 1 hour. Thereafter, the solvent was removed, and the residue was dried to obtain 10.0 g of a white solid.

$^1$H-NMR (400 MHz, CD$_3$OD): δ 1.84 (s, 3H), 6.63 (d, 2H), 7.63 (d, 2H), 7.78-7.87 (m, 15H).

Synthesis Example of Compound A-8

In a nitrogen stream, a mixture containing 5.0 g (15.8 mmol) of 1,1,2,2,3,3-hexafluoropropane-1,3-disulfonyl difluoride and 50 ml of THF was ice-cooled, and a mixed solution containing 1.66 g (16.6 mmol) of 1-methylpiperazine, 10 ml of triethylamine and 50 ml of THF was added dropwise thereto over 60 minutes. The resulting solution was stirred under ice cooling for 1 hour and further stirred at room temperature for 1 hour. Thereafter, the organic layer was washed with water, an aqueous saturated ammonium chloride solution and water in this order and then dried over sodium sulfate. After concentrating the solvent, 2.36 g (15.8 mmol) of trifluoromethanesulfonamide and 10 ml of triethylamine were added to the residue, and this mixture was transferred to a pressure-resistant glass tube and stirred at 100° C. for 20 hours in the sealed tube. Subsequently, 100 ml of chloroform was added, and the organic layer was washed with water and then dried over sodium sulfate to obtain a brown oil. This oil was then rendered neutral by adding thereto 25 ml of methanol and 60 ml of 1.5N—HCl, and the precipitated white solid was collected by filtration to obtain 5.65 g of the following compound.

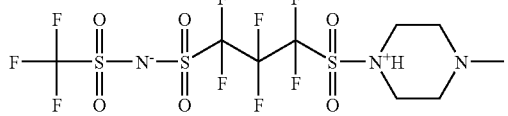

The solid (4.0 g) obtained above was dissolved in a mixed solvent containing 100 ml of methanol and 40 ml of 1M-NaOH and after adding 2.61 g (7.61 mmol) of triphenylsulfonium bromide, the solution was stirred at room temperature for 3 hours. Thereafter, 200 ml of chloroform was added thereto, the organic layer was washed with water, the solvent was removed, and the residue was purified by column chromatography (SiO$_2$, chloroform/methanol=10/1) to obtain the objective compound (4.56 g) as a white solid.

$^1$H-NMR (400 MHz, CDCl$_3$): δ 2.32 (s, 3H), 2.50 (m, 4H), 3.55 (m, 4H), 7.65-7.80 (m, 15H).

$^{19}$F-NMR (400 MHz, CDCl$_3$): δ–118.5 (m, 2F), –112.3 (m, 2F), –111.1 (m, 2F), –78.6 (m, 3F).

Other compounds were synthesized in the same manner.

EXAMPLES i) Preparation of Resist Composition

Example 1

| | |
|---|---:|
| Component B (RA-1) | 1.255 g |
| Acid generator (Z-4) | 0.0759 g |
| Component A (A-38) | 0.02 g |
| Surfactant (W-4) | 0.002 g |

These components were dissolved in a solvent shown in Table 1 below to prepare a solution having a solid content concentration of 6.5 mass %, and this solution was filtered through a 0.1-μm polytetrafluoroethylene-made filter to obtain a resist solution. The resist solutions of other Examples and Comparative Examples were obtained in the same manner as above.

(ii) Production and Evaluation of Pattern (EB)

The positive resist solution obtained above was uniformly coated on a hexamethyldisilazane-treated silicon wafer by using a spin coater and dried under heating at 120° C. for 90 seconds to form a positive resist film having a thickness of 0.15 μm. This resist film was then irradiated with electron beams by using an electron beam image-drawing apparatus (HL750, manufactured by Hitachi Ltd., accelerating voltage: 50 KeV). After the irradiation, the resist film was baked at 110° C. for 90 seconds, dipped in an aqueous 2.38 mass % tetramethylammonium hydroxide (TMAH) solution for 60 seconds, rinsed with water for 30 seconds and dried. The obtained pattern was evaluated by the following methods.

[Sensitivity]

The cross-sectional profile of the pattern obtained was observed using a scanning electron microscope (S-4800, manufactured by Hitachi, Ltd.). The minimum irradiation energy when resolving a 150-nm line (line:space=1:1) was defined as the sensitivity.

[Resolution]

The line size (line:space=1:1) when despite partial occurrence of pattern collapse, the line and space were separated and resolved with the irradiation dose giving the sensitivity above, was called a critical resolving size and defined as the resolution.

[Line Edge Roughness (LER)]

With respect to the region of 5 μm-edge in the longitudinal direction of a 150-nm line pattern at the irradiation dose giving the sensitivity above, the distance from a reference line where the edge should be present was measured at arbitrary 30 points by a scanning electron microscope (S-9220, manufactured by Hitachi, Ltd.). Based on the results, the standard deviation was determined, and 3σ was calculated. As the value is smaller, the performance is better.

[Dimension Before Collapse]

The line size (line:space=1:1) when the line and space were separated and resolved with the irradiation dose giving the sensitivity above while not causing pattern collapse at all was defined as the dimension before collapse and used as an index for the suppression of collapse. As the value is smaller, the performance is better.

[Outgas]

The outgas was evaluated by the fluctuation rate of the film thickness when a minimum irradiation energy for resolving a 150-nm line (line:space=1:1) was irradiated.

Outgas=((film thickness before exposure)−(film thickness after exposure))/(film thickness before exposure)×100

Here, the film thickness after exposure indicates the film thickness immediately after exposure, that is, the film thickness before entering PEB and alkali development steps. As the value is smaller, the performance is better.

TABLE 1

| Example | Component B (1.255 g) | Acid Generator (0.0759 g) | Component A (0.02 g) | Basic Compound (g) | Surfactant (0.002 g) | Solvent (mass ratio) | Sensitivity (μC/cm$^2$) | Resolution (nm) | LER (nm) | Dimension Before Collapse (nm) | Outgas (%) |
|---|---|---|---|---|---|---|---|---|---|---|---|
| 1 | RA-1 | Z-4 | A-38 | none | W-4 | S-1/S-2 (8/2) | 10 | 75 | 6.1 | 87.5 | 3 |
| 2 | RA-2 | Z-4 | A-43 | none | W-3 | S-1/S-3 (6/4) | 10 | 62.5 | 6.2 | 75 | 2.8 |
| 3 | RA-3 | Z-4 | A-8 | none | W-3 | S-1/S-4 (8/2) | 10 | 62.5 | 6.3 | 75 | 2.4 |
| 4 | RA-4 | Z-5 | A-9 | none | W-3 | S-1/S-4 (8/2) | 10 | 62.5 | 6.4 | 75 | 3 |
| 5 | RA-4 | Z-5 | A-9 (0.01 g) | N-3 (0.002 g) | W-3 | S-1/S-4 (8/2) | 11 | 62.5 | 6.2 | 75 | 3 |
| 6 | RA-5 | Z-4 | A-8 | none | W-4 | S-1/S-2 (8/2) | 10 | 62.5 | 6.4 | 75 | 2.8 |
| 7 | RA-6 | Z-4 | A-21 | none | W-3 | S-1/S-3 (6/4) | 10 | 75 | 6.4 | 87.5 | 2.4 |
| 8 | RA-7 | Z-4 | A-16 | none | W-3 | S-1/S-4 (8/2) | 10 | 62.5 | 6.4 | 75 | 3 |
| 9 | RA-8 | Z-4 | A-38 | none | W-4 | S-1/S-2 (8/2) | 10 | 75 | 6.4 | 75 | 3 |
| 10 | RA-9 | Z-4 | A-43 | none | W-3 | S-1/S-3 (6/4) | 10 | 75 | 6.4 | 75 | 3.1 |
| 11 | RA-10 | Z-4 | A-21 | none | W-3 | S-1/S-4 (8/2) | 11 | 75 | 6.4 | 87.5 | 3 |
| 12 | RA-11 | Z-4 | A-16 | none | W-4 | S-1/S-2 (8/2) | 10 | 62.5 | 6.4 | 75 | 3 |
| 13 | RA-12 | Z-4 | A-38 | none | W-3 | S-1/S-3 (6/4) | 10 | 62.5 | 6.4 | 75 | 3 |
| 14 | RA-13 | Z-4 | A-21 | none | W-3 | S-1/S-4 (8/2) | 11 | 62.5 | 6.4 | 75 | 2.8 |
| 15 | RA-14 | Z-5 | A-22 | none | W-3 | S-1/S-4 (8/2) | 11 | 62.5 | 6.4 | 75 | 3 |
| 16 | RA-15 | Z-4 | A-9 (0.01 g) | none | W-4 | S-1/S-2 (8/2) | 11 | 62.5 | 6.4 | 75 | 3.1 |
| 17 | RA-15 | Z-4 | A-9 (0.01 g) | N-1 (0.002 g) | W-4 | S-1/S-2 (8/2) | 11 | 62.5 | 6.7 | 75 | 3.1 |

TABLE 1-continued

| Example | Component B (1.255 g) | Acid Generator (0.0759 g) | Component A (0.02 g) | Basic Compound (g) | Surfactant (0.002 g) | Solvent (mass ratio) | Sensitivity (μC/cm$^2$) | Resolution (nm) | LER (nm) | Dimension Before Collapse (nm) | Outgas (%) |
|---|---|---|---|---|---|---|---|---|---|---|---|
| 18 | RA-16 | Z-4 | A-21 | none | W-3 | S-1/S-3 (6/4) | 10 | 75 | 6.4 | 87.5 | 3 |
| 19 | RA-17 | Z-4 | A-16 | none | W-3 | S-1/S-4 (8/2) | 10 | 75 | 6.7 | 87.5 | 3.1 |

TABLE 2

| Example | Component B (1.255 g) | Acid Generator (0.0759 g) | Component A (0.02 g) | Basic Compound (g) | Surfactant (0.002 g) | Solvent (mass ratio) | Sensitivity (μC/cm$^2$) | Resolution (nm) | LER (nm) | Dimension Before Collapse (nm) | Outgas (%) |
|---|---|---|---|---|---|---|---|---|---|---|---|
| 20 | RA-18 | Z-55 | A-8 | none | W-3 | S-1/S-2 (8/2) | 11 | 62.5 | 6.4 | 75 | 3 |
| 21 | RA-19 | Z-2 | A-21 | none | W-1 | S-1/S-3 (6/4) | 10 | 75 | 6.3 | 87.5 | 2.9 |
| 22 | RA-20 | Z-66 | A-16 | none | W-1 | S-1/S-4 (8/2) | 10 | 75 | 6.4 | 87.5 | 2.9 |
| 23 | RA-21 | Z-4 | A-16 | none | W-4 | S-1/S-2 (8/2) | 11 | 62.5 | 6.4 | 75 | 2.8 |
| 24 | RA-22 | Z-4 | A-21 | none | W-3 | S-1/S-3 (6/4) | 10 | 75 | 6.3 | 87.5 | 2.9 |
| 25 | RA-23 | Z-4 | A-8 | none | W-3 | S-1/S-4 (8/2) | 10 | 75 | 6.3 | 87.5 | 3 |
| 26 | RA-24 | Z-5 | A-9 | none | W-4 | S-1/S-4 (8/2) | 11 | 75 | 6.4 | 87.5 | 3 |
| 27 | RA-25 | Z-55 | A-9 | none | W-3 | S-1/S-2 (8/2) | 10 | 75 | 6.4 | 87.5 | 2.8 |
| 28 | RA-26 | Z-2 | A-16 | none | W-1 | S-1/S-3 (6/4) | 10 | 62.5 | 6.5 | 75 | 3 |
| 29 | RA-27 | Z-66 | A-38 | none | W-1 | S-1/S-4 (8/2) | 10 | 62.5 | 6.5 | 75 | 3 |
| 30 | RA-28 | Z-66 | A-43 | none | W-1 | S-1/S-4 (8/2) | 10 | 62.5 | 6.5 | 75 | 2.7 |
| 31 | RA-29 | Z-55 | A-21 | none | W-3 | S-1/S-2 (8/2) | 10 | 75 | 6.7 | 87.5 | 3 |
| 32 | RA-3 (0.6 g) RA-28 (0.655 g) | Z-4 | A-38 | none | W-4 | S-1/S-2 (8/2) | 11 | 75 | 6.2 | 87.5 | 3 |
| 33 | RA-29 | Z-55 (0.04 g) Z-4 (0.0359 g) | A-21 | none | W-3 | S-1/S-2 (8/2) | 10 | 75 | 6.4 | 87.5 | 3 |
| 34 | RA-20 | Z-55 (0.04 g) Z-4 (0.0359 g) | A-1 (0.01 g) A-21 (0.01 g) | none | W-1 | S-1/S-4 (8/2) | 10 | 75 | 6.5 | 87.5 | 3 |
| 35 | RA-3 (0.6 g) RA-28 (0.655 g) | Z-4 | A-38 | none | W-4 | S-1/S-2 (8/2) | 11 | 75 | 6.2 | 87.5 | 3 |
| 36 | RA-29 | Z-114 | A-21 | none | W-3 | S-1/S-2 (8/2) | 12 | 75 | 7.3 | 100 | 4.9 |
| 37 | RA-6 | Z-122 | A-1 | none | W-4 | S-1/S-2 (8/2) | 10 | 75 | 6.5 | 75 | 3 |

TABLE 3

| Comparative Example | Resin (1.255 g) | Acid Generator (0.0759 g) | Component A (0.02 g) | Basic Compound (g) | Surfactant (0.002 g) | Solvent (mass ratio) | Sensitivity (μC/cm$^2$) | Resolution (nm) | LER (nm) | Dimension Before Collapse (nm) | Outgas (%) |
|---|---|---|---|---|---|---|---|---|---|---|---|
| 1 | T-1 | PAG-R | none | N-3 (0.004 g) | W-4 | S-1/S-2 (8/2) | 13 | 75 | 7.2 | 200 | 10 |
| 2 | T-1 | Z-4 | A-38 | none | W-4 | S-1/S-2 (8/2) | 9 | 75 | 6.5 | 200 | 4.3 |

TABLE 3-continued

| Comparative Example | Resin (1.255 g) | Acid Generator (0.0759 g) | Component A (0.02 g) | Basic Compound (g) | Surfactant (0.002 g) | Solvent (mass ratio) | Sensitivity ($\mu C/cm^2$) | Resolution (nm) | LER (nm) | Dimension Before Collapse (nm) | Outgas (%) |
|---|---|---|---|---|---|---|---|---|---|---|---|
| 3 | T-2 | PAG-R | none | N-3 (0.004 g) | W-4 | S-1/S-2 (8/2) | 13 | 75 | 7.5 | 200 | 14 |
| 4 | T-2 | Z-4 | A-38 | none | W-4 | S-1/S-2 (8/2) | 9 | 75 | 6.5 | 200 | 3 |
| 5 | RA-1 | PAG-R | A-38 | none | W-4 | S-1/S-2 (8/2) | 10 | 75 | 6.1 | 87.5 | 15 |
| 6 | RA-1 | Z-4 | none | none | W-4 | S-1/S-2 (8/2) | 15 | 87.5 | 6.1 | 87.5 | 4.3 |
| 7 | Polymer-1 | Z-4 | A-1 | none | W-4 | S-1/S-2 (8/2) | 15 | 100 | 8 | 75 | 8 |
| 8 | Polymer-2 | Z-122 | A-1 | none | W-4 | S-1/S-2 (8/2) | 10 | 75 | 6.5 | 200 | 3 |

Abbreviations in Tables 1 to 3 indicate the followings.

<Resin>

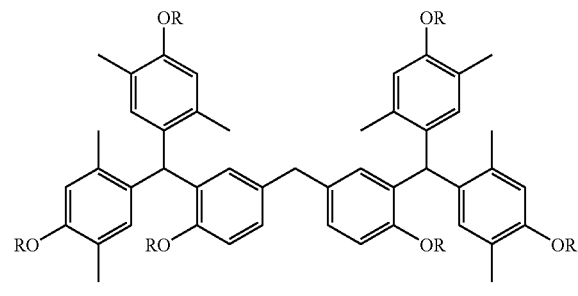

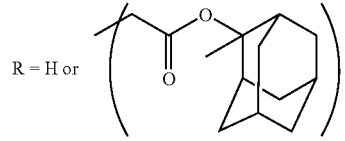
(T-1)

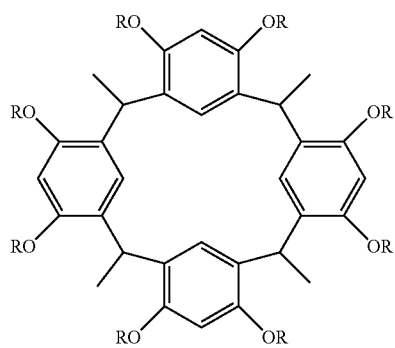

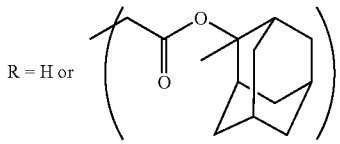
(T-2)

<Acid Generator>

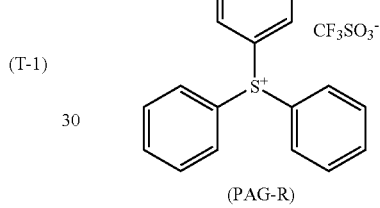
(PAG-R)

<Basic Compound>

N-1: Trioctylamine

N-2: 1,5-Diazabicyclo[4.3.0]-5-nonene

N3: 2,4,6-Triphenylimidazole

<Surfactant>

W-1: Megafac F176 (produced by Dainippon Ink & Chemicals, Inc.)

W-2: Megafac R08 (produced by Dainippon Ink & Chemicals, Inc.)

W-3: Troysol S-366 (produced by Troy Chemical)

W-4: Polyoxyethylene lauryl ether

<Solvent>

S-1: Propylene glycol monomethyl ether acetate

S-2: Propylene glycol monomethyl ether

S-3: Ethyl lactate

S-4: Cyclohexanone

It is seen from Tables 1 to 3 that the resist composition of the present invention succeeded in enhancing the performance against outgas without deteriorating its performance in view of resolution, LER and pattern collapse, as compared with the resist compositions of Comparative Examples.

Using the resist composition in each of Examples 1, 2, 4, 6 and 8 and Comparative Examples 1 and 2, a resist film was obtained in the same manner as in Example 1. The obtained resist film was subjected to surface exposure with EUV light (wavelength: 13.5 nm) by changing the exposure amount in steps of 0.5 mJ in the range from 0 to 20.0 mJ and baked at 110° C. for 90 seconds. Thereafter, the dissolution rate at each exposure amount was measured using an aqueous 2.38% tetramethylammonium hydroxide (TMAH) solution to obtain a sensitivity curve. The exposure amount when the dissolution rate of the resist was saturated in the sensitivity curve above was defined as the sensitivity and also, the dissolution contrast (γ value) was calculated from the gradient in the straight line part of the sensitivity curve. As the γ value is larger, the dissolution contrast is more excellent. The results obtained are designated as the results of Examples 38 to 42 and Comparative Examples 9 and 10, respectively.

The evaluation results are shown in Table 4.

TABLE 4

|  |  | Sensitivity (mJ/cm$^2$) | γ Value |
|---|---|---|---|
| Example | 38 | 10 | 7.9 |
|  | 39 | 9 | 8.5 |
|  | 40 | 9 | 7.8 |
|  | 41 | 9.5 | 8.7 |
|  | 42 | 10 | 8.7 |
| Comparative | 9 | 16 | 6.7 |
| Example | 10 | 17 | 7.0 |

It is seen from the results of Table 4 that the composition of the present invention exhibits good sensitivity and good dissolution contrast even in the EUV exposure.

According to the present invention, a photosensitive composition ensuring low line edge roughness and less occurrence of pattern collapse, and a pattern forming method using the photosensitive composition can be provided.

The entire disclosure of each and every foreign patent application from which the benefit of foreign priority has been claimed in the present application is incorporated herein by reference, as if fully set forth.

What is claimed is:

1. A resist composition, comprising:
(B) a polymer having a group capable of decomposing under an action of an acid and having a weight average molecular weight of 1,000 to 5,000, of which solubility in an alkali developer increases under an action of an acid;
(Z) a compound containing a sulfonium cation having a structure represented by formula (Z-I):

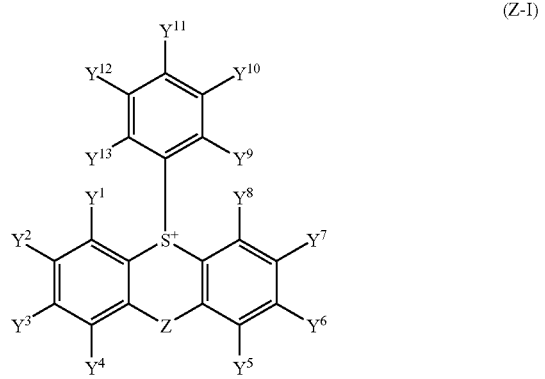

wherein $Y^1$ to $Y^{13}$ each independently represents a hydrogen atom or a substituent, and adjacent members of $Y^1$ to $Y^{13}$ may combine with each other to form a ring, Z represents a single bond or a divalent linking group; and
(A) a compound capable of generating a compound having a structure represented by the following formula (A-I) upon irradiation with actinic rays or radiation:

$$Q_1\text{-}X_1\text{—}NH\text{—}X_2\text{-}Q_2 \quad (A\text{-}I)$$

wherein $Q_1$ and $Q_2$ each independently represents a monovalent organic group, provided that at least one of $Q_1$ and $Q_2$ has a proton acceptor functional group, $Q_1$ and $Q_2$ may combine to form a ring and the ring formed may have a proton acceptor functional group; and $X_1$ and $X_2$ each independently represents —CO— or —SO$_2$—.

2. The resist composition according to claim 1, wherein at least one of $X_1$ and $X_2$ is —SO$_2$—.

3. The resist composition according to claim 1, wherein the compound having a structure represented by formula (A-I) is a compound having a structure represented by the following formula (A-II):

$$Q_1\text{-}X_1\text{—}NH\text{—}X_2\text{-}A\text{-}(X_3)_n\text{—}B\text{-}Q_3 \quad (A\text{-}II)$$

wherein $Q_1$ and $Q_3$ each independently represents a monovalent organic group, provided that at least one of $Q_1$ and $Q_3$ has a proton acceptor functional group, $Q_1$ and $Q_3$ may combine to form a ring and the ring formed may have a proton acceptor functional group;

$X_1$, $X_2$ and $X_3$ each independently represents —CO— or —SO$_2$—;

A represents a divalent linking group;
B represents a single bond, an oxygen atom or —N($Q_x$)-;
$Q_x$ represents a hydrogen atom or a monovalent organic group;
when B is —N($Q_x$)-, $Q_3$ and $Q_x$ may combine to form a ring; and
n represents 0 or 1.

4. The resist composition according to claim 3, wherein $X_1$, $X_2$ and $X_3$ each is —SO$_2$—.

5. The resist composition according to claim 3, wherein the proton acceptor functional group has a parital structure selected from the group consisting of a crown ether structure, an aza-crown ether structure, a tertiary amine structure, a secondary amine structure, a primary amine structure, a pyridine structure, an imidazole structure, a pyrazine structure and an aniline structure.

6. The resist composition according to claim 1, which further comprises a nitrogen-containing basic compound.

7. The resist composition according to claim 1, which further comprises a surfactant.

8. A pattern forming method, comprising:
forming a resist film from the resist composition according to claim 1; and
exposing and developing the resist film.

9. The resist composition according to claim 1, wherein component (B) contains a hydroxystyrene repeating unit.

10. The resist composition according to claim 1, wherein Z in formula (Z-I) represents a single bond, an alkylene group, an arylene group, an ether group, an amino group, —CH═CH—, —C≡C—, a carbonyl group, a sulfide group, a sulfone group, a sulfoxide group, —COO—, —CONH—, —SO$_2$NH—, —CF$_2$—, —CF$_2$CF$_2$—, —OCF$_2$O—, —CF$_2$O—, —CF$_2$—, —SS—, —CH$_2$SO$_2$CH$_2$—, —CH$_2$COCH$_2$—, —COCF$_2$CO—, —COCO—, —OCOO— or —OSO$_2$O—.

11. The resist composition according to claim 1, wherein the polymer (B) contains a repeating unit having an aromatic group.

12. The resist composition according to claim 11, wherein the repeating unit having an aromatic group is a hydroxystyrene repeating unit.

13. The resist composition according to claim 1, wherein the proton acceptor functional group has a partial structure selected from the group consisting of a crown ether structure, an aza-crown ether structure, a tertiary amine structure, a secondary amine structure, a primary amine structure, a pyridine structure, an imidazole structure, a pyrazine structure and an aniline structure.

* * * * *